United States Patent [19]

Kume et al.

[11] Patent Number: 5,536,485
[45] Date of Patent: Jul. 16, 1996

[54] DIAMOND SINTER, HIGH-PRESSURE PHASE BORON NITRIDE SINTER, AND PROCESSES FOR PRODUCING THOSE SINTERS

[75] Inventors: Shoichi Kume, Aichi; Haruo Yoshida, Ibaraki; Yukiyoshi Yamada, Saitama; Tadashi Fuyuki, Saitama; Satoshi Akiyama, Saitama; Yoshiaki Hamada, Saitma; Eisuke Kuroda, Saitama; Tadakatsu Nabeya, Kanagawa; Yukio Sumita, Miyagi; Kenichi Kimura, Miyagi, all of Japan

[73] Assignees: Agency of Industrial Science & Technology; Nisshin Flour Milling Co., Ltd., both of Tokyo; Reed Co., Ltd, Kanagawa-ken, all of Japan

[21] Appl. No.: 288,947

[22] Filed: Aug. 11, 1994

[30] Foreign Application Priority Data

| Aug. 12, 1993 | [JP] | Japan | 5-219270 |
| Aug. 12, 1993 | [JP] | Japan | 5-219271 |
| Aug. 12, 1993 | [JP] | Japan | 5-219272 |
| Aug. 12, 1993 | [JP] | Japan | 2-219273 |
| Aug. 12, 1993 | [JP] | Japan | 2-219274 |
| Aug. 12, 1993 | [JP] | Japan | 5-219275 |
| Aug. 12, 1993 | [JP] | Japan | 5-219276 |
| Aug. 12, 1993 | [JP] | Japan | 5-219277 |

[51] Int. Cl.$^6$ ............................ B01J 3/06; C04B 35/58
[52] U.S. Cl. .............................. 423/446; 501/96; 51/307; 419/11; 419/12; 419/13; 419/14; 419/26; 419/31; 419/35; 75/244
[58] Field of Search .............. 423/446; 427/249, 427/122; 501/96; 51/307; 419/11, 12, 13, 14, 26, 31, 35; 75/244

[56] References Cited

U.S. PATENT DOCUMENTS

| 4,505,746 | 3/1985 | Nakai et al. | 75/243 |
| 4,636,253 | 1/1987 | Nakai et al. | 75/239 |
| 4,647,546 | 3/1987 | Hall, Jr. | 501/96 |
| 4,673,414 | 6/1987 | Lavens et al. | 51/293 |
| 4,788,166 | 11/1988 | Araki et al. | 501/96 |
| 5,037,704 | 8/1991 | Nakai et al. | 428/550 |

FOREIGN PATENT DOCUMENTS

| 273573 | 7/1988 | European Pat. Off. . |
| 2-043377 | 2/1990 | Japan . |
| 3-75302 | 3/1991 | Japan . |
| 5-24922 | 2/1993 | Japan . |
| 5-24929 | 2/1993 | Japan . |
| 2214195 | 8/1989 | United Kingdom . |

*Primary Examiner*—Roy V. King
*Attorney, Agent, or Firm*—Weiser & Associates

[57] ABSTRACT

A powder of diamond or high-pressure phase boron nitride core particles charged into a coating space as it is dispersed, and a precursor of a coat forming substance allowed to contact and/or impinge against the particles in the powder of core particles so that their surfaces are covered with the coat forming substance, thereby preparing coated diamond or high-pressure phase boron nitride particles which are subsequently sintered. The thusly produced diamond of high-pressure phase boron nitride sinter is composed of coated core particles of high performance that are superhard, uniform, dense and sintered firmly, and which have a controlled microstructure.

8 Claims, 22 Drawing Sheets

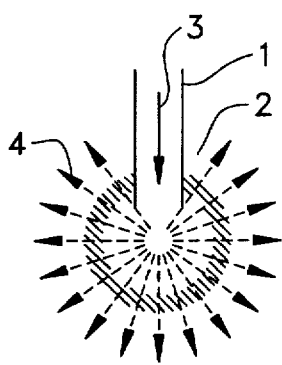
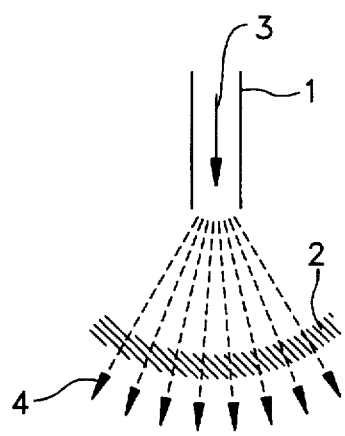
FIG. 4a
FIG. 4b
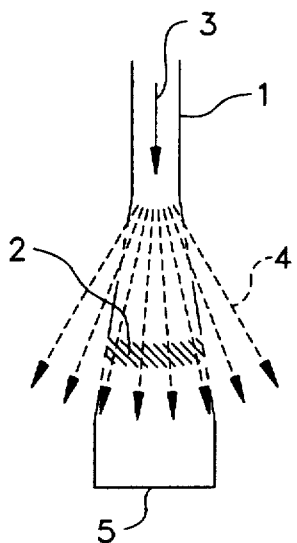
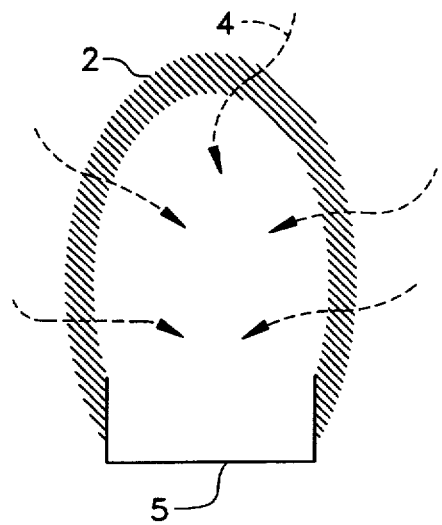
FIG. 4c
FIG. 4d
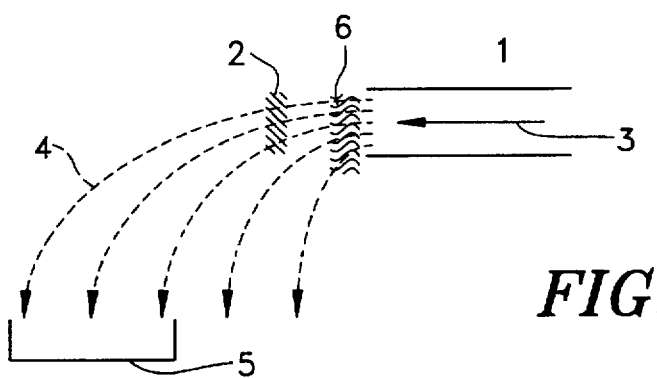
FIG. 4e 2 μm 2 μm

DIAMOND SINTER, HIGH-PRESSURE PHASE BORON NITRIDE SINTER, AND PROCESSES FOR PRODUCING THOSE SINTERS

BACKGROUND OF THE INVENTION

This invention relates to a diamond sinter produced by sintering a mixture containing at least coated diamond particles having a coat forming substance formed on the surfaces of diamond particles and a high-pressure phase boron nitride sinter produced by sintering a mixture containing at least coated high-pressure phase boron nitride particles having a coat forming substance formed on the surfaces of high-pressure phase boron nitride particles. The invention also relates to processes for producing those sinters.

Diamond, with strong covalent bonding, has many excellent properties. On the other hand, because of this covalent bonding, diamond has such a small self-diffusion coefficient that it is very difficult to sinter. Another problem with diamond is that it is thermodynamically stable only under ultrahigh pressures so that it will experience a phase transition to graphite if the pressure is insufficient under elevated temperatures. Therefore, without addition of bonding materials or sintering aids, strong sinters cannot be produced unless a ultrahigh pressure of about 8500 MPa is applied simultaneously with exposure to a very high temperature of about 2440K.

High-pressure phase boron nitrides consist of cubic boron nitride and/or wurtzite boron nitride. Cubic boron nitride (c-BN) has similar characteristics to diamond; on account of strong covalent bonding, it has many excellent properties but, on the other hand, because of this covalent bonding, c-BN has such a small self-diffusion coefficient that it is very difficult to sinter. Further, c-BN is thermodynamically stable only under ultrahigh pressures and it will experience a phase transition to hexagonal boron nitride (h-BN) of a graphitic phase (if the pressure is insufficient under elevated temperatures.) Wurtzite boron nitride (w-BN) has generally the same properties as the cubic boron nitride; it is a difficult-to-sinter substance and it is thermodynamically stable only at ultrahigh pressures and will experience a phase transition to hexagonal boron nitride (h-BN) of a graphitic phase if the pressure is insufficient under elevated temperatures. It should be noted that if the wurtzite boron nitride is sintered under ultrahigh pressures and at elevated temperatures where the cubic boron nitride is thermodynamically stable, a phase transition to the cubic boron nitride occurs depending on the conditions, yielding in this case a sinter containing the cubic boron nitride or a sinter that is solely comprised of the cubic boron nitride. In either case, without addition of bonding materials or sintering aids, strong sinters cannot be produced unless a ultrahigh pressure of about 7000 MPa is applied simultaneously with exposure to a very high temperature of about 2000K.

However, irrespective of whether diamond or high-pressure phase boron nitride is to be sintered, the sintering conditions set forth in the preceding paragraphs for the case where neither bonding materials nor sintering aids are added are extremely hostile and are not suitable for the purpose of producing diamond or high-pressure phase boron nitride sinters of high density on an industrial scale.

Therefore, in order to produce these high-density sinters, sintering must be done under industrially applicable conditions and to this end the addition of bonding materials and/or sintering aids is essential.

The first thing to be stated in this connection is that in recent years, a particular need exists for enhancing the performance of diamond or high-pressure phase boron nitride sinters of high density and to this end, it is required that diamond or high-pressure phase boron nitride particles such as those not larger than 10 μm be used as the starting material and sintered to produce a diamond or high-pressure phase boron nitride sinter of high density.

Conventionally, diamond or high-pressure phase boron nitride sinters have been produced mainly by a method in which bonding materials and/or sintering aids are added in a powder form. In this case, even if the bonding materials and/or sintering aids are of a fine particulate form, it is extremely difficult to insure ideal uniform addition or uniform dispersion in such a way that they cover all of the individual diamond or high-pressure phase boron nitride particles present. Even if such uniform dispersion is realized, the extent of "uniformity" that can be attained is limited since the bonding materials and/or sintering aids are added on a particle basis. It should particularly be noted that if the bonding materials or sintering aids are added in small quantities, the resulting sinter will inevitably contain those areas where the bonding materials or sintering aids are absent.

In many actual cases, those powder particles or the particles of the bonding material and/or sintering aid agglomerate to either form lumps in the sinter or occur unevenly in the sinter. Hence, particularly in those areas where diamond or high-pressure phase boron nitride particles agglomerate, the structure is essentially the same as what is produced without addition of bonding materials or sintering aids and unsintered portions will locally occur. In those areas where the bonding materials and/or sintering aids agglomerate, the microscopic structure contains portions where diamond or high-pressure phase boron nitride particles are absent from the sinter. Either phenomenon produces imperfections that cause marked deterioration in the performance of the produced diamond or high-pressure phase boron nitride sinter.

Therefore, in order to produce diamond or high-pressure phase boron nitride sinters of high performance that are free from the above-mentioned imperfections, it is necessary that the bonding material and/or sintering aid be positively distributed on individual diamond or high-pressure phase boron nitride particles and, to this end, it is strongly desired to produce diamond or high-pressure phase boron nitride sinters of high performance using coated diamond or high-pressure phase boron nitride particles which are prepared by coating uniformly a bonding material forming substance and/or a sintering aid forming substance on the individual particles of diamond or high-pressure phase boron nitride, respectively.

Secondly, as already mentioned, both diamond and high-pressure phase boron nitride are substances that are extremely difficult to sinter and which are stable only under ultrahigh pressures and, hence, in order to prevent the diamond or high-pressure phase boron nitride from experiencing a phase transition to the lower-pressure phase (graphite or h-BN) and to produce a dense sinter of the diamond or high-pressure phase boron nitride, manufacturers have adopted the practice of using bonding materials and/or sintering aids under ultrahigh pressures in excess of 2000 MPa and at elevated temperatures. According to the report of T. Noma et al. (J. Master. Scie., 19 (1984) 2319–2322), diamond is sintered at 6000 MPa (60 kb) and at 1300° C. or above. Cubic boron nitride may be sintered at 4000 MPa (40 kb) and at 1200° C. or above, as taught in Unexamined Published Japanese Patent Application (kokai) Sho 63-35456. These sintering conditions refer to extreme states and they are both rigorous indeed in that they cannot be created without using a ultrahigh pressure apparatus such as of the girdle or belt type.

This constraint of using a ultrahigh pressure apparatus such as of the girdle or belt type for creating ultrahigh pressures in excess of 2000 MPa has made it difficult to achieve mass production of diamond or high-pressure phase boron nitride sinters and not only has the production cost been high but it has also been impossible to manufacture large shapes.

However, speaking of diamonds, Hall conducted an experiment under ultrahigh pressures and reported that when a diamond was thermodynamically metastable if not stable, it took such a long time for a phase transition to occur that it remained stable for practical purposes; he then drew line ② as shown in FIG. 33a to indicate the upper limit beyond which the diamond would no longer exist in a practically stable manner (H. T. Hall, Science, 169 (1970) 868–869). Hence, according to his report, even under low-pressure and high-temperature conditions that are not stable with respect to thermodynamic equilibrium line ① in FIG. 33a, a diamond will exist practically stable if it is at temperatures that do not exceed line ② in FIG. 33a, say, up to about 1400 K (ca. 1100° C.), given a pressure of up to about 35 kb.

Speaking of high-pressure phase boron nitrides, Wakatsuki et al. conducted an experiment on a cubic boron nitride under ultrahigh pressures and reported that when the cubic boron nitride was thermodynamically metastable if not stable, it took such a long time for a phase transition to occur that it remained stable for practical purposes; they then drew line ② as shown in FIG. 33b to indicate the upper limit beyond which the cubic boron nitride would no longer exist in a practically stable manner (Wakatsuki, Ichise, Aoki and Maeda, Abstracts of the Lectures Read at the 14th Symposium on High-Pressure Technology (1972) p. 78). Hence, according to their report, even under low-pressure and high-temperature conditions that are not stable with respect to thermodynamic equilibrium line ① in FIG. 33b, a cubic boron nitride will exist practically stable if it is at temperatures that do not exceed line ② in FIG. 33b, say, not higher than 1200° C.

Based on these facts, one may conclude that if diamond sinters containing diamonds or high-pressure phase boron nitride sinters containing high-pressure phase boron nitrides at least one of which is a cubic boron nitride can be produced under the stable conditions mentioned above, he can effectively use a ultrahigh pressure apparatus such as a piston-cylinder (PC) type ultrahigh pressure apparatus that is capable of creating comparatively moderate ultrahigh pressures less than 2000 MPa, or a ultrahigh pressure HIP apparatus as a known technique capable of pressurization up to 1000 MPa, or hot isostatic press (HI) apparatus excluding the ultrahigh pressure HIP apparatus, or a hot press (HP) apparatus.

Thusly, unlike in the case of ultrahigh pressure apparatus of such types as the aforementioned girdle and belt types that create ultrahigh pressures in excess of 2000 MPa, not only does it become easy to achieve mass production but it also becomes possible to produce sinters of large shapes.

In recent years, it is strongly desired that diamond or high-pressure phase boron nitride sinters of high density and performance that contain comparatively large amounts of diamond or high-pressure phase boron nitride particles such as those not larger than 10 μm should be manufactured in high volumes or in large shapes using a ultrahigh pressure apparatus such as the aforementioned piston-cylinder (PC) type ultrahigh pressure apparatus which is capable of creating comparatively moderate ultrahigh pressures less than 2000 MPa, or the ultrahigh pressure HIP apparatus capable of pressurization up to 1000 MPa, the hot isostatic press (HIP) apparatus excluding the ultrahigh pressure HIP apparatus, or the hot press (HP) apparatus.

In fact, however, it is not easy to assure that diamond or high-pressure phase boron nitride sinters containing fairly large amounts of diamond or high-pressure phase boron nitride, respectively, are effectively densified under those limited pressures.

Stated more specifically, this can be realized only when the bonding material which is added in the form of a feed powder for that material deforms or migrate during sintering to fill the gaps between diamond or high-pressure phase boron nitride particles so that the applied pressure will work effectively for the displacement and loss of pores or the voids which are surrounded by the bonding material and the diamond or high-pressure phase boron nitride particles. To this end, the bonding material and/or the feed powder for that material which reacts with diamond or high-pressure phase boron nitride to generate the bonding material must be present in such a way that they contact and surround the diamond or high-pressure phase boron nitride particles.

It should particularly be noted that under the sintering pressure and temperature conditions where the pressure is less than 2000 MPa and where diamond or high-pressure phase boron nitride is thermodynamically metastable if not stable, there is little chance for the particles of diamond or high-pressure phase boron nitride to bind directly and, hence, those portions of the diamond or high-pressure phase boron nitride particles in the resulting sinter where the feed powder for the bonding material is absent will remain unsintered. As a result, the performance of the sinters produced will deteriorate considerably. If the bonding material is added only in the form of a feed powder for that material, it is extremely difficult to insure ideal uniform addition or uniform dispersion in such a way that the particles of the feed powder cover all of the individual diamond or high-pressure phase boron nitride particles present even if the particles of the .feed powder are fine. Even if such uniform dispersion is realized, the extent of "uniformity" that can be attained is limited since the feed powder for the bonding material is added on a particle basis. Thus, a serious problem is presented in the manufacture of diamond or high-pressure phase boron nitride sinters that contain large amounts of diamond or high-pressure phase boron nitride, respectively. Therefore, even in the case of mixing diamond or high-pressure phase boron nitride particles with the feed powder for the bonding material, one may compensate for the insufficiency by using coated diamond or high-pressure phase boron nitride particles which are prepared by coating the surfaces of bare diamond or high-pressure phase boron nitride particles with a bonding material forming substance that is of the same and/or different type from the feed powder for the bonding material; as a consequence, the distribution of the bonding material can be made sufficiently uniform. Hence, the coating method for preparing such coated diamond or high-pressure phase boron nitride particles bears technologically great importance.

Stated more specifically, irrespective of whether the bonding material is added in the form of a feed powder for bonding material forming substance or not, the bonding material and/or a substance that reacts with diamond or high-pressure phase boron nitride to form the bonding material is allowed to be present covering the surfaces of diamond or high-pressure phase boron nitride particles. Only by following this approach, one can assure that diamond or high-pressure phase boron nitride sinters of high density and performance that contain comparatively large amounts of diamond or high-pressure phase boron nitride particles are manufactured in high volumes or large shapes using a ultrahigh pressure apparatus such as the piston-cylinder (PC) type ultrahigh pressure apparatus which is capable of creating comparatively moderate ultrahigh pressures less than 2000 MPa, or the ultrahigh pressure HIP apparatus which is capable of pressurization up to 1000 MPa, or the hot isostatic press (HIP) apparatus excluding the ultrahigh pressure HIP apparatus, or the hot press (HP) apparatus.

While the foregoing description is directed to diamond or high-pressure phase boron nitride sinters that use the respective particles with a particle diameter not greater than 10 µm, it should be noted that if the sinters are to be used in definite applications, it is very effective to intentionally use diamond or high-pressure phase boron nitride particles of comparatively large particle diameters, say, in excess of 10 µm.

Consider, for example, a wear-resistant sinter that takes advantage of the ultrahigh hardness of diamond or high-pressure phase boron nitride. This sinter can be produced by sintering a dispersion of a comparatively large quantity of diamond or high-pressure phase boron nitride particles in excess of 10 µm in diameter and, in this case, using diamond or high-pressure phase boron nitride particles larger than 10 µm in diameter as a starting material is extremely important.

The diamond or high-pressure phase boron nitride sinter which has dispersed therein diamond or high-pressure phase boron nitride particles exceeding 10 µm in diameter is characterized in that the effect of dispersion of the dispersed particles is marked because those dispersed particles are sintered as they are closely bound to the surrounding microstructure without imperfections or pores. However, as already mentioned, both diamond and high-pressure phase boron nitride are extremely difficult to sinter and, therefore, it is essential to use a sintering aid or a bonding material that accelerate the sintering of the diamond or high-pressure phase boron nitride particles larger than 10 µm in diameter together with the surrounding microstructure.

Conventionally, such sintering aids and bonding materials have been added solely by the powder mixing method. However, the incorporation of impurities during mixing is unavoidable in this method; what is more, there is theoretically a limit on the extent to which a uniform structure can be realized. Even if the particles of a sintering aid or a bonding material are extremely fine, it is very difficult to insure ideal uniform mixing or uniform dispersion in such a way that the particles of a sintering aid or bonding material powder cover all of the diamond or high-pressure phase boron nitride particles present. Even if such uniform dispersion is realized, the extent of "uniformity" that can be attained is limited since the particles of the sintering aid or bonding material powder are mixed on a particle basis. Particularly in the case where those particles are used in relatively small amounts, an uneven distribution will occur inevitably.

In many actual cases, the dispersed diamond or high-pressure phase boron nitride particles lump together or the particles of the sintering aid or bonding material powder agglomerate, as a result, the diamond or high-pressure phase boron nitride particles will form lumps in the sinter or they occur unevenly in the diamond or high-pressure phase boron nitride sinter, eventually leading to marked deterioration in the performance of the sinters.

Therefore, it is necessary that the sintering aid or the bonding material be distributed positively to all individual diamond or high-pressure phase boron nitride particles exceeding 10 µm in diameter. Further, in order to assure that the diamond or high-pressure phase boron nitride particles are sintered as they are closely bound to the surrounding microstructure, it is required to provide a highly controlled uniform coating on the surfaces of the diamond or high-pressure phase boron nitride particles; the coating is uniform in that it leaves no surfaces of the individual diamond or high-pressure phase boron nitride particles left uncovered and it is highly controlled in that this uniform coating is applied to all individual diamond or high-pressure phase boron nitride particles. What is more, the greater the size of these particles, the more uniform this highly controlled coating should be in order to further reduce the uncovered portions of the particles.

Thus, the production of coated diamond or high-pressure phase boron nitride particles of desired diameters in which diamond or high-pressure phase boron nitride particles are covered with uniform coatings that are highly controlled in accordance with the particle diameter, as well as the manufacture of high-performance sinters using those coated particles are strongly desired.

While coat forming substances could be applied by various techniques such as vapor-phase processes and wet plating methods, the vapor-phase approach in which inorganic materials, metallic materials and other coat forming substances are applied to provide coatings as films and various other forms theoretically have major features that are unattainable by other coating techniques, such as: (1) easy control of the atmosphere; (2) the selection of coat forming substances is basically unlimited and various kinds of substances including elemental metallic substances (e.g. active metals), alloys, nitrides, carbides, borides and oxides can be applied; (3) the desired substance can be applied in high purity; and (4) the coating weight of the coat forming substance can be controlled freely.

However, for the reasons to be set forth below, none of the various coating apparatus and methods heretofore proposed as known techniques have been capable of forming the above-described highly controlled uniform coatings.

Particularly in the case of diamond or high-pressure phase boron nitride particles not larger than 10 µm, the diamond or high-pressure phase boron nitride particles to be coated are so fine that they are cohesive enough to have a great tendency to agglomerate together, whereby almost all single particles form agglomerates. Since these agglomerates cannot be disintegrated unless they are subjected to a special action greater than their cohesive force, they cannot be simply coated as such to insure that the surfaces of the individual particles are covered with the coating of a bonding material and/or sintering aid, eventually yielding coated agglomerates in which the surfaces of the agglomerates are covered with the coating of the bonding material and/or sintering aid. This has caused a problem with the individual diamond or high-pressure phase boron nitride particles forming the agglomerates in that the surfaces of the particles located on the surfaces of the agglomerates have large coating weights but suffer from uneven coating whereas the particles located within the agglomerates are not covered at all.

With a view to solving these problems, attempts have already been made to coat the particles in a dispersed state in order to assure the coating of the individual particles in the powder of the core particles to be coated. However, for the reasons stated below, none of the various coating apparatus and methods heretofore proposed as known techniques have been capable of forming the intended uniform coating.

For instance, Unexamined Published Japanese Patent Application (kokai) Sho 58-31076 teaches an apparatus and method, according to which a vessel placed in PVD equipment is charged with the particles in a powder of core particles and vibrated by an electromagnetic means so that the core particles in the vessel are rolled as they are coated by a PVD process. Unexamined Published Japanese Patent Application (kokai) Sho 61-30663 teaches an apparatus, according to which a vessel placed in PVD equipment is charged with the particles in a powder of core particles and vibrated by a mechanical means so that the core particles in the vessel are rolled as they are coated by a PVD process. However, in the actual practice with those apparatus or methods in which the vessel is vibrated so that the particles in the powder of core particles are rolled as they are provided with coatings, the necessary action for disintegrating the agglomerates of diamond or high-pressure phase boron nitride particles with an average diameter not greater than 10 μm by applying a force exceeding their cohesive force cannot be produced and, hence, the agglomerates cannot be disintegrated; to the contrary, a granulating action develops to form agglomerates that are greater in number or size than before the powder of core particles is supplied into the vessel. On the other hand, diamond or high-pressure phase boron nitride particles having an average diameter in excess of 10 μm are simply subjected to a sliding action as they form many layers in superposition and it has been impossible to achieve the desired coating of single separate particles.

Unexamined Published Japanese Patent Application (kokai) Hei 3-153864 teaches an apparatus and method, according to which a rotating vessel having barriers and/or ridges and grooves in the inner surface is charged with core particles and rotated as the surfaces of the particles are coated by an evaporation method. The problem with this apparatus and method is that the necessary action for disintegrating the agglomerates of diamond or high-pressure phase boron nitride particles with an average diameter not greater than 10 μm by applying a force exceeding their cohesive force cannot be produced and, hence, the agglomerates cannot be disintegrated and, what is more, an increased number or size of agglomerates will simply form. On the other hand, diamond or high-pressure phase boron nitride particles having an average diameter in excess of 10 μm are simply subjected to a gentle stirring action as many of them contact one another forming many layers in superposition and it has been impossible to achieve the desired coating of single separate particles.

Unexamined Published Japanese Patent Application (kokai) Sho 58-141375 teaches an apparatus in which the particles of a powder in a reactive gas atmosphere are suspended by the flow of the reactive gas under gravity and in which the surfaces of the particles are coated with the precipitating substance that forms by the chemical reaction involving the reactive gas. Unexamined Published Japanese Patent Application (kokai) Hei 2-43377 teaches a method in which particles placed under vacuum are fluidized as they are subjected to coating by a thermochemical reaction treatment. Unexamined Published Japanese Patent Application (kokai) Sho 64-80437 teaches a method in which the agglomerates of core particles in powder are disintegrated by a sound wave that is a composite of low and high frequency waves, so that the agglomerates are fluidized to improve the coating efficiency. However, these techniques which utilize the fluidized bed of the particles in a powder of core particles which is formed by a gas flow or vibrations have had the problem that with diamond or high-pressure phase boron nitride particles having an average diameter of no more than 10 μm, it is practically impossible to fluidize the separate individual particles, thus failing to disintegrate the agglomerates of these particles. On the other hand, with diamond or high-pressure phase boron nitride particles exceeding 10 μm in average diameter, it is practically impossible to insure that all of these particles are similarly and independently fluidized and suspended as single separate entities and one has been incapable of eliminating uneven coating of the particles which is due to the hiding of one particle by another.

Unexamined Published Japanese Patent Application (kokai) Sho 54-153789 teaches an apparatus in which a powder material is dropped within a vacuum vessel, where the metal vapor is generated to form a metal coating on the particles. Unexamined Published Japanese Patent Application (kokai) Sho 60-47004 teaches a method in which a monomer gas and the particles of a powder are introduced into a high-frequency plasma region in a vacuum vessel, where a coating film of an organic substance is formed by plasma-assisted polymerization. If diamond or high-pressure phase boron nitride particles with an average diameter of no more than 10 μm are simply introduced as in the techniques described above, agglomerates cannot be disintegrated. On the other hand, diamond or high-pressure phase boron nitride particles exceeding 10 μm in average diameter will simply drop while forming agglomerates which are not single separate particles and various problems occur, such as uneven coating due to the hiding of one particle by another, the total failure of the particles within an agglomerate to be coated, and differences in the coating weights of individual particles.

Unexamined Published Japanese Patent Application (kokai) Sho 64-80437 teaches a method in which the agglomerates of core particles in powder are disintegrated by a sound wave consisting of low and high frequency waves so that they are fluidized to improve the coating efficiency. However, this method which imparts vibrations to the fluidized bed has had the problem that with diamond or high-pressure phase boron nitride particles having an average diameter of no more than 10 μm, it is practically impossible to fluidize the separate individual particles, thus failing to disintegrate the agglomerates of these particles. On the other hand, with diamond or high-pressure phase boron nitride particles exceeding 10 μm in average diameter, it is practically impossible to insure that all of these particles are similarly and independently fluidized and suspended as single separate entities and one has been incapable of eliminating uneven coating of the particles which is due to the hiding of one particle by another.

Unexamined Published Japanese Patent Application (kokai) Sho 62-250172 teaches an apparatus and method, according to which a powder that has been preliminarily treated by jet milling is allowed to stay within a chamber for heat treatment under vacuum, where it is subjected to a heat treatment and thence dropped under gravity through a powder feeder into a cylinderal sputtering chamber equipped with a vertical target, whereby the particles in powder are provided with a coating. Unexamined Published Japanese Patent Application (kokai) Hei 2-153068 teaches an apparatus and method, according to which a powder that has been preliminarily treated by jet milling is allowed to stay within a chamber for heat treatment under vacuum, where it is subjected to a heat treatment and thence introduced through a powder feeder into a rotary vessel accommodating a sputter source within a sputtering chamber in the form of a powder (not as single particles), with sputtering being effected as the vessel is rotated. These techniques involve a heating step which is performed before coating so that the jet-milled powder of core particles is allowed to stay for heat treatment and because of this staying of the powder in the heating step, the diamond or high-pressure phase boron nitride particles of any diameter will form agglomerates again which are not single particles and, eventually, such agglomerates will not revert to single particles in the coating step.

Thus, none of the so far proposed techniques have successfully solved the problems associated with the apparatus or method for providing coatings on the core particles in powder which are diamond or high-pressure phase boron nitride particles. In actual cases, diamond or high-pressure phase boron nitride particles having an average diameter of not more than 10 μm form agglomerates which cannot be disintegrated and, hence, no methods or apparatus have been available for producing coated diamond or high-pressure phase boron nitride particles in which said diamond or high-pressure phase boron nitride particles, being dispersed as single particles, are covered on their surfaces with coat forming substances including a bonding material forming substance and/or a sintering aid forming substance.

Speaking of diamond or high-pressure phase boron nitride particles exceeding 10 μm in average diameter, these particles are in actual cases subjected to a coating treatment in the form of agglomerates in which they remain in mutual contact and, hence, those portions which are blocked by other particles remain uncoated. As already mentioned, highly controlled uniform coatings are needed and although even the small cohesive force discussed above has been so much influential as to cause a very serious problem, no methods have been available for producing the satisfactory coated diamond or high-pressure phase boron nitride particles, nor have been apparatus for implementing such methods.

In short, irrespective of the diameter of starting diamond or high-pressure phase boron nitride particles, it has been impossible to prepare coated diamond or high-pressure phase boron nitride particles by providing each of those starting particles with a controlled uniform coat by vapor-phase coating techniques using coat forming substances including bonding material forming substances and/or sintering aid forming substances.

Hence, it has been impossible to manufacture diamond or high-pressure phase boron nitride sinters of high performance that are uniform, dense and firmly sintered and which have a highly controlled microstructure using small (e.g., ≦10 μm) coated diamond or high-pressure phase boron nitride particles. In addition, diamond or high-pressure phase boron nitride sinters of high density and performance that contain comparatively large amounts of diamond or high-pressure phase boron nitride based on those coated particles could not be manufactured in high volumes or large shapes. Further, diamond or high-pressure phase boron nitride sinters of high density and performance that contain comparatively large amounts of diamond or high-pressure phase boron nitride as derived from a mixture of those coated particles and a separately added bonding material could not be manufactured in high volumes or large shapes.

It has also been impossible to manufacture wear-resistant sinters that have dispersed therein comparatively large amounts of coated diamond or high-pressure phase boron nitride particles exceeding, for example, 10 μm in diameter.

BRIEF SUMMARY OF THE INVENTION

Under the circumstances described on the foregoing pages, it is strongly desired to develop and commercialize the following sinters and processes for producing them: a diamond or a high-pressure phase boron nitride sinter of high performance derived from coated diamond or high-pressure phase boron nitride particles in which the particles in a powder of core particles that are diamond or high-pressure phase boron nitride particles to be coated in practice having an average diameter of no more than 10 μm are coated on a single particle basis with a coat forming substance selected from the group consisting of a bonding material forming substance and a sintering aid forming substance, as well as processes for producing such diamond and high-pressure phase boron nitride sinters; a diamond or a high-pressure phase boron nitride sinter of high performance that contains a comparatively large amount of diamond or high-pressure phase boron nitride particles as produced by sintering the coated diamond or high-pressure phase boron nitride particles under pressure and temperature conditions where diamond or high-pressure phase boron nitride is thermodynamically metastable if not stable, as well as processes for producing such diamond and high-pressure phase boron nitride sinters; a diamond or a high-pressure phase boron nitride sinter of high performance that is produced by sintering a mixture of the coated diamond or high-pressure phase boron nitride particles and a separately added bonding material under pressure and temperature conditions where diamond or high-pressure phase boron nitride is thermodynamically metastable if not stable, as well as processes for producing such diamond and high-pressure phase boron nitride sinters; the production of coated diamond or high-pressure phase boron nitride particles in which bare diamond or high-pressure phase boron nitride particles in a powder of core particles exceeding 10 μm in average diameter are provided with a highly controlled uniform coating, which is uniform in that it leaves no surfaces of the individual diamond or high-pressure phase boron nitride particles left uncovered and which is highly controlled in that this uniform coating is applied to all individual diamond or high-pressure phase boron nitride particles, said highly controlled uniform coating being further characterized in that the greater the size of those particles, the more uniform it should be in order to further reduce the uncovered portions of the particles, as well as a diamond or a high-pressure phase boron nitride sinter that uses the thus coated diamond or high-pressure phase boron nitride particles, and processes for producing such diamond and high-pressure phase boron nitride sinters.

Thus, an object of the present invention is to provide a diamond or a high-pressure phase boron nitride sinter of high performance that are uniform, dense and firmly sintered and which have a highly controlled microstructure using coated diamond or high-pressure phase boron nitride particles in which diamond or high-pressure phase boron nitride particles that are either the particles in a powder of fine core particles or the particles in a powder of core particles the greater part of which is comprised of fine particles are coated on a single particle basis with a bonding material forming substance and/or a sintering aid forming substance.

Another object of the invention is to provide processes for producing said diameter or high-pressure phase boron nitride sinters of high performance.

A further object of the invention is to provide a diamond or a high-pressure phase boron nitride sinter that contain comparatively a large amount of diamond or high-pressure phase boron nitride particles comprised of high-performance fine particles, which are uniform, dense and firmly sintered and which have a highly controlled microstructure, which sinters are produced by sintering at pressures less than 2000 MPa and at temperatures not exceeding 1850° C. those coated diamond or high-pressure phase boron nitride particles in which diamond or high-pressure phase boron nitride particles that are either the particles in a powder of fine core particles or the particles in a powder of core particles the greater part of which is comprised of fine particles are coated on a single particle basis with a coat forming substance selected from between a bonding material forming substance and a sintering aid forming substance, or a mixture containing said coated diamond or high-pressure phase boron nitride particles.

A still further object of the invention is to provide processes for producing said diamond or high-pressure phase boron nitride sinters.

Yet another object of the invention is to provide a diamond or a high-pressure phase boron nitride sinter that contains comparatively a large amount of diamond or high-pressure phase boron nitride particles comprised of high-performance fine particles, which are uniform, dense and firmly sintered and which have a highly controlled microstructure, which sinters are produced by sintering, at pressures less than 2000 MPa and at temperatures not exceeding 1850° C. under such pressure and temperature conditions that diamond or high-pressure phase boron nitride is thermodynamically metastable, a mixture of a bonding material and those coated diamond or high-pressure phase boron nitride particles in which diamond or high-pressure phase boron nitride particles that are either the particles in a powder of fine core particles or the particles in a powder of core particles the greater part of which is comprised of fine particles are coated on a single particle basis with coat forming substances comprising not only a bonding material forming substance and/or a sintering aid forming substance but also a surface modifier forming substance capable of controlling grain boundaries.

Still another object of the invention is to provide processes for producing such diamond and high-pressure phase boron nitride sinters.

A further object of the invention is to provide coated quasi-fine diamond or high-pressure phase boron nitride particles in which the particles in a powder of quasi-fine core particles that are quasi-fine diamond or high-pressure phase boron nitride particles or the particles in a powder of core particles the greater part of which is comprised of such quasi-fine particles are provided with a highly controlled uniform coating of a coat forming substance selected from between a bonding material forming substance and a sintering aid forming substance, which coating is uniform in that it leaves no surfaces of the individual diamond or high-pressure phase boron nitride particles left uncovered and which is highly controlled in that this uniform coating is applied to all individual diamond or high-pressure phase boron nitride particles, said highly controlled uniform coating being further characterized in that the greater the size of those particles, the more uniform it should be in order to further reduce the uncovered portions of the particles.

A still further object of the invention is to provide a diamond or a high-pressure phase boron nitride sintar using said coated quasi-fine diamond or high-pressure phase boron nitride particles.

A yet further object of the invention is to provide processes for producing said diamond and high-pressure phase boron nitride sinters.

In order to attain these objects, the present inventors conducted intensive studies and found the following: in order to insure that the particles in a powder of core particles which comprise diamond or high-pressure phase boron nitride particles are coated, on a single particle basis, with coat forming substances including a bonding material and/or a sintering aid, a mixture of a gas with a powder of highly dispersed core particles in which the particles in said powder of core particles are present in a gaseous atmosphere mainly in a single-particle state must be introduced into the coating start region of a coating space while the particles are in a highly dispersed state such that the dispersity $\beta$ is at least 70%, 80%, 90%, 95%, 97% or 99% depending upon the diameter of the introduced particles and then a coating operation must be started on those particles.

Stated more specifically, the present invention has been accomplished on the basis of the finding of the following two facts: (I) In a mixture of a gas with a powder of highly dispersed core particles in which the particles in said powder of core particles are present in a gaseous atmosphere mainly in a single-particle state, those dispersed particles have a tendency to reagglomerate with the passage of time, chiefly due to turbulent agglomeration, even if they are not allowed to stay within a certain area and once they have formed reagglomerates, it is difficult to disintegrate the latter to a highly dispersed state, namely, to redisperse the agglomerated particles to separate single particles unless they are dispersed by a dispersing means having especially high dispersing performance (the situation is the same as with the agglomerates that formed before the treatment conducted to prepare the highly dispersed core particles) and, to this end, those particles have to be introduced into the coating start region of a coating space while the particles are in a highly dispersed state such that the dispersity $\beta$ is at least 70%, 80%, 90%, 95%, 97%, or 99% depending on the diameter of the introduced particles; and to this end, (II) it is necessary to employ one or more dispersing means that have especially high dispersing performance such that the agglomerates composed of the powder of those core particles can be disintegrated and dispersed in a gaseous atmosphere to provide a very high dispersity in accordance with the specific diameter of the particles under treatment.

The present inventors also found that the coated diamond or high-pressure phase boron nitride particles described above behaved during sintering as if they were the particles of the aforementioned coat forming substances. Consequently, they found that such coated diamond or high-pressure phase boron nitride particles could be sintered in the presence of an added fibrous substance comprising at least one metal or compound that was capable of reinforcing diamond or high-pressure phase boron nitride sinters, which had a width of no more than 500 µm and which was of such a shape that the length to width ratio was at least two. The present invention has been accomplished on the basis of these findings.

According to the present invention, there is provided a process for producing a diamond or high-pressure phase boron nitride sinter comprising the step of preparing coated diamond or high-pressure phase boron nitride particles and sintering said coated diamond or high-pressure phase boron nitride particles or mixtures containing such particles or mixtures of coated diamond or high-pressure phase boron nitride particles with bonding material, sintering said coated diamond or high-pressure phase boron nitride particles or said mixtures containing such particles at pressures no less than 2000 MPa and at elevated temperatures; or sintering said coated diamond or high-pressure phase boron nitride particles or said mixtures containing such particles at pressures of less than 2000 MPa and at temperatures not exceeding 1850° C. under such sintering pressure and temperature conditions that diamond or high-pressure phase boron nitride is thermodynamically metastable if not stable; or sintering said mixtures of coated diamond or high-pressure phase boron nitride particles with a bonding material in a volume ratio of (1–90):(99–10), said bonding material being sintrable to a density of at least 85% at pressures less than 2000 MPa and at temperatures not exceeding 1850° C. under such conditions that diamond and/or high-pressure phase boron nitride particles are thermodynamically metastable, at pressures less than 2000 MPa and at temperatures not exceeding 1850° C. under such sintering pressure and temperature conditions that diamond and/or high-pressure phase boron nitride is thermodynamically metastable if not stable.

wherein said coated diamond or high-pressure phase boron nitride particles are prepared by a method comprising the steps of charging a powder of diamond or high-pressure phase boron nitride core particles into a coating space and then permitting a precursor of a coat forming substance which is generated via the vapor phase and/or a precursor of a coat forming substance in a vapor-phase state to contact and/or impinge against the particles in said powder of core particles so that their surfaces are coated with the coat forming substance and said coated diamond or high-pressure phase boron nitride particles are prepared by coating means comprising:

(A) a dispersing step in which the particles in the powder of core particles are dispersed by a group of means for high dispersion treatment of particles in a gaseous atmosphere to form a mixture of a gas and the particles in a powder of highly dispersed particles, the final treating means in said group of means for high dispersion treatment of particles being selected from between:

(a) dispersing means for dispersing the particles in the powder of core particles in a gaseous atmosphere; and (b) means for selecting a mixture of a gas and the particles in a powder of highly dispersed particles which comprises:

(b-1) means for selecting a mixture of a gas and the particles in a powder of highly dispersed particles that separates a portion of the powder that is composed of less highly dispersed particles from the mixture of a gas and the particles in the powder of core particles in which the particles in the powder of core particles are dispersed in a gaseous atmosphere, thereby selecting a mixture of a gas and the particles in a powder of highly dispersed core particles in which the particles in the powder of core particles are present in the gaseous atmosphere mainly in a single-particle state; and (b-2) feedback means by which the portion of the powder that is composed of less highly dispersed particles and which has been separated by said means for selecting a mixture of a gas and the particles in a powder of highly dispersed particles is transported to the final dispersing means among the dispersing means in the group of means for high dispersion treatment of particles and/or treating means upstream of the final dispersing means; and (B) a coating step in which the particles in the powder of core particles that have been dispersed in the dispersing step (A) start to be coated by being allowed to contact and/or impinge against the precursor of the coat forming substance in the coating start region of the coating space as they are dispersed to satisfy the following conditions:

the dispersity β should be at least 70% if those particles have an average diameter of no more than 10 μm in the frequency distribution by volume;

the dispersity β should be at least 80% if those particles have an average diameter in excess of 10 μm but no more than 20 μm in the frequency distribution by volume;

the dispersity β should be at least 90% if those particles have an average diameter in excess of 20 μm but no more than 50 μm in the frequency distribution by volume;

the dispersity β should be at least 95% if those particles have an average diameter in excess of 50 μm but no more than 300 μm in the frequency distribution by volume;

the dispersity β should be at least 97% if those particles have an average diameter in excess of 300 μm but no more than 800 μm in the frequency distribution by volume; and the dispersity β should be at least 99% if those particles have an average diameter in excess of 800 μm in the frequency distribution by volume, and wherein said sintering step is performed by sintering said coated diamond or high-pressure phase boron nitride particles or said mixtures containing such particles at pressures no less than 2000 MPa and at elevated temperatures; or sintering said coated diamond or high-pressure phase boron nitride particles or said mixtures containing such particles at pressures of less than 2000 MPa and at temperatures not exceeding 1850° C. under such sintering pressure and temperature conditions that diamond or high-pressure phase boron nitride is thermodynamically metastable if not stable; or sintering said mixtures of coated diamond or high-pressure phase boron nitride particles with a bonding material in a volume ratio of (1–90):(99–10), said bonding material being sintrable to a density of at least 85% at pressures less than 2000 MPa and at temperatures not exceeding 1850° C. under such conditions that diamond and/or high-pressure phase boron nitride particles are thermodynamically metastable, at pressures less than 2000 MPa and at temperatures not exceeding 1850° C. under such sintering pressure and temperature conditions that diamond and/or high-pressure phase boron nitride is thermodynamically metastable if not stable.

Preferably, said coated diamond or high-pressure phase boron nitride particles are prepared through the following additional step (s):

a step of disagglomeration or otherwise size reduction in which lumps of the coated diamond and/or high-pressure phase boron nitride particles that form as a result of association of several particles that contact one another via the coat forming substance on the coated particles are disagglomerated and/or otherwise reduced in size; and/or a step of selective separation in which the associating lumps of the coated diamond or high-pressure phase boron nitride particles are selectively separated from the coated diamond or high-pressure phase boron nitride particles on a primary particle basis.

Preferably, the particles in the powder of diamond and/or high-pressure phase boron nitride core particles to be coated with the coat forming substance are coated by a dip method using a molten salt bath with one or more layers of the coat forming substance that derives from the dip method.

Preferably, the dispersing step is performed by:

a group of means for high dispersion treatment of particles that has such dispersing performance that a powder of core particles having an average diameter of no more than 10 μm in the frequency distribution by volume is dispersed in a gaseous atmosphere by the final treatment by said group of means for high dispersion treatment of particles, thereby forming a mixture of a gas and the particles in the powder of highly dispersed core particles and that the dispersity β of the particles in said powder of core particles is adjusted to at least 70%;

a group of means for high dispersion treatment of particles that has such dispersing performance that a powder of core particles having an average diameter in excess of 10 μm but no more than 20 μm in the frequency distribution by volume is dispersed in a gaseous atmosphere by the final treatment by said group of means for high dispersion treatment of particles, thereby forming a mixture of a gas and the particles in the powder of highly dispersed core particles and that the dispersity β of the particles in said powder of core particles is adjusted to at least 80%;

a group of means for high dispersion treatment of particles that has such dispersing performance that a powder of core particles having an average diameter in excess of 20 μm but no more than 50 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 90%;

a group of means for high dispersion treatment of particles that has such dispersing performance that a powder of core particles having an average diameter in excess of 50 μm but no more than 300 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 95%;

a group of means for high dispersion treatment of particles that has such dispersing performance that a powder of core particles having an average diameter in excess of 300 μm but no more than 800 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 97%; and a group of means for high dispersion treatment of particles that has such dispersing performance that a powder of core particles having an average diameter in excess of 800 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 99%; and said coated diamond or high-pressure phase boron nitride particles being prepared by:

a method in which the mixture of a gas and the particles in the powder of highly dispersed core particles as formed by one of the means in said group of means for high dispersion treatment of particles is either discharged directly to the coating step or transported thereto via at least one member indispensable to transport that is selected from the group consisting of a hollow member, an intermediate member composed of a member that forms a hollow portion, and a pipe and which is provided between the dispersing and coating steps, as the mixture emerges from a discharge section that discharges said mixture of a gas and the particles; and/or a method in which the mixture of a gas and the particles in the powder of highly dispersed core particles as formed by one of the means in said group of means for high dispersion treatment of particles is transported to the coating step via at least one means selected from the group consisting of means for maintaining the dispersion in a gaseous atmosphere of the highly dispersed core particles in the mixture of a gas with the core particles which have been dispersed in the gaseous atmosphere to attain one of the dispersities set forth above, means for enhancing the dispersion in a gaseous atmosphere of the highly dispersed core particles in the mixture of a gas with the core particles which have been dispersed in the gaseous atmosphere to attain one of the dispersities set forth above, and means for separating a mixture of a gas and the particles in a powder of less highly dispersed core particles from said gas-particle mixture so as to select a mixture of a gas and the particles in a powder of highly dispersed core particles in which the core particles are present in the gaseous atmosphere mainly in a single-particle state.

Preferably, the dispersing step is performed by:

a group of means for high dispersion treatment of particles that has such dispersing performance that a powder of core particles having an average diameter of no more than 10 μm in the frequency distribution by volume is dispersed in a gaseous atmosphere by the final treatment by said group of means for high dispersion treatment of particles, thereby forming a mixture of a gas and the particles in the powder of highly dispersed core particles and that the dispersity β of the particles in said powder of core particles is adjusted to at least 70%;

a group of means for high dispersion treatment of particles that has such dispersing performance that a powder of core particles having an average diameter in excess of 10 μm but no more than 20 μm in the frequency distribution by volume is dispersed in a gaseous atmosphere by the final treatment by said group of means for high dispersion treatment of particles, thereby forming a mixture of a gas and the particles in the powder of highly dispersed core particles and that the dispersity β of the particles in said powder of core particles is adjusted to at least 80%;

a group of means for high dispersion treatment of particles that has such dispersing performance that a powder of core particles having an average diameter in excess of 20 μm but no more than 50 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 90%;

a group of means for high dispersion treatment of particles that has such dispersing performance that a powder of core particles having an average diameter in excess of 50 μm but no more than 300 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 95%;

a group of means for high dispersion treatment of particles that has such dispersing performance that a powder of core particles having an average diameter in excess of 300 μm but no more than 800 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 97%; and a group of means for high dispersion treatment of particles that has such dispersing performance that a powder of core particles having an average diameter in excess of 800 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 99%; and said coated diamond or high-pressure phase boron nitride particles being prepared by performing at least one part of the dispersing step in such a way that it shares one or more parts of the space with at least one part of the coating step.

Preferably, said coated diamond or high-pressure phase boron nitride particles are prepared with the coating start region of the coating space being located in either one of the following space regions that includes planes through which all particles in the powder of highly dispersed core particles as mixed with a gas will pass:

a space region in which a powder of core particles that have an average diameter of no more than 10 μm in the frequency distribution by volume is dispersed in a gaseous atmosphere by the final treatment by said group of means for high dispersion treatment of particles, thereby forming a mixture of a gas and the particles in the powder of highly dispersed core particles and that the dispersity β of the particles in said powder of core particles is adjusted to at least 70%;

a space region in which a powder of core particles that have an average diameter in excess of 10 μm but no more than 20 μm in the frequency distribution by volume is dispersed in a gaseous atmosphere by the final treatment by said group of means for high dispersion treatment of particles, thereby forming a mixture of a gas and the particles in the powder of highly dispersed core particles and that the dispersity β of the particles in said powder of core particles is adjusted to at least 80%;

a space region in which a powder of core particles that have an average diameter in excess of 20 μm but no more than 50 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 90%;

a space region in which a powder of core particles that have an average diameter in excess of 50 μm but no more than 300 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 95%;

a space region in which a powder of core particles that have an average diameter in excess of 300 μm but no more than 800 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 97%; and a space region in which a powder of core particles that have an average diameter in excess of 800 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 99%, or wherein said coated diamond or high-pressure phase boron nitride particles are prepared with the coating start region of the coating space being located in either one of the following space regions that includes planes through which all particles to be recovered into the recovery section of the recovery means will pass:

a space region in which a powder of core particles that have an average diameter of no more than 10 μm in the frequency distribution by volume is dispersed in a gaseous atmosphere by the final treatment by said group of means for high dispersion treatment of particles, thereby forming a mixture of a gas and the particles in the powder of highly dispersed core particles and that the dispersity β of the particles in said powder of core particles is adjusted to at least 70%;

a space region in which a powder of core particles that have an average diameter in excess of 10 μm but no more than 20 μm in the frequency distribution by volume is dispersed in a gaseous atmosphere by the final treatment by said group of means for high dispersion treatment of particles, thereby forming a mixture of a gas and the particles in the powder of highly dispersed core particles and that the dispersity β of the particles in said powder of core particles is adjusted to at least 80%;

a space region in which a powder of core particles that have an average diameter in excess of 20 μm but no more than 50 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 90%;

a space region in which a powder of core particles that have an average diameter in excess of 50 μm but no more than 300 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 95%;

a space region in which a powder of core particles that have an average diameter in excess of 300 μm but no more than 800 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 97%; and a space region in which a powder of core particles that have an average diameter in excess of 800 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 99%.

Preferably, the particles in the powder of core particles to be used have a size distribution of ($[D_M/5, 5D_M], \geq 90\%$) in terms of frequency distribution by volume, where $D_M$ represents the average particle diameter.

According to another aspect of the present invention, there is provided a diamond or high-pressure phase boron nitride sinter that are produced by the processes for producing a diamond or high-pressure phase boron nitride sinter as recited above.

Thus, in accordance with the present invention, diamond or high-pressure phase boron nitride sinters are produced by one of the following methods: the particles in a powder of core particles that are diamond or high-pressure phase boron nitride particles and the surfaces of which are coated with a coat forming substance or mixtures containing such particles are sintered at a pressure of 2000 MPa or higher and at an elevated temperature; or those particles or mixtures containing them are sintered at a pressure less than 2000 MPa and at a temperature not exceeding 1850° C. under such sintering pressure and temperature conditions that diamond or high-pressure phase boron nitride is thermodynamically metastable if not stable; or a mixture of the coated diamond or high-pressure phase boron nitride particles and a bonding material in a volume ratio of (1–90):(99–10), which bonding material is sinterable to a density of at least 85% at a pressure of less than 2000 MPa and at a temperature not exceeding 1850° C. under such conditions that diamond or high-pressure phase boron nitride is thermodynamically metastable, is sintered at a pressure of less than 2000 MPa and at a temperature not exceeding 1850° C. under such sintering pressure and temperature conditions that diamond or high-pressure phase boron nitride is thermodynamically metastable if not stable. In the practice of this invention, the diamond or high-pressure phase boron nitride particles the surfaces of which are coated with the coat forming substance are prepared by the following method: a precursor for the coat forming substance that has just formed via the vapor phase by a vapor-phase process and/or a precursor for the coat forming substance in a vapor-phase state and a mixture of a gas with a powder of highly dispersed core particles that have been dispersed in a gaseous atmosphere by the final treating means in a group of means for high dispersion treatment of particles are allowed to combine with each other in the coating start region of a coating space while the particles in the mixture of a gas and the powder of highly dispersed core particles are in a dispersed state with their dispersity being adjusted to one of the values set forth in preceding paragraphs depending upon their diameter, whereupon the precursor and the mixture are allowed to contact and/or impinge against each other so that the surfaces of the diamond or high-pressure phase boron nitride particles are coated with the coat forming substance. By so doing, one can produce a heretofore unattainable diamond or high-pressure phase boron nitride sinter of high performance that has no surfaces of diamond or high-pressure phase boron nitride particles left unsintered, that is uniform, dense and firmly sintered and which has a highly controlled microstructure. The precursor for the coat forming substance which is to be used in preparing the coated core particles is in a vapor-phase state as comprised of atoms, molecules, ions, clusters, atomic clusters, molecular clusters, cluster ions, etc. or it has just formed via the vapor phase; having started to contact and/or impinge against the diamond or high-pressure phase boron nitride particles in the already-discussed highly dispersed state, the coat forming substance binds firmly to the surfaces of the individual core particles in the state of primary particles, thereby yielding coated diamond or high-pressure phase boron nitride particles in which those core particles in powder form are covered with the coat forming substance on a single particle basis.

As will be understood from the above description, when the coated diamond or high-pressure phase boron nitride particles are sintered at a pressure of 2000 MPa or above and at an elevated temperature under such sintering conditions that diamond or high-pressure phase boron nitride is thermodynamically stable, the coats on the diamond or high-pressure phase boron nitride particles are bursted by the pushing force from inside and any two contiguous diamond or high-pressure phase boron nitride particles will bind directly to each other, thereby yielding an extremely uniform and dense sinter.

The invention also contemplates the case where the coated diamond or high-pressure phase boron nitride particles, either taken alone or in combination with a bonding material, are sintered at a pressure less than 2000 MPa and at a temperature not exceeding 1850° C. under such sintering pressure and temperature conditions that diamond or high-pressure phase boron nitride is thermodynamically metastable if not stable. In this case, the diamond or high-pressure phase boron nitride particles may contact each other but will not bind directly to each other; nevertheless, except in areas where the coated diamond or high-pressure phase boron nitride particles are in direct contact with each other, the coating substance which is to form a bonding material or a sintering aid is sure to surround those diamond or high-pressure phase boron nitride particles, and the resulting sinter has no part left unsintered, is uniform, dense and firmly sintered, and has an extremely highly controlled microstructure.

BRIEF DESCRIPTION OF THE DRAWINGS

FIGS. 4a–4e are diagrams showing how the coating operation is started on core particles in powder;

DETAILED DESCRIPTION OF THE INVENTION

Figure 1A:
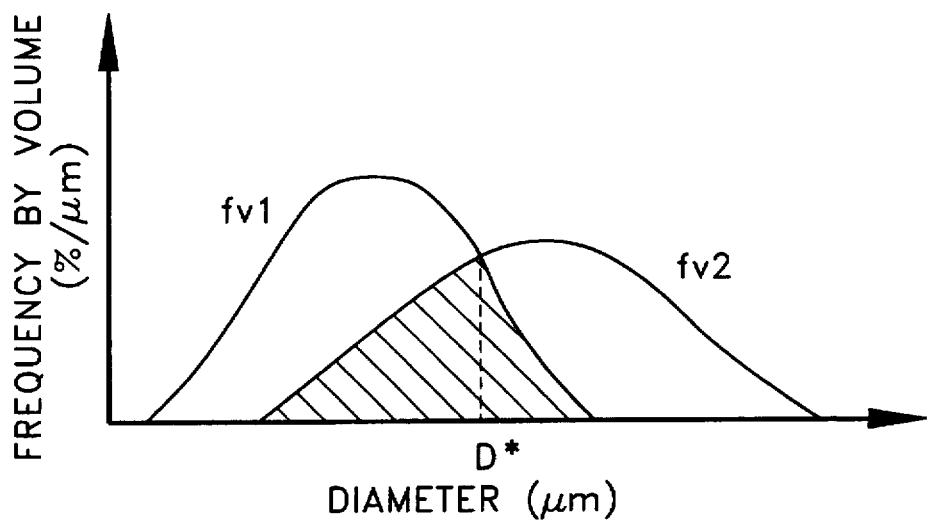
FIG. 1a is a diagram showing the dispersity β of particles in a powder.

The present invention is described below in detail. Before going into details of the invention, let us define the various terms, phrases and expressions that are used herein, and describe, if necessary, the specific implications of those terms, phrases and expressions, and then proceed to the description of the technical means for preparing diamond or high-pressure phase boron nitride particles coated with coat forming substances.

Coated Diamond or High-Pressure Boron Nitride Particles

The term "coated diamond particles" refers to the diamond particles to be described below which are provided with coats. The term "coated high-pressure phase boron nitride particles" refers to the high-pressure phase boron nitride particles to be described below which are provided with coats. To give one specific example, the terms refer to those coated particles in which diamond or high-pressure phase boron nitride core particles are provided with the coats of coat forming substances in the form of at least one type selected from among ultrafine particles, islands, continuous phase, uniform membranes, projections, etc.

Feed Powder Particles for Diamond or High-Pressure Boron Nitride Sinters

Natural and/or synthetic diamond powder particles are used as feed powder particles for diamond sinters in the present invention. On the other hand, cubic and/or wurtzite boron nitride particles are used as feed powder particles for high-pressure phase boron nitride sinters in the present invention.

To produce diamond or high-pressure phase boron nitride sinters of high performance which suit the purposes of the present invention, diamond or high-pressure phase boron nitride particles with diameters of no more than 10 μm are advantageously used as feed powders. However, in the case where wear resistance is of particular importance, particles exceeding 10 μm in average diameter are advantageous. Stated specifically, the particle diameter can be expressed in terms of frequency distribution by volume such that the average particle diameter $D_M$ satisfies the relation ($[D_M/5, 5D_M]$, $\geq 90\%$). However, depending on use, diamond or high-pressure phase boron nitride particles of a comparatively narrow distribution which, when expressed in terms of frequency distribution by volume, satisfies the relation ($[D_M/5, 5D_M]$, $\geq 90\%$) can preferably be selected. More advantageously, one may select diamond or high-pressure phase boron nitride particles that have been controlled, by sieve classification or other techniques, in the diameter of diamond or high-pressure phase boron nitride particles to satisfy the relation ($[D_M/2, 3D_M/2]$, $\geq 90\%$) in terms of frequency distribution by volume.

If diamond or high-pressure phase boron nitride particles having such distributions are used as feed powder particles and, by sintering those diamond or high-pressure phase boron nitride particles or mixtures containing those coated diamond or high-pressure phase boron nitride particles, one can manufacture diamond or high-pressure phase boron nitride sinters of high performance that are uniform, dense and firmly sintered and which have an extremely highly controlled microstructure, those sinters being characterized in that the diamond or high-pressure phase boron nitride particles are sure to be surrounded by a bonding material and/or a sintering aid and/or a surface modifier except in areas where the coat forming substance is bursted by the pushing force from inside and any two contiguous diamond or high-pressure phase boron nitride particles bind directly to each other and also characterized in that no part of the surfaces of the diamond or high-pressure phase boron nitride particles in the coated diamond or high-pressure phase boron nitride sinters is left unsintered.

It should be particularly noted when sintering is done under sintering pressure and temperature conditions where diamond or high-pressure phase boron nitride is thermodynamically metastable if not stable, the diamond or high-pressure phase boron nitride is advantageously of as high purity as to inhibit a phase transition to the low-pressure phase (graphite or hBN). As for diamond, grades of ultra-high purity can be selected from natural products however, high-pressure phase boron nitride does not occur naturally. Hence, with synthetic products of diamond or high-pressure phase boron nitride, any substance that has a catalytic action and which is used during synthesis is advantageously removed thereafter as much as possible. Most advantageously, one can select, for example, a diamond or cubic boron nitride of ultrahigh purity that has been synthesized via the vapor phase by a suitable technique such as a physical vapor deposition (PVD) process or a chemical vapor deposition (CVD) process. When the synthesized product is in the form of a thin film, it is used after being reduced in size with care being taken to avoid contamination with impurities. If the synthesized product is in a particulate or powder form, it may be used as such. Another example of high-purity product that can be selected is a high-purity single-crystal one which has been grown over time. Alternatively, diamond or cubic boron nitride particles that have been positively freed of impurities may be selected.

Vapor-Phase Coating Method

The term "vapor-phase coating method" means a method in which coating is applied with the feed of a coat forming substance being passed at least once through a vapor-phase state that consists of at least one member selected from among a molecular stream, an ionic stream, a plasma, a gas, a vapor and an aerosol; alternatively, the term refers to a method in which coating is applied from the feed of a coat forming substance in either one of the vapor-phase states mentioned above.

Core Particles

The term "core particles" refers to those particles which are to be provided with coatings. Such particles may sometimes be referred to as "base particles", "seed particles" or "particles to be coated".

The core particles are diamond or high-pressure phase boron nitride particles and the high-pressure phase boron nitride particles consist specifically of cubic boron nitride particles and/or wurtzite boron nitride particles.

Powder of Core Particles

The term "powder of core particles" means a powder consisting of core particles. The phrase "the particles in a powder of core particles" refers to those particles which compose the powder of core particles. The particles in the powder of core particles to be coated which are used in the present invention range from fine particles the average diameter of which is not more than 10 μm in terms of frequency distribution by volume to those particles the average diameter of which exceeds 800 μm in terms of frequency distribution by volume.

Preferred particles are those which have such a particle size distribution that the average diameter DM satisfies the relation ($[D_M/5, 5D_M]$, $\geq 90\%$) in terms of frequency distribution by volume.

With powders having such comparatively narrow distributions, their dispersion or cohesion characteristics are characterized by average particle diameter and the powders can be dispersed by operating a group of means for high dispersion treatment of particles under conditions that suit the specific value of $D_M$.

With a powder of core particles the particle size distribution of which is either broad or has a plurality of separate spaced peaks, a suitable selective separation treatment, say, classification may advantageously be performed and the individual classified powder portions are subjected to the coating treatment according to the invention. By so doing, coating can be started on the individual classified powder portions under the above-stated conditions in the coating start region of the coating space with the dispersity $\beta$ adjusted to at least 70%, 80%, 90%, 95%, 97% or 99% depending on the average particle diameter, whereupon the individual particles in the powder of core particles can be provided with coatings.

Coat Forming Substance

The term "coat forming substance" means a substance that forms a coat on the particles to be coated. This may specifically be exemplified by those substances which provide the particles in the powder of core particles with coatings in the form of at least one kind selected from among ultrafine particles, islands, continuous phase, uniform membranes, projections, etc.

Particularly in the case where the coat forming substance assumes the form of ultrafine particles, their diameter may range from 0.005 μm to 0.5 μm.

The coat forming substance may form a coating by itself or, alternatively, it reacts with the diamond or high-pressure phase boron nitride in the core particles and/or dissolves in the diamond or high-pressure phase boron nitride particles to form a solid solution and/or two or more coat forming substances may be reacted and/or alloyed with each other and/or dissolved in each other to form coatings. To this end, the coat forming substance is selected from among elemental substances and/or compounds that generate one or more of the desired inorganic compounds, alloys, intermetallic compounds, etc. to form such coatings, thereby serving as sintering aids and/or bonding materials which promote the sintering of the coated diamond or high-pressure phase boron nitride particles and/or as surface modifiers for the diamond or high-pressure phase boron nitride particles.

When sintering is done under sintering pressure and temperature conditions where diamond or high-pressure phase boron nitride is thermodynamically metastable if not stable, the diamond or high-pressure phase boron nitride particles are to be coated with a coat forming substance that is selected from among those which will not promote the phase transition of diamond or high-pressure phase boron nitride to the lower-pressure phase (graphite or hBN). The coat forming substance is also selectable as a surface modifier which controls the grain boundaries of the diamond or high-pressure phase boron nitride particles. Various modifications may be performed as required and they include, for example: enhancing the chemical bonding between the diamond or high-pressure phase boron nitride particles and said sintering aid and/or bonding material; isolating the individual diamond or high-pressure phase boron nitride particles from a certain substance, thereby inhibiting the phase transition of diamond or high-pressure phase boron nitride to the lower-pressure phase (graphite or hBN); or inhibiting the reaction between diamond or high-pressure phase boron nitride with a certain substance. These methods contribute to an outstanding increase in the latitude in the selection of the coat forming substance as a sintering aid and/or bonding material, which certainly is a definite advantage for the purposes of the invention.

These coat forming substances can be those which contain at least one member selected from among metals, semiconductors, metalloids, rare earth metals and nonmetals of groups 1a, 2a, 3a, 4a, 5a, 6a, 7a, 1b, 2b, 3b, 4b, 5b, 6b, 7b and 8 of the periodic table, as well as oxides, nitrides, carbides, oxynitrides, oxycarbides, carbonitrides, oxycarbonitrides, borides and silicides thereof, as exemplified by the following: Al, B, Si, Fe, Ni, Co, Ti, Nb, V, Zr, Hf, Ta, W, Re, Cr, Cu, Mo, Y, La, TiAl, $Ti_3Al$, $TiAl_3$, TiNi, NiAl, $Ni_3Al$, SiC, TiC, ZrC, $B_4C$, WC, $W_2C$, HfC, VC, TaC, $Ta_2C$, NbC, $Mo_2C$, $Cr_3C_2$, $Si_3N_4$, TiN, ZrN, $Si_2N_2O$, AlN, HfN, VxN (x=1~3), NbN, TaN, $Ta_2N$, TiB, $TiB_2$, $ZrB_2$, VB, $V_3B_2$, $VB_2$, NbB, $NbB_2$, TaB, $TaB_2$, MoB, $MOB_2$, $MOB_4$, $Mo_2B$, WB, $W_2B$, $W_2B_5$, $LaB_6$, $B_{13}P_2$, $MoSi_2$, BP, $Al_2O_3$, $ZrO_2$, $MgAl_2O_4$ (spinel) and $Al_2SiO_5$ (mullite).

The amounts in which the coat forming substances are added to form the coats on the surfaces of the coated diamond or high-pressure phase boron nitride particles are not limited in any particular way and suitable values can be selected that suit specific uses; advantageously, any desired values are selected as long as they are capable of densifying the diamond or high-pressure phase boron nitride sinters.

Uniform Coating

In the case where the coat forming substance takes the form of a uniform membrane, the term "uniform coating" means that the coating film is uniform in every portion of a single particle. In the case where the coat forming substance takes the form of an ultrafine particle, an island or a projection, the term "uniform coating" means that the coat forming substance in the form of an ultrafine particle, an island or a projection provides a coating of uniform distribution. It should be understood that any unevenness that is unavoidable in the process of generation of the coat forming substance will be embraced within the category of "uniformity".

Definition of "Charging into the Coating Space"

The phrase "charging into the coating space" means introducing the powder of core particles into the coating space by a certain method of falling such as free fall. In the case of charging by means of a carrier gas, the phrase means introducing the powder of core particles as it is carried in the direction of a mixture of a gas and the particles in the powder of core particles, or carried by a gas in the direction of its flow, or carried by a gas to change the direction of flow. Alternatively, the phrase means introduction under the action of a carrier gas, for example, through the wave motion, specifically, a nonlinear wave motion, of the carrier gas. Alternatively, the phrase means introduction into the coating space by sound waves, ultrasonic waves, magnetic fields, electron beams, etc. in the gas. The phrase also means introduction in an applied field such as an electric field, a magnetic field or electron beams. Specifically, the powder particles may be charged or magnetized in an electric field, a magnetic field, by electron beams, etc. and introduced into the coating space by attractive or repulsive forces. Also contemplated by the phrase is introduction by aspiration under the back pressure of the gas or in vacuo.

Coating Space

The term "coating space" refers to a space in which the precursor of the coat forming substance which is generated from the feed of the coat forming substance via the vapor phase and/or the precursor of the coat forming substance in a vapor-phase state contacts and/or impinges against the particles in the powder of core particles. Alternatively, the term refers to a space region in which the surfaces of the particles in the powder of core particles are coated with the coat forming substance.

Coating Chamber

The term "coating chamber" means a compartment having the coating space in at least one part. More specifically, the coating chamber is a partitioned or generally partitioned (generally closed or semi-closed) compartment including the coating space and it is a compartment including the coating space in at least one part.

Within Gaseous Atmosphere

The expression "within a gaseous atmosphere" means within a space under vacuum or in a vapor-phase state. The term "vapor-phase state" as used herein means various states such as a molecular stream, an ionic stream, a plasma, a gas and a vapor. Technically speaking, the term "vacuum" refers to a state under reduced pressure. Strictly speaking, gases, molecules, atoms, ions, etc. are contained at any values of reduced pressure.

Precursor of the Coat Forming Substance

The term "precursor of the coat forming substance" means a precursor for the coat forming substance. More specifically, it refers to the feed per se of the coat forming substance in a vapor-phase state or, alternatively, it means a substance that is formed and/or synthesized from the feed of the coat forming substance via the vapor phase and which exists until just before it forms a coating on the core particles to be coated. The precursor of the coat forming substance is not limited to any state as long as it is formed and/or synthesized from the feed of the coat forming substance via the vapor phase. If the feed of the coat forming substance is in the vapor phase, the feed itself can be used as the precursor of the coat forming substance. The precursor of the coat forming substance may itself be in the vapor phase. If the precursor of the coat forming substance is a reactive substance, it may be prior to, or during or after the reaction. Specific examples of the precursor of the coat forming substance include ions, atoms, molecules, clusters, atomic clusters, molecular clusters, cluster ions, superfine particles, gases, vapors, aerosols, etc.

Feed of the Coat Forming Substance

The term "feed of the coat forming substance" refers to a feed material that passes through the vapor phase to become a coat forming substance. Specific examples of the state in which the feed of the coat forming substance may exist include solid lumps, powder particles, gases, liquids, etc.

Dispersity β

Dispersity β was proposed by Masuda, Gotoh et al. as an index for evaluating the dispersing performance of powder dispersing equipment [see KAGAKU KOGAKU, Summaries of Speeches and Lectures Delivered at the 22th Autumn Conference, p. 349 (1989)] and is defined as the proportion of the weight of particles in the state of apparent primary particles relative to the total weight of the particles present. The term "particles in the state of apparent primary particles" as used herein refers to the proportion of the overlap between the frequency distribution by mass of powder particles in a given state of dispersion $f_{m2}$ and the frequency distribution by mass of completely dispersed powder particles $f_{m1}$ and is expressed by $\beta$ according to the following equation:

$$\beta = \int_0^{D_m^*} f_{m2}(D)dD + \int_{D_m^*}^{\infty} f_{m1}(D)dD$$

where D: particle diameter (μm);

$D_m^*$: the particle diameter (μm) for the point of crossing between $f_{m1}$ and $f_{m2}$;

$f_{m1}$: the frequency distribution by mass (%/μm) representing the particle size distribution for complete dispersion;

$f_{m2}$: the frequency distribution by mass (%/μm) representing the particle size distribution of particles in a given state of dispersion; and $\beta$: dispersity (%).

In the equation set forth above, the unit of measurement (μm) of the particle diameter is not limited to any particular value.

This equation evaluates dispersity on the basis of the particle size distribution as expressed by mass; however, dispersity should in principle be evaluated on the basis of the particle size distribution expressed by volume. But given the same density of powder particles, the particle size distribution as expressed by mass is equal to the particle size distribution expressed by volume. Therefore, in practice, the particle size distribution by mass which is easy to measure is determined and used as an equivalent of the particle size distribution by volume. Therefore, the dispersity $\beta$ in the true sense of the term is expressed by the following equation and the area of the hatched portion shown in FIG. 1a:

$$\beta = \int_0^{D_v^*} f_{v2}(D)dD + \int_{D_v^*}^{\infty} f_{v1}(D)dD$$

where D: particle diameter (μm);

$D_v^*$: the particle diameter (μm) for the point of crossing between $f_{v1}$ and $f_{v2}$;

$f_{v1}$: the frequency distribution by volume (%/μm) representing the particle size distribution for complete dispersion;

$f_{v2}$: the frequency distribution by volume (%/μm) representing the particle size distribution of particles in a given state of dispersion; and $\beta$: dispersity (%).

In the equation set forth above, the unit of measurement (μm) of the particle diameter is not limited to any particular value.

In the following description, the distribution of the particles in the powder of core particles and their average diameter should, in principle, be based on volume unless otherwise noted.

Frequency Distribution by Volume

The frequency distribution by volume represents the distribution of particle diameter in terms of the relative volume of particles in a certain range of diameters.

Definition of ([D1,D2], $\geq 90\%$)

Figure 1B:
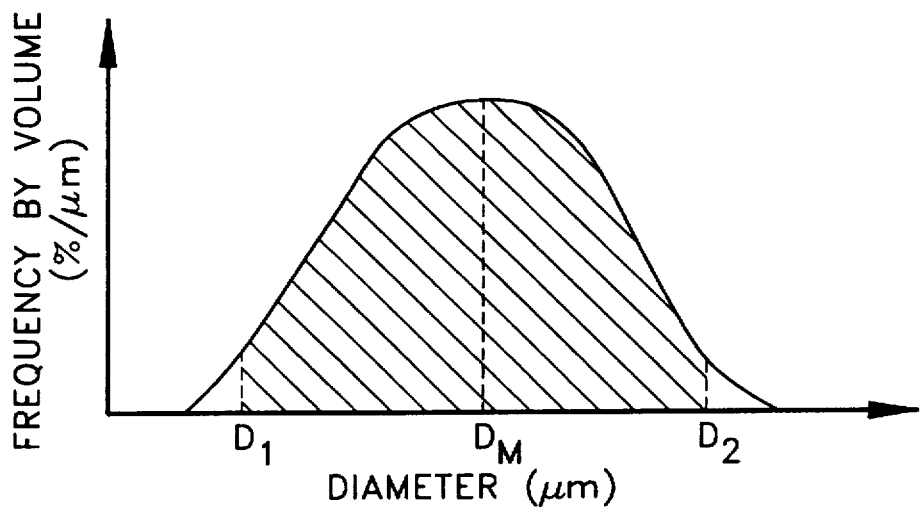
FIG. 1b is a diagram showing the frequency by volume vs diameter relationship of a powder 90% of the volume of which is occupied by particles with sizes in the range from $D_1$–$D_2$.

A ([D1,D2], $\geq 90\%$) distribution represents one in which particles from D1 to D2 (D1 and D2 each represent the particle diameter, provided that D1<D2) account for at least 90% of the total volume of the particles present; a powder having this distribution is shown graphically in FIG. 1b, in which the hatched portion accounts for at least 90% of the area under the curve.

Definition of Frequency Distribution by Volume ($[D_M/5, 5D_M]$, $\geq 90\%$)

A particle size distribution that is expressed by ($[D_M/5, 5D_M]$, $\geq 90\%$) in terms of frequency distribution by volume represents one in which particles ranging in diameter from one fifth of $D_M$ to five times $D_M$ ($D_M$ is the average particle diameter by volume) account for at least 90% of the total volume of the particles present. Consider, for example, particles having an average diameter $D_M$ of 10 μm on a volume basis; a particle size distribution that is expressed by ($[D_M/5, 5D_M]$, $\geq 90\%$) in terms of frequency distribution by volume represents one in which particles ranging in diameter from 2 μm to 50 μm account for at least 90% of the total volume of the particles present. The average particle diameter $D_M$ on a volume basis is expressed by:

$$D_M = \frac{\int_0^{\infty} Df(D)dD}{\int_0^{\infty} f(D)dD}$$

where f(D) is the frequency distribution by volume. Or $D_M$ is technically expressed by:

$$DM = \Sigma(V_i D_i)/\Sigma V_i$$

where Vi is the volume of a group of particles within a given interval of diameters $D_i \pm \Delta D_i/2$ ($\Delta D_i$ is the width of interval).

Coating Start Region

The region where coating is first started after the final treatment by the group of means for high dispersion treatment of particles is called the "coating start region". Therefore, prior to the final treatment by the group of means for high dispersion treatment of particles, no region is called the "coating start region" according to this definition even if coating is first started there.

Dispersity $\beta$ in the Coating Start Region

In the present invention, the coating chamber is provided in such a way that the coating start region of the coating space is located in a region that satisfies one of the following conditions:

(1) a powder of core particles that have an average diameter of no more than 10 μm in the frequency distribution by volume should be dispersed in a gaseous atmosphere by the final treatment by the group of means for high dispersion treatment of particles, thereby forming a mixture of a gas and the particles in the powder of highly dispersed core particles and the dispersity $\beta$ of the particles in said powder of core particles should be adjusted to at least 70%;

(2) a powder of core particles that have an average diameter in excess of 10 μm but no more than 20 μm in the frequency distribution by volume should be dispersed in a gaseous atmosphere by the final treatment by the group of means for high dispersion treatment of particles, thereby forming a mixture of a gas and the particles in the powder of highly dispersed core particles and the dispersity $\be (4) a powder of core particles that have an average diameter in excess of 50 μm but no more than 300 μm in the frequency distribution by volume should be dispersed in a gaseous atmosphere by the final treatment by the group of means for high dispersion treatment of particles, thereby forming a mixture of a gas and the particles in the powder of highly dispersed core particles and the dispersity β of the particles in said powder of core particles should be adjusted to at least 95%;

(5) a powder of core particles that have an average diameter in excess of 300 μm but no more than 800 μm in the frequency distribution by volume should be dispersed in a gaseous atmosphere by the final treatment by the group of means for high dispersion treatment of particles, thereby forming a mixture of a gas and the particles in the powder of highly dispersed core particles and the dispersity β of the particles in said powder of core particles should be adjusted to at least 97%; and (6) a powder of core particles that have an average diameter in excess of 800 μm in the frequency distribution by volume should be dispersed in a gaseous atmosphere by the final treatment by the group of means for high dispersion treatment of particles, thereby forming a mixture of a gas and the particles in the powder of highly dispersed core particles and the dispersity β of the particles in said powder of core particles should be adjusted to at least 99%.

Given one of those dispersities in the coating start region of the coating space, one can disperse the particles in the powder of core particles to such a state that they are substantially single particles in a gaseous atmosphere, so that the precursor of the coat forming substance will uniformly contact and/or impinge against the surfaces of all particles in the powder of core particles that pass through the coating start region of the coating space, whereby the coat forming substance can be deposited on single particles in equal amounts.

In the present invention, dispersity β varies continuously with the average diameter of the particles in the powder of core particles but because of the difficulty involved in expressing it, the convenient stepwise expression is adopted.

Advantageously, the coating chamber is provided in such a way that the coating start region of the coating space is located in a space region that satisfies one of the following conditions:

(1) a powder of core particles that have an average diameter of no more than 10 μm in the frequency distribution by volume should be dispersed in a gaseous atmosphere by the final treatment by the group of means for high dispersion treatment of particles, thereby forming a mixture of a gas and the particles in the powder of highly dispersed core particles and the dispersity β of the particles in said powder of core particles should be adjusted to at least 80%;

(2) a powder of core particles that have an average diameter in excess of 10 μm but no more than 20 μm in the frequency distribution by volume should be dispersed in a gaseous atmosphere by the final treatment by the group of means for high dispersion treatment of particles, thereby forming a mixture of a gas and the particles in the powder of highly dispersed core particles and the dispersity β of the particles in said powder of core particles should be adjusted to at least 90%;

(3) a powder of core particles that have an average diameter in excess of 20 μm but no more than 50 μm in the frequency distribution by volume should be dispersed in a gaseous atmosphere by the final treatment by the group of means for high dispersion treatment of particles, thereby forming a mixture of a gas and the particles in the powder of highly dispersed core particles and the dispersity β of the particles in said powder of core particles should be adjusted to 95%;

(4) a powder of core particles that have an average diameter in excess of 50 μm but no more than 300 μm in the frequency distribution by volume should be dispersed in a gaseous atmosphere by the final treatment by the group of means for high dispersion treatment of particles, thereby forming a mixture of a gas and the particles in the powder of highly dispersed core particles and the dispersity β of the particles in said powder of core particles should be adjusted to 97%; and (5) a powder of core particles that have an average diameter in excess of 300 μm in the frequency distribution by volume should be dispersed in a gaseous atmosphere by the final treatment by the group of means for high dispersion treatment of particles, thereby forming a mixture of a gas and the particles in the powder of highly dispersed core particles and the dispersity β of the particles in said powder of core particles should be adjusted to at least 99%. Given the coating chamber in which the coating start region of the coating space is located in such a way as to satisfy those conditions, the particles in the powder of core particles are at least free from areas that are substantially closed by two adjacent core particles and it is possible to assure that the precursor of the coat forming substance is allowed to contact and/or impinge against the surfaces of individual particles from every direction, whereby coating with the coat forming substance can be accomplished more uniformly on a single particle basis and, accordingly, coating can be done to provide more uniform coating weights for the individual core particles.

The particles in a powder of core particles that have an average diameter exceeding 10 μm in the frequency distribution by volume are subjected to a cohesive action in a gaseous atmosphere, although not as intense as in the case of the particles in a powder of core particles that have an average diameter no more than 10 μm, and they contact and/or impinge against one another, causing unevenness in the distribution of the particles in the powder of highly dispersed core particles which form a mixture with a gas. However, if the coating of the particles in the powder of core particles is started as they are dispersed to provide one of the above-specified dispersities in accordance with their diameter, the particles in the powder of core particles or the particles in a powder that consists chiefly of the core particles can be coated with the coat forming substance more uniformly on a single particle basis and, accordingly, the individual particles can be coated with the coat forming substance in more uniform weights.

More advantageously, in the coating start region of the coating space, (1) a powder of core particles that have an average diameter of no more than 10 μm in the frequency distribution by volume should be dispersed in a gaseous atmosphere by the final dispersing treatment by the group of means for high dispersion treatment of particles, thereby forming a mixture of a gas and the particles in the powder of highly dispersed core particles and the dispersity β of the particles in said powder of core particles should be adjusted to at least 90%, or (2) a powder of core particles that have an average diameter in excess of 10 μm but no more than 20 μm in the frequency distribution by volume should be dispersed in a gaseous atmosphere by the final dispersing treatment by the group of means for high dispersion treatment of particles, thereby forming a mixture of a gas and the particles in the powder of highly dispersed core particles and the dispersity β of the particles in said powder of core particles should be adjusted to at least 95%, or (3) a powder of core particles that have an average diameter in excess of 20 μm but no more than 50 μm in the frequency distribution by volume should be dispersed in a gaseous atmosphere by the final dispersing treatment by the group of means for high dispersion treatment of particles, thereby forming a mixture of a gas and the particles in the powder of highly dispersed core particles and the dispersity β of the particles in said powder of core particles should be adjusted to at least 97%, or (4) a powder of core particles that have an average diameter in excess of 50 μm in the frequency distribution by volume should be dispersed in a gaseous atmosphere by the final dispersing treatment by the group of means for high dispersion treatment of particles, thereby forming a mixture of a gas and the particles in the powder of highly dispersed core particles and the dispersity β of the particles in said powder of core particles should be adjusted to at least 99%.

If one of these dispersities is attained in the coating start region of the coating space, the core particles are practically free from agglomeration and practically uniform coating can be performed on all surfaces of the individual particles.

If, in a particular case, high-quality coating is desired at the sacrifice of the efficiency of treatment, the dispersity is preferably at least 95%. In this case, the throughput of the treatment of the particles in the powder of core particles may be reduced to a very small level, namely, the concentration by number of the particles in the powder of core particles in the gaseous atmosphere may be reduced so that the particles in the powder of core particles are dispersed completely, whereby uniform coating can thoroughly be accomplished on the entire surfaces of the individual particles.

Group of Means for High Dispersion Treatment of Particles

The group of means for high dispersion treatment of particles which is to be used in the present invention is such that: (A) it has at least one dispersing means; and (B) it has, as the final treating means, (a) dispersing means for dispersing the particles in a powder of core particles in a gaseous atmosphere or (b) means for selecting a mixture of a gas and the particles in a powder of highly dispersed particles which comprises (b-1) means for selecting a mixture of a gas and the particles in a powder of highly dispersed particles that separates a portion of the powder that is composed of less highly dispersed particles from the mixture of a gas and the particles in the powder of core particles in which the particles in the powder of core particles are dispersed in a gaseous atmosphere, thereby selecting a mixture of a gas and the particles in a powder of highly dispersed core particles in which the particles in the powder of core particles are present in the gaseous atmosphere mainly in a single-particle state and (b-2) feedback means by which the portion of the powder that is composed of less highly dispersed particles and which has been separated by the means for selecting a mixture of a gas and the particles in a powder of highly dispersed particles is transported to the final dispersing means among the dispersing means in the group of means for high dispersion treatment of particles and/or treating means upstream of the final dispersing means.

Advantageously, the group of means for high dispersion treatment of particles has such dispersing performance that one of the following conditions is satisfied:

(1) a powder of core particles that have an average diameter of no more than 10 μm in the frequency distribution by volume should be dispersed in a gaseous atmosphere by the final treatment by said group of means for high dispersion treatment of particles, thereby forming a mixture of a gas and the particles in the powder of highly dispersed core particles and the dispersity β of the particles in said powder of core particles should be adjusted to at least 70%;

(2) a powder of core particles that have an average diameter in excess of 10 μm but no more than 20 μm in the frequency distribution by volume should be dispersed in a gaseous atmosphere by the final treatment by said group of means for high dispersion treatment of particles, thereby forming a mixture of a gas and the particles in the powder of highly dispersed core particles and the dispersity β of the particles in said powder of core particles should be adjusted to at least 80%;

(3) a powder of core particles that have an average diameter in excess of 20 μm but no more than 50 μm in the frequency distribution by volume should be dispersed in a gaseous atmosphere by the final treatment by the group of means for high dispersion treatment of particles, thereby forming a mixture of a gas and the particles in the powder of highly dispersed core particles and the dispersity β of the particles in said powder of core particles should be adjusted to at least 90%;

(4) a powder of core particles that have an average diameter in excess of 50 μm but no more than 300 μm in the frequency distribution by volume should be dispersed in a gaseous atmosphere by the final treatment by the group of means for high dispersion treatment of particles, thereby forming a mixture of a gas and the particles in the powder of highly dispersed core particles and the dispersity β of the particles in said powder of core particles should be adjusted to at least 95%;

(5) a powder of core particles that have an average diameter in excess of 300 μm but no more than 800 μm in the frequency distribution by volume should be dispersed in a gaseous atmosphere by the final treatment by the group of means for high dispersion treatment of particles, thereby forming a mixture of a gas and the particles in the powder of highly dispersed core particles and the dispersity β of the particles in said powder of core particles should be adjusted to at least 97%; and (6) a powder of core particles that have an average diameter in excess of 800 μm in the frequency distribution by volume should be dispersed in a gaseous atmosphere by the final treatment by the group of means for high dispersion treatment of particles, thereby forming a mixture of a gas and the particles in the powder of highly dispersed core particles and the dispersity β of the particles in said powder of core particles should be adjusted to at least 99%.

By insuring that the group of means for high dispersion treatment of particles have dispersing capabilities comparable to or better than the various dispersities to be attained in the above-described coating start region and by providing them in correspondence to those dispersities, high-quality coating can be applied in the coating start region to comply with the respective dispersities.

Final Treating Means

If the final treating means in the group of means for high dispersion treatment of particles is a dispersing means, said dispersing means is referred to as the final treatment means in the group of means for high dispersion treatment of particles. If the final treating means in the group of means for high dispersion treatment of particles is a means for selecting a mixture of a gas and the particles in a powder of highly dispersed particles which is equipped with a feedback means by which the portion that has been separated selectively on account of less highly dispersed state during the step of treatment for selecting the mixture of a gas and the particles in the powder of highly dispersed core particles is to be transported to the final dispersing means at the last stage of the means for high dispersion treatment of particles, or if said final treating means is a means for selecting a mixture of a gas and the particles in a powder of highly dispersed particles which is equipped with a feedback means by which the portion that has been separated selectively on account of less highly dispersed state during the step of treatment for selecting the mixture of a gas and the particles in the powder of highly dispersed core particles is to be transported to a treating means upstream of the final dispersing means, said means for selecting a mixture of a gas and the particles in a powder of highly dispersed core particles is referred to as the final treating means in the group of means for high dispersion treatment of particles.

It should be noted here that any means for selecting a mixture of a gas and the particles in a powder of highly dispersed particles that is provided upstream of the means for selecting a mixture of a gas and the particles in a powder of highly dispersed particles that is equipped with a feedback means and which is the final treating means in the group of means for high dispersion treatment of particles ("upstream" may typically mean between the means for selecting a mixture of a gas and the particles in a powder of highly dispersed particles that is equipped with a feedback means and the final dispersing means, or upstream of the final dispersing means) is a constituent element of the group of means for high dispersion treatment of particles and this is true irrespective of whether the feedback means is used or not.

Dispersing Means

The means used to disperse particles is named a dispersing means. Any mechanism that has even a small or slight dispersing effect is usable as a dispersing means and it is used as a dispersing means in the invention. Consider, for example, a rotary feeder and an injection feeder for pneumatic conveying which are commonly used as supply means ["Funtai Kogaku Binran (A Handbook of Particle Technology)", Ed. by Funtai Kogakukai (Society of Particle Technology), published by Nikkan Kogyo Shinbunsha in 1986, pp. 568 and 571]. These apparatus also have a dispersing effect and, hence, they are dispersing means if used as means to achieve dispersion. The dispersion maintaining and promoting means which are to be discussed later are also dispersing means if they are used to achieve dispersion (for increasing β). Such dispersing means may be a single apparatus or machine or it may be a complex of apparatus and machines; to cover all of these cases, the dispersing means is collectively referred to as the "group of means for high dispersion treatment of particles".

The group of means for high dispersion treatment of particles is such that it operates on at least one selected mechanism of dispersion, such as dispersing the particles in a powder of core particles by a gas stream which accelerates and/or places them in a velocity gradient, dispersing the particles in a powder of core particles by impingement against a static obstacle and/or an obstacle composed of a rotating body, and dispersing the particles in a powder of core particles by mechanical disagglomeration which consists of a fluidized bed and/or pulsation and/or a rotary drum and/or vibrations and/or scraping.

Specifically, the group of means for high dispersion treatment of particles is equipped with at least one selected dispersing means, such as an ejector-type disperser, a Venturi-type disperser, a disperser using a capillary, an agitator, and an obstacle in a gas stream, a disperser using a jet blow, a disperser using a spiral tube and rotating blades, a disperser using rotating pins (Kady mill), a fluidized bed-type disperser, a disperser using pulsation, a disperser using a rotary drum, a disperser using vibrations, a disperser using a vibrating screen and the scraping action of a scraper, an SAEI Gonnel-type disperser, a Chujo-type disperser, a Roller-type disperser, an office-type disperser, a B.M. type disperser, a Timbrell-type disperser, and a Wright-type disperser ["Funtai Kogaku Binran (A Handbook of Particle Technology)", Ed. by Funtai Kogakukai (Society of Particle Technology), published by Nikkan Kogyo Shinbunsha in 1986, p. 430].

Also usable are the dispersers described in official gazettes and exemplified blow: the disperser using agitating blades which is described in Unexamined Published Japanese Patent Application (kokai) Sho 56-1336; the disperser using a high-speed gas stream and dispersing nozzles which is described in Unexamined Published Japanese Patent Application (kokai) Sho 58-163454; the disperser using the dispersing action of rotating blades and the dispersing action of plasma ions which is described in Unexamined Published Japanese Patent Application (kokai) Sho 59-199027; the disperser using the dispersing action of plasma ions which is described in Unexamined Published Japanese Patent Application (kokai) Sho 59-207319; the disperser using an ejector and the dispersing action of plasma ions which is described in Unexamined Published Japanese Patent Application (kokai) Sho 59-216616; the disperser using an ejector and the dispersing action of ion streams which is described in Unexamined Published Japanese Patent Application (kokai) Sho 59-225728; the disperser using the dispersing action of plasma ions which is described in Unexamined Published Japanese Patent Application (kokai) Sho 59-183845; the disperser using the dispersing action of dispersing blades and a pressure gas which is described in Unexamined Published Japanese Patent Application (kokai) Sho 63-166421; the disperser using lineal or annular slit jet ports which is described in Unexamined Published Japanese Patent Application (kokai) Sho 62-176527; the disperser using mesh blades which is described in Unexamined Published Japanese Patent Application (kokai) Sho 63-221829; the disperser using the dispersing action of high-speed gas streams issuing from jet nozzles which is described in Unexamined Published Japanese Patent Application (kokai) Sho 63-1629; the disperser using many small holes which is described in Unexamined Published Utility Model Application (kokai) Sho 63-9218; the ejector-type disperser which is described in Unexamined Published Japanese Utility Model Application (kokai) Sho 62-156854; and the disperser using small holes and orifices which is described in Unexamined Published Japanese Utility Model Application (kokai) Sho 63-6034.

Dispersing means advantageous for use in the group of means for high dispersion treatment of particles include the apparatus that are described in Japanese Patent Application Sho 63-311358, Japanese Patent Application Hei 1-71071, Japanese Patent Application Hei 2-218537, etc.

Means for Selecting a Mixture of a Gas and the Particles in a Powder of Highly Dispersed Core Particles The means for selecting a mixture of a gas and the particles in a powder of highly dispersed core particles is a means that separates a mixture of a gas and the particles in a powder of less highly dispersed core particles from the mixture of a gas and the particles in the powder of core particles so as to select a mixture of a gas and the particles in a powder of highly dispersed core particles that is chiefly composed of those particles which are in a single-particle state. Agglomerating particles which are association of primary particles have a greater apparent diameter than the primary particles and, hence, they can be separated by a suitable means such as dry classifying means. An example of the means for selecting a mixture of a gas and the particles in a powder of highly dispersed core particles is at least one dry classifying means selected from among the following: classifying means using gravity, classifying means using inertia force, classifying means using centrifugal force, classifying means using static electricity, classifying means using a fluidized bed, etc.

Specific examples of the means for selecting the mixture of a gas and the particles in a powder of highly dispersed core particles include: a gravity classifier, an inertia classifier, a centrifugal classifier, a cyclone, an air separator, a micron separator, a microplex, a multiplex, a zigzag classifier, an acu-cut, a conical separator, a turbo classifier, a super separator, a dispersion separator, an elbow jet, a fluidized bed classifier, a virtual impactor, an O-Sepa, a sieve, a vibrating screen, a sifter ["Funtai Kogaku Binran (A Handbook of Particle Technology)", Ed. by Funtai Kogakukai (Society of Particle Technology), published by Nikkan Kogyo Shinbunsha in 1986, p. 514].

Mixture of a Gas and the Particles in a Powder of Core Particles

The mixture of a gas and the particles in a powder of core particles refers to (a) a homogeneous flow characterized in that the particles in a powder of core particles are suspended uniformly in a gaseous atmosphere (which may be called a "uniform suspension flow"), (b) a heterogeneous flow characterized in that the particles in a powder of core particles show a nonuniform distribution in certain regions of a gaseous atmosphere (which may be called an "inhomogeneous suspension flow"), (c) a flow involving a sliding layer of the particles in a powder of core particles (which may be called a "sliding flow"), or (d) a flow involving a stationary layer of the particles in a powder of core particles.

Mixture of a Gas and the Particles in a Powder of Less Highly Dispersed Core Particles The mixture of a gas and the particles in a powder of less highly dispersed core particles refers to that portion of a mixture of a gas and the particles in a powder of core particles in which the powder particles are present in a gaseous atmosphere mainly in states other than the single-particle state.

Mixture of a Gas and the Particles in a Powder of Highly Dispersed Core Particles The mixture of a gas and the particles in a powder of highly dispersed particles refers to a mixture of a gas and the particles in a powder of core particles in which the powder particles are present in a gaseous atmosphere mainly in a single-particle state. No matter how much high the degree of dispersion is, the mixture of a gas and the particles in a powder of highly dispersed core particles contains agglomerating particles in practice. The mixture of a gas and the particles in a powder of less highly dispersed particles contains non-agglomerating single particles in practice and can be selectively separated into a mixture of a gas and the particles in a powder of less highly dispersed particles and a mixture of a gas and the particles in a powder of highly dispersed particles. The mixture of a gas and the particles in a powder of less highly dispersed particles is converted to a mixture of a gas and the particles in a powder of highly dispersed particles by selective separation and/or redispersion of the agglomerating particles.

Recovery Means

The recovery means is a means for picking up the coated particles that have been prepared in the coating space. The part of the recovery means in which the recovery treatment is performed is called the "recovery section". The coated particles the coating on which has been provided by passage through the coating start region of the coating space are recovered by direct pickup from the gaseous atmosphere or after temporary storage following pickup from the gaseous atmosphere or together with a gas.

Usable as the recovery section of the recovery means is one of the following members: the recovery section of the recovery means that uses barriers (obstacles), the recovery section of the recovery means that uses gravity, the recovery section of the recovery means that uses inertia forces, the recovery section of the recovery means that uses centrifugal forces, the recovery section of the recovery means that uses coulombic attractive forces; the recovery section of the recovery means that uses thermophoretic forces, the recovery section of the recovery means that uses Brownjan diffusion, the recovery section of the recovery means that uses the pulling force of the back pressure, evacuation, etc.

Advantageous examples of the recovery section of the recovery means include a gravity dust collector, an inertia dust collector, a centrifugal dust collector, a filtration dust collector, an electrostatic precipitator, a scrubbing dust collector, a particle packed layer, a cyclone, a bag filter, a ceramic filter, a scrubber, etc.

Bonding Material

The bonding material to be used to manufacture diamond or high-pressure phase boron nitride sinters in accordance with the invention is selected from among those bonding materials which can be sintered densely to a density of at least 85% by sintering at pressures less than 2000 MPa and at temperatures not exceeding 1850° C. Advantageously, those bonding materials are selected which will not promote the phase transition of diamond or high-pressure phase boron nitride to the lower-pressure phase (graphite or hBN). Alternatively, those bonding materials are selected which, when sintered at pressures less than 2000 MPa and at temperatures not exceeding 1850° C., will react with diamond or boron nitride to yield dense reaction products that have densities of at least 85%. More preferably, those substances are selected which, when sintered at pressures less than 2000 MPa and at temperatures not exceeding 1850° C., will produce bonding materials that are dense (density $\geq 90\%$) and/or of high hardness (Vickers hardness $\geq 600$). Feed powders which, when sintered at pressures less than 2000 MPa and at temperatures not exceeding 1850° C., will yield dense bonding materials having densities of at least 85% are selected from powders or particles that contain at least one of the metals, semiconductors, metalloids and rare earth metals of groups 1a, 2a, 3a, 4a, 5a, 6a, 7a, 1b, 2b, 3b, 4b, 5b, 6b, 7b and 8 of the periodic table and/or at least one compound containing at least one of those metals, semiconductors, metalloids and rare earth metals. More specifically, such powders or particles can be those of at least one member which is selected from among B, Ti, Zr, Hf, Ta, Nb, V, SiC, TiC, ZrC, $B_4C$, WC, HfC, TaC, NbC, $Si_3N_4$, TiN, ZrN, AlN, HfN, TaN, TiB, $TiB_2$, $ZrB_2$, HfB, $HfB_2$, $LAB_6$, $MoSi_2$, BP, $Al_2O_3$, $Al_2SiO_5$ (mullite), $ZrO_2$ (PSZ: partially stabilized zirconia with $Y_2O_8$, MgO or CaO, or TZP: tetragonal zirconia polycrystalline compound), and $MgAl_2O_4$ (spinel). To take alumina as an example, a suitable example is a high-purity, easily sintrable fine feed, such as the alumina described in Unexamined Published Japanese Patent Application (kokai) Sho 63-151616 which is produced by pyrolysis of an ammonium aluminum carbonate and this is preferred since it can be densified at a temperature of about 1400° C. even by normal sintering at atmospheric pressure. Another suitable example is a fine, high-purity alumina powder that contains up to 10% by volume of magnesia (MgO) and/or titania (TiO$_x$, x=1–2) which are effective in promoting the sintering of alumina and if this condition is met, high-purity aluminas other than the alumina described in Unexamined Published Japanese Patent Application (kokai) Sho 63-151616, supra may be used, as exemplified by high-purity ($\geq$99%) and easily sintrable aluminas that are composed of fine ($\leq$1 μm) particles and which are typically produced by the Bayer process, hydrolysis of organic aluminum, pyrolysis of aluminum alum, the ethylene chlorohydrin process, submerged arc discharge, etc.

Besides the aluminas mentioned above, zirconium oxides may also be selected and advantageous examples include the easily sintrable yttria partially stabilized zirconia (2–4 mol % Y$_2$O$_3$—ZrO$_2$) powder which is produced by coprecipitation, and an alumina-zirconia base powder [FC Report, 1(5) (1983) 13–17]. Also selectable is a titanium oxide or titania powder [TiO$_2$; Summaries of Lectures Read at the 15th Symposium on High-Pressure Technology (1973) p. 174].

Another example that can be selected is titanium nitride [TIN; Yamada et al., Yogyo Kyokaishi (Journal of The Ceramic Society of Japan, 89, (1981) 621–625].

In the next place, the group of means for high dispersion treatment of particles which is adopted to prepare the coated diamond or high-pressure phase boron nitride particles is described below with reference to accompanying drawings.

Figure 2A:
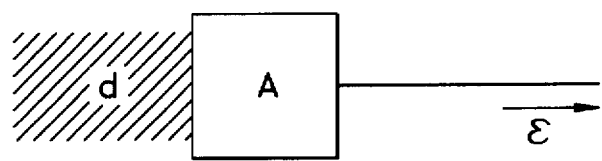
FIGS. 2a, 2b and 2c are block diagrams showing three basic arrangements of means for high dispersion treatment of particles.

Description of the Drawings of the Group of Means for High Dispersion Treatment of Particles FIG. 2a is a block diagram showing an example of the basic composition of the group of means for high dispersion treatment of particles as it is used to prepare coated diamond or high-pressure phase boron nitride particles. The group is composed of a final dispersing means A for dispersing the particles in a powder of core particles and a constituent element d of the group of means for dispersion treatment which is upstream of the final dispersing means. Shown by ε is a mixture of a gas and the particles in a powder of highly dispersed core particles which are part of the particles in the powder of core particles and which are present in a gaseous atmosphere mainly in a single-particle state. Constituent element d may be any treating means such as dispersing means, supply means, and means for selecting a mixture of a gas and the particles in a powder of highly dispersed core particles, which may be used either individually or in combination. Constituent element d is optional and may be omitted. The group of means for high dispersion treatment of particles is advantageously of such a design that after treatment by the final treating means A, one of the following values of dispersity β can be realized: (1) at least 70% for a powder of core particles that have an average diameter of no more than 10 μm in the frequency distribution by volume; (2) at least 80% for a powder of core particles that have an average diameter in excess of 10 μm but no more than 20 μm in the frequency distribution by volume; (3) at least 90% for a powder of core particles that have an average diameter in excess of 20 μm but no more than 50 μm in the frequency distribution by volume; (4) at least 95% for a powder of core particles that have an average diameter in excess of 50 μm but no more than 300 μm in the frequency distribution by volume; (5) at least 97% for a powder of core particles that have an average diameter in excess of 300 μm but no more than 800 μm in the frequency distribution by volume; and (6) at least 99% for a powder of core particles that have an average diameter in excess of 800 μm in the frequency distribution by volume.

Figure 2B:
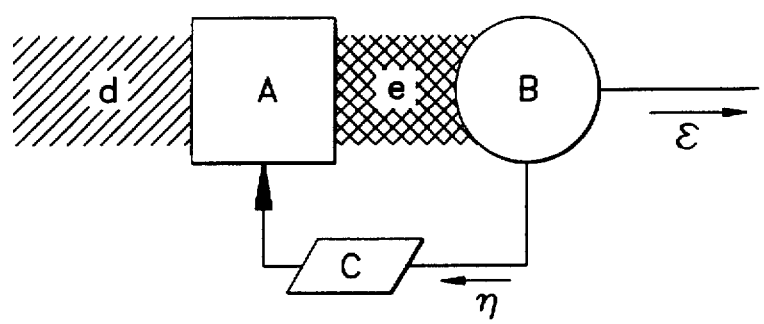

FIG. 2b is a block diagram showing a second example of the basic composition of the group of means for high dispersion treatment of particles as it is used to prepare coated diamond or high-pressure phase boron nitride particles. The group is composed of a final dispersing means A for dispersing the particles in a powder of core particles, final means B for selecting a mixture of a gas and the particles in a powder of highly dispersed core particles at the last stage which is equipped with feedback means C by which a mixture of a gas and the particles in a powder of less highly dispersed core particles η as separated from a mixture of a gas and the particles in a powder of highly dispersed core particles in which the powder particles are present in a gaseous atmosphere mainly in a single-particle state is fed back to the final dispersing means A, a constituent element d of the group of means for dispersion treatment which is upstream of the final dispersing means, and a constituent element e of the group of means for high dispersion treatment of particles which is provided between the final dispersing means and the final selecting means. As for the mixture ε and the constituent element d, the explanation made in connection with FIG. 2a will apply and, hence, no detailed description is made. Constituent element e may be any treating means other than the dispersing means, such as supply means and selecting means, which may be used either individually or in combination. Constituent elements d and e are optional and may be omitted. The group of means for high dispersion treatment of particles is advantageously of such a design that after treatment by selecting means B which is the final treating means, the above-mentioned values of dispersity can be realized for powders of core particles having the above-mentioned average diameters.

Figure 2C:
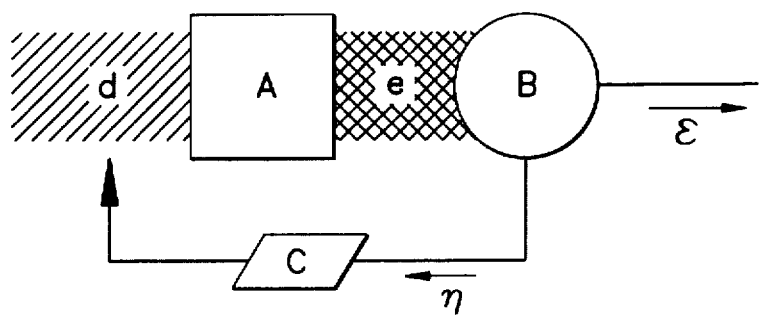

FIG. 2c is a block diagram showing a third example of the basic composition of the group for high dispersion treatment of particles as it is used to prepare coated diamond or high-pressure phase boron nitride particles. The group is composed of a final dispersing means A for dispersing the particles in a powder of core particles, final means B for selecting a mixture of a gas and the particles in a powder of highly dispersed core particles at the last stage which is equipped with feedback means C by which a mixture of a gas and the particles in a powder of less highly dispersed core particles η as separated from a mixture of a gas and the particles in a powder of highly dispersed core particles in which the powder particles are present in a gaseous atmosphere mainly in a single-particle state is fed back to a treating means upstream of the final dispersing means A, a constituent element d of the group of means for high dispersion treatment of particles which is upstream of the final dispersing means, and a constituent element e of the group of means for high dispersion treatment of particles which is provided between the final dispersing means and the final selecting means. As for the mixture ε, constituent elements d and e, and the group of means for high dispersion treatment of particles, the foregoing explanation will apply and no detailed description is made.

Having the construction described above, the group of means for high dispersion treatment of particles under discussion may include powder supply sources such as a supply vessel and core particle generating means. To take the case of FIG. 2c as an example, the group of means for high dispersion treatment of particles may of course adopt such a composition that the mixture η is fed back to a supply vessel by the feedback means C. It also goes without saying that the step of dispersion by the group of means for high dispersion treatment of particles may be preceded by a disintegrating step in which the particles in the powder of core particles are disintegrated and/or otherwise reduced in size.

Typical specific examples of these basic compositions of the group of means for high dispersion treatment of particles are described below in greater detail with reference to more detailed block diagrams.

Design 1

Figure 3A:
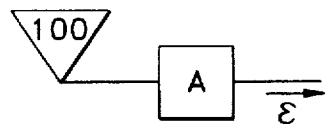
FIGS. 3a–3g are block diagrams showing in greater detail the arrangements of means for high dispersion treatment of particles.

FIG. 3a is a block diagram illustrating a first specific design of the group of means for high dispersion treatment of particles as it is used to prepare coated diamond or high-pressure phase boron nitride particles and the drawing corresponds to FIG. 2a. The group shown in FIG. 3a is composed of a supply vessel 100 for supplying the powder of core particles to be coated, and the final dispersing means A for dispersing the powder of core particles to be coated.

Design 2

Figure 3B:
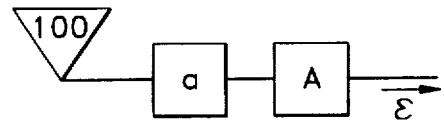

FIG. 3b is a block diagram illustrating a second specific design of the group of means for high dispersion treatment of particles as it is used to prepare coated diamond or high-pressure phase boron nitride particles and the drawing corresponds to FIG. 2a. The group shown in FIG. 3b is composed of a supply vessel 100 for supplying the powder of core particles to be coated, dispersing means a for dispersing the powder of core particles to be coated, and the final dispersing means A for dispersing the powder of core particles to be coated.

Design 3

Figure 3C:
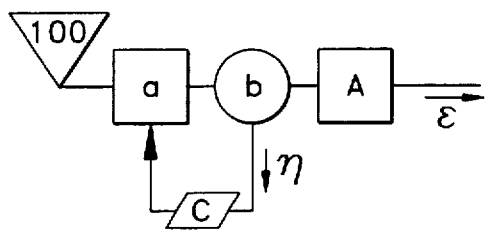

FIG. 3c is a block diagram illustrating a third specific design of the group of means for high dispersion treatment of particles as it is used to prepare coated diamond or high-pressure phase boron nitride particles and the drawing corresponds to FIG. 2a. The group shown in FIG. 3c is composed of a supply vessel 100 for supplying the powder of core particles to be coated, dispersing means a for dispersing the powder of core particles to be coated, feedback means C by which a mixture of a gas and the particles in a powder of less highly dispersed core particles η as separated from a mixture of a gas and the particles in a powder of highly dispersed core particles in which the powder particles are present in a gaseous atmosphere mainly in a single-particle state is fed back from the mixture of a gas and the particles in the powder of core particles (which have been dispersed by the dispersing means a) to the dispersing means a, means b for selecting the mixture of a gas and the particles in a powder of highly dispersed particles, by which the mixture of a gas and the particles in a powder chiefly composed of highly dispersed core particles is introduced into the final dispersing means A, and the final dispersing means A for dispersing the powder of core particles to be coated.

Design 4

Figure 3D:
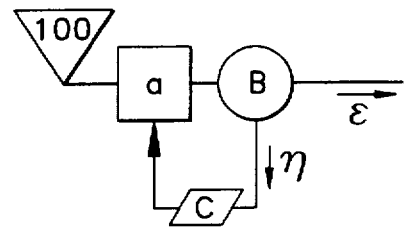

FIG. 3d is a block diagram illustrating a fourth specific design of the group of means for high dispersion treatment of particles as it is used to prepare coated diamond or high-pressure phase boron nitride particles and the drawing in FIG. 3d corresponds to FIG. 2b. The group shown in FIG. 3d is composed of a supply vessel 100 for supplying the powder of core particles to be coated, a final dispersing means A for dispersing the powder of core particles to be coated, feedback means C by which a mixture of a gas and the particles in a powder of less highly dispersed core particles η as separated from a mixture of a gas and the particles in a powder of highly dispersed particles in which the powder particles are present in a gaseous atmosphere mainly in a single-particle state is fed back from the mixture of a gas and the particles in the powder of core particles (which have been dispersed by the final dispersing means A) to the dispersing means A, and final means B for selecting the mixture of a gas and the particles in the powder of highly dispersed core particles at the final stage and which discharges the mixture of a gas and the particles in the powder of highly dispersed core particles.

Design 5

Figure 3E:
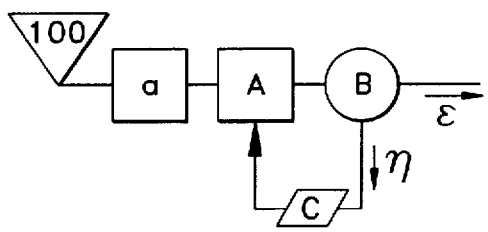

FIG. 3e is a block diagram illustrating a fifth specific design of the group of means for high dispersion treatment of particles as it is used to prepare coated diamond or high-pressure phase boron nitride particles and the drawing corresponds to FIG. 2b. The group shown in FIG. 3e is composed of a supply vessel 100 for supplying the powder of core particles to be coated, dispersing means a for dispersing the powder of core particles to be coated, a final dispersing means A for dispersing the powder of core particles to be coated, feedback means C by which a mixture of a gas and the particles in a powder of less highly dispersed core particles η as separated from a mixture of a gas and the particles in a powder of highly dispersed particles in which the powder particles are present in a gaseous atmosphere mainly in a single-particle state is fed back from the mixture of a gas and the particles in the powder of core particles (which have been dispersed by the final dispersing means A) to the dispersing means A, and final means B for selecting the mixture of a gas and the particles in the powder of highly dispersed core particles at the final stage and which discharges the mixture of a gas and the particles in the powder of highly dispersed core particles.

Design 6

Figure 3F:
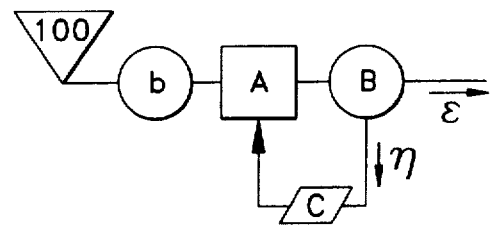

FIG. 3f is a block diagram illustrating a sixth specific design of the group of means for high dispersion treatment of particles as it is used to prepare coated diamond or high-pressure phase boron nitride particles and the drawing corresponds to FIG. 2b. The group shown in FIG. 3f is composed of a supply vessel 100 for supplying the powder of core particles to be coated, means b for selecting a mixture of a gas and the particles in a powder of highly dispersed core particles, which rejects a mixture of a gas and the particles in a powder chiefly composed of less highly dispersed core particles from the mixture of a gas and the particles in the powder of core particles and which introduces into dispersing means A the mixture of a gas and the particles in a powder chiefly composed of highly dispersed core particles, final dispersing means A for dispersing the particles in the selectively separated powder of core particles, feedback means O by which a mixture of a gas and the particles in a powder of less highly dispersed core particles as separated from a mixture of a gas and the particles in a powder of highly dispersed particles in which the powder particles are present in a gaseous atmosphere mainly in a single-particle state is fed back from the mixture of a gas and the particles in the powder of core particles (which have been dispersed by the final dispersing means A) to the dispersing means A, and final means B for selecting the mixture of a gas and the particles in the powder of highly dispersed core particles at the final stage and which discharges the mixture of a gas and the particles in the powder of highly dispersed core particles.

Design 7

Figure 3G:
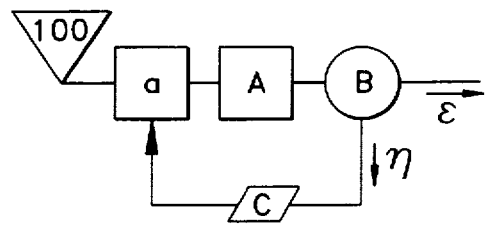

FIG. 3g is a block diagram illustrating a seventh specific design of the group of means for high dispersion treatment of particles as it is used to prepare coated diamond or high-pressure phase boron nitride particles and the drawing corresponds to FIG. 2c. The group shown in FIG. 3g is composed of a supply vessel 100 for supplying the powder of core particles to be coated, dispersing means a for dispersing the powder of core particles to be coated, a final dispersing means A for dispersing the powder of core particles to be coated, feedback means C by which a mixture of a gas and the particles in a powder of less highly dispersed core particles as separated from a mixture of a gas and the particles in a powder of highly dispersed particles in which the powder particles are present in a gaseous atmosphere mainly in a single-particle state is fed back from the mixture of a gas and the particles in the powder of core particles (which have been dispersed by the final dispersing means A) to the dispersing means A, and final means B for selecting the mixture of a gas and the particles in the powder of highly dispersed core particles at the final stage and which discharges the mixture of a gas and the particles in the powder of highly dispersed core particles.

To maintain the thus achieved high dispersive state of the particles, means for maintaining dispersion in a gaseous atmosphere may be added to the group of means for high dispersion treatment of particles. The term "means for maintaining dispersion in a gaseous atmosphere" as used herein refers to means that maintains a desired value of dispersity β by preventing reagglomeration of the particles in the powder of core particles that have been carried dispersively in a gaseous atmosphere. To promote the thus achieved high dispersive state of the core particles, means for promoting dispersion in a gaseous atmosphere may be added between the group of means for high dispersion treatment of particles and the coating chamber. The term "means for promoting dispersion in a gaseous atmosphere" as used herein refers to means which is primarily intended to promote the redispersion of that part of the particles in the powder of core particles carried dispersively in a gaseous atmosphere which have agglomerated again, thereby retarding the drop in the dispersive state of the powder; the term also refers to means that promotes redispersion in such a way that the state of dispersion that has dropped once can be restored to the initial high dispersive state.

Advantageous examples of said means for maintaining dispersion in a gaseous atmosphere or promoting dispersion in a gaseous atmosphere include a pipe vibrator, a pipe heater, a plasma generator, an electric charger, etc.

The pipe vibrator is means in which a pipe equipped with an oscillator is vibrated to provide the particles dispersed in a gaseous atmosphere with vibrations uncomparable to those imparted by dispersers, whereby reagglomeration is suppressed to maintain the high dispersive state or the dispersion of reagglomerating particles is promoted.

The pipe heater is means in which a heated pipe imparts heat to a carrier gas from outside, thereby expanding the carrier gas so that its flow velocity is accelerated to a level that is too fast to be comparable to that achieved by dispersers, whereby reagglomeration of the particles is suppressed while promoting the dispersion of reagglomerating particles.

The plasma generator is means in which a plasma is generated in the gaseous atmosphere which dispersively caries the powder of core particles, with the resulting plasma ions being allowed to impinge against the core particles, whereby reagglomeration is suppressed to maintain the high dispersive state or the dispersion of reagglomerating particles is promoted.

The electric charger is means in which corona discharge, electron beams, radiations or some other method is used to generate monopolar ions in the gaseous atmosphere which dispersively carries the powder of core particles, which are subsequently passed through the monopolar ion atmosphere to be charged to a single polarity, whereupon electrostatic repulsive forces either suppress reagglomeration to maintain the high dispersive state or promote the dispersion of reagglomerating particles.

The powder of core particles which have been rendered to assume a highly dispersive state in the manner described on the foregoing pages is sent to the coating chamber so that the surfaces of the particles are coated with the coat forming substance. The coating compartment is provided with the coating space including the coating start region.

The group of means for high dispersion treatment of particles is desirably coupled directly to the coating chamber. If necessary, they may be connected together by means of a hollow member and/or a pipe that are indispensable to transport. In this case, too, it is essential that the dispersity β in the coating start region be adjusted to one of the values within the ranges set forth hereinabove.

If the group of means for high dispersion treatment of particles is coupled to the coating chamber located separately, the powder of core particles suffices to be introduced into the coating chamber as it maintains the state of dispersion that has been achieved by said group of means for high dispersion treatment of particles. To this end, means for maintaining dispersion in a gaseous atmosphere (which is a device for maintaining the state of dispersion of the powder of core particles) and/or means for promoting dispersion in a gaseous atmosphere (which is a device for enhancing the state of dispersion) and/or means for selecting a mixture of a gas and the particles in a powder of highly dispersed particles (which separates the powder portion of less highly dispersed core particles from the mixture of a gas and the particles in the powder of core particles, thereby selecting a mixture of a gas and the particles in a powder of highly dispersed core particles, the major part of which comprises particles in a single-particle state) may be provided between the group of means for high dispersion treatment of particles and the coating chamber.

The invention also contemplates that when used to prepare coated diamond or high-pressure phase boron nitride particles, the group of means for high dispersion treatment of particles may share one or more portions of the space with (1) the coating chamber, (2) the coating space or (3) the coating start region.

For example, the group of means for high dispersion treatment of particles may share its dispersing space with the coating chamber, or with the coating space having the coating start region, or with the coating start region.

The term "coating start region" as used herein refers to the region where the precursor of the coat forming substance that has been generated via the vapor phase and/or the precursor of the coat forming substance in a vapor-phase state contacts and/or impinges against the powder of highly dispersed core particles which has been transported in the state of dispersion that has one of the following values of dispersity β, whereupon coating of the individual particles is started: (1) at least 70% for a powder of core particles that have an average diameter of no more than 10 μm in the frequency distribution by volume; (2) at least 80% for a powder of core particles that have an average diameter in excess of 10 μm but no more than 20 μm in the frequency distribution by volume; (3) at least 90% for a powder of core particles that have an average diameter in excess of 20 μm but no more than 50 μm in the frequency distribution by volume; (4) at least 95% for a powder of core particles that have an average diameter in excess of 50 μm but no more than 300 μm in the frequency distribution by volume; (5) at least 97% for a powder of core particles that have an average diameter in excess of 300 μm but no more than 800 μm in the frequency distribution by volume; and (6) at least 99% for a powder of core particles that have an average diameter in excess of 800 μm in the frequency distribution by volume. Five typical embodiments of the coating start region are shown schematically in FIGS. 4a–4e.

In FIGS. 4a–4e, the coating start region is indicated by numeral 2.

In the case shown in FIG. 4a, the coating start region 2 of the coating space in which the coating of core particles is started as they are dispersed to one of the above-listed values of dispersity β in accordance with the average diameter of those core particles is provided in such a way that it surrounds the group of means for high dispersion treatment of particles or its discharge section 1.

In the case shown in FIG. 4b, the coating start region 2 of said coating space is provided in such a way that it is passed by all the particles 4 in the powder of core particles as they are discharged from the group of means for high dispersion treatment or its discharge section 1.

By adopting these arrangements, the particles in all powders of core particles can start to be coated as they are dispersed to the above-listed values of dispersity β.

In the case shown in FIG. 4c, the coating start region 2 of said coating space is provided in such a way that it is passed in all cases by those particles 4 in the powder of core particles which are discharged from the group of means for high dispersion treatment of particles or its discharge section 1 to enter the recovery section 5.

In the case shown in FIG. 4d, the coating start region 2 of said coating space is provided in such a way that it surrounds the recovery section 5.

In the case shown in FIG. 4e, the recovery section 5 is provided in a position that can be reached solely by the particles in the mixture of a gas and the particles in the powder of highly dispersed core particles. Hence, the region indicated by 6 in FIG. 4e is selection means using gravity. The coating start region 2 of said coating space is provided in the hatched area of FIG. 4e so that it is passed in all cases by those particles in the mixture of a gas and the particles in the powder of highly dispersed core particles which enter the recovery section. This arrangement insures that only the core particles that started to be coated as they were dispersed to the above-listed values of dispersity β can be recovered and there is no chance that the core particles that did not pass through the coating start region will intermingle with the coated particles which emerge from the coating start region.

As one can understand from the foregoing description, the apparatus for implementing the present invention are composed of the group of means for high dispersion treatment of particles and the coating chamber or, alternatively, the group of means for high dispersion treatment of particles, the coating chamber and the recovery means. The constituent elements of the apparatus can be combined in various manners and several designs of these apparatus are described below with reference to drawings.

Apparatus Design 1

Figure 5A:
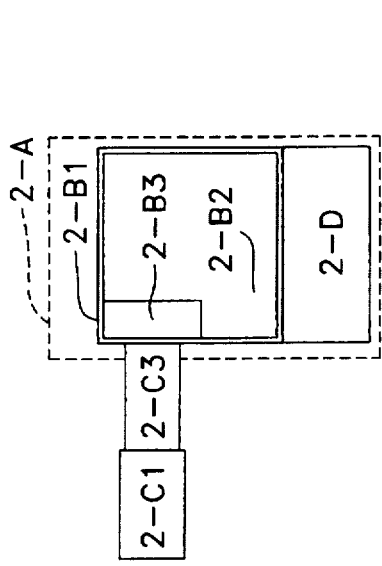
FIGS. 5a–5g are block diagrams showing the compositions of various apparatus for producing coated diamond or high-pressure phase boron nitride particles.

FIG. 5a is a block diagram showing the construction of a first apparatus for producing coated diamond or high-pressure phase boron nitride particles. As shown, the apparatus is composed of the main body of the production equipment 2-A (coating apparatus), coating chamber 2-B1, coating space 2-B2, coating start region 2-B3, the group of means for high dispersion treatment of particles 2-C1, and recovery means 2-D. The group of means for high dispersion treatment of particles 2-C1 is coupled directly to the coating chamber 2-B1.

Apparatus Design 2

Figure 5B:
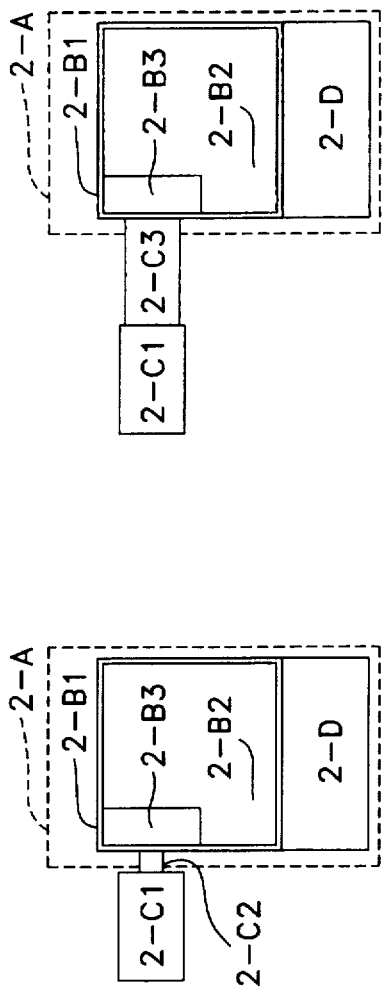

FIG. 5b is a block diagram showing the construction of a second apparatus for producing coated diamond or high-pressure phase boron nitride particles. As shown, the apparatus is composed of the main body of the production equipment 2-A (coating apparatus), coating chamber 2-B1, coating space 2-B2, coating start region 2-B3, the group of means for high dispersion treatment of particles 2-C1, indispensable hollow member 2-C2, and recovery means 2-D. The group of means for high dispersion treatment of particles 2-C1 is connected to the coating chamber 2-B1 via the indispensable hollow member 2-C2.

Apparatus Design 3

Figure 5C:
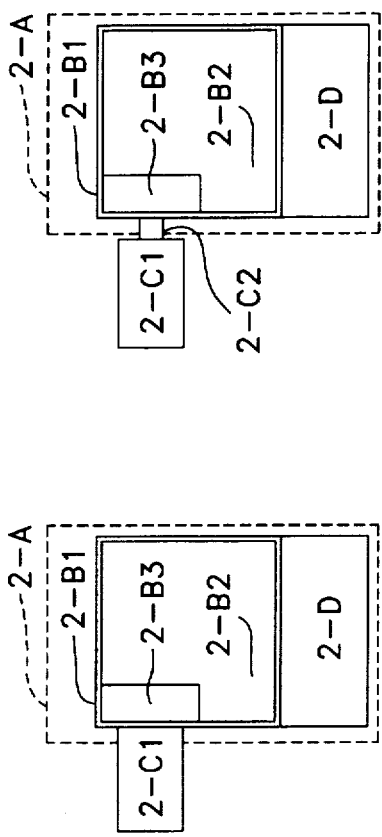

FIG. 5c is a block diagram showing the construction of a third apparatus for producing coated diamond or high-pressure phase boron nitride particles. As shown, the apparatus is composed of the main body of the production equipment 2-A (coating apparatus), coating chamber 2-B1, coating space 2-B2, coating start region 2-B3, the group of means for high dispersion treatment of particles 2-C1, means for maintaining dispersion in gaseous atmosphere 2-C3, and recovery means 2-D. The group of means for high dispersion treatment of particles 2-C1 is connected to the coating chamber 2-B1 via the means for maintaining dispersion in gaseous atmosphere 2-C3.

Apparatus Design 4

Figure 5D:
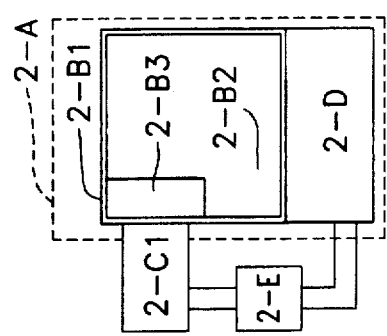

FIG. 5d is a block diagram showing the construction of a fourth apparatus for producing coated diamond or high-pressure phase boron nitride particles. As shown, the apparatus is composed of the main body of the production equipment 2-A (coating apparatus), coating chamber 2-B1, coating space 2-B2, coating start region 2-B3, the group of means for high dispersion treatment of particles 2-C1, and recovery means 2-D. The group of means for high dispersion treatment of particles 2-C1 shares space with the coating chamber 2-B1.

Apparatus Design 5

Figure 5E:
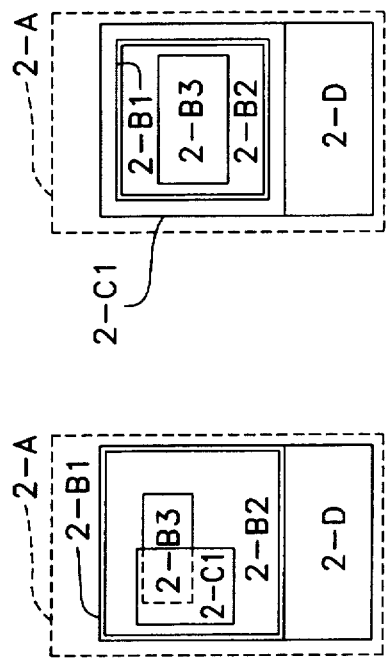

FIG. 5e is a block diagram showing the construction of a fifth apparatus for producing coated diamond or high-pressure phase boron nitride particles. As shown, the apparatus is composed of the main body of the production equipment 2-A (coating apparatus), coating chamber 2-B1, coating space 2-B2, coating start region 2-B3, the group of means for high dispersion treatment of particles 2-C1, and recovery means 2-D. The group of means for high dispersion treatment of particles 2-C1 is provided within the coating chamber 2-B1.

Apparatus Design 6

Figure 5F:
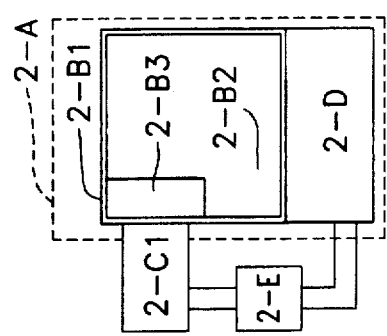

FIG. 5f is a block diagram showing the construction of a sixth apparatus for producing coated diamond or high-pressure phase boron nitride particles. As shown, the apparatus is composed of the main body of the production equipment 2-A (coating apparatus), coating chamber 2-B1, coating space 2-B2, coating start region 2-B3, the group of means for high dispersion treatment of particles 2-C1, and recovery means 2-D. The coating chamber 2-B1 is provided within the dispersing space of the group of means for high dispersion treatment of particles 2-C1.

Apparatus Design 7

Figure 5G:
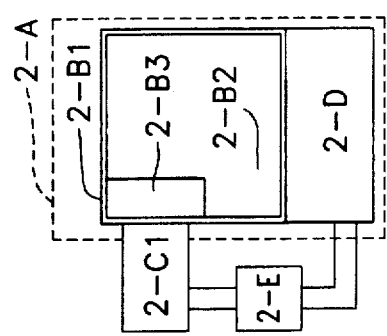

FIG. 5g is a block diagram showing the construction of a seventh apparatus for producing coated diamond or high-pressure phase boron nitride particles. As shown, the apparatus is composed of the main body of the production equipment 2-A (coating apparatus), coating chamber 2-B1, coating space 2-B2, coating start region 2-B3, the group of means for high dispersion treatment of particles 2-C1, recovery means 2-D, and recoating supply means 2-E. The coated particles issuing from the recovery means 2-D can be transported by the recoating supply means 2-E to the group of means for high dispersion treatment of particles 2-C1 for performing repeated coating treatments.

Either one of the apparatuses of these designs can produce coated diamond or high-pressure phase boron nitride particles.

The coated particles in which the powder of core particles (diamond or high-pressure phase boron nitride particles) has its surface coated with the coat forming substance may be coated again with the coat forming substance or subjected to repeated recoating operations. In these cases, the coated particles are sent to the recoating supply means. The term "recoating supply means" as used herein refers to means for transporting the coated particles to the group of means for high dispersion treatment of particles to perform recoating. Specifically, the recoating supply means is furnished with (a) means for recovering the coated particles and (b) means for transporting said coated particles from the recovery means (a) to the group of means for high dispersion treatment of particles. Alternatively, the recoating supply means is furnished with (a) means for recovering the coated particles, (b) means for transporting said coated particles from the recovery means (a) to the group of means for high dispersion treatment of particles, and (c) means for classifying the coated particles. Given large coating weights, the particle size distribution of the coated particles will vary from that of the particles in the powder of uncoated core particles. Under these conditions, it is effective to perform the recoating operation after the particle size distribution of the coated particles is adjusted by the classifying means (c).

The recoating operation may be repeated depending on the need and the coating weight of the coat forming substance can be set to a desired level. If necessary, the coating operation may be repeated with the type of the coat forming substance varied and, thus, a substance of more than one component can be coated in multiple layers as the coat forming substance.

The equipment for producing coated particles that is to be used in the present invention is in no way limited as long as it is capable of applying the coat forming substance over the surfaces of the particles in the powder of core particles by vapor-phase processes involving transition through the vapor phase. For example, chemical vapor deposition (CVD) equipment can be used, as exemplified by a thermal CVD apparatus, a plasma-assisted CVD apparatus, apparatus for CVD utilizing electromagnetic waves (i.e., visible light CVD, laser CVD, ultraviolet CVD, infrared CVD and far-infrared CVD) and a MOCVD apparatus. Alternatively, physical vapor deposition (PVD) equipment can be used, as exemplified by a vacuum evaporation apparatus, an ion sputtering apparatus and an ion plating apparatus. Stated more specifically, a suitable apparatus for producing coated particles is described in the official gazette of Unexamined Published Japanese Patent Application (kokai) Hei 3-75302, entitled "Particles Coated with Superfine Grains on the Surfaces and A Process for Producing Such Coated Particles".

As described on the foregoing pages, the process of the present invention for producing coated diamond or high-pressure phase boron nitride comprises the steps of charging into the coating space the particles in the powder of core particles which are diamond or high-pressure phase boron nitride particles and then permitting the precursor of the coat forming substance which is generated via the vapor phase and/or the precursor of the coat forming substance in a vapor-phase state to contact and/or impinge against the particles in said powder of core particles so that their surfaces are coated with the coat forming substance. Five basic processes for coating the core particles with the coat forming substance are summarized below.

I. A coating method comprising:

(A) a dispersing step in which the particles in the powder of core particles are dispersed in a gaseous atmosphere by the group of means for high dispersion treatment of particles so as to make a mixture of a gas and the particles in a powder of highly dispersed core particles; and (B) a coating step in which the core particles in said gas-particle mixture, as they have been dispersed with the dispersity $\beta$ adjusted to the values within the ranges set forth above, are allowed to contact and/or impinge against the coat forming substance in the coating start region of the coating space, thereby starting the coating operation.

II. A coating method comprising:

(A) a dispersing step in which the particles in the powder of core particles are dispersed in a gaseous atmosphere by the group of means for high dispersion treatment of particles which realize the adjustment of dispersity $\beta$ to the values within the ranges set forth above, thereby making a mixture of a gas and the particles in a powder of highly dispersed core particles; and (B) a coating step in which the core particles in said gas-particle mixture, as they have been dispersed with the dispersity $\beta$ adjusted to the values within the ranges set forth above, are allowed to contact and/or impinge against the coat forming substance in the coating start region of the coating space, thereby starting the coating operation.

III. A coating method comprising:

(A) a dispersing step in which the particles in the powder of core particles are dispersed in a gaseous atmosphere by the group of means for high dispersion treatment of particles which realize the adjustment of dispersity $\beta$ to the values within the ranges set forth above, thereby making a mixture of a gas and the particles in a powder of highly dispersed core particles;

(B) a transport step in which the highly dispersed core particles in said gas-particle mixture are transported directly to a subsequent coating step; and (C) the coating step in which the transported core particles in said gas-particle mixture, as they have been dispersed with the dispersity $\beta$ adjusted to the values within the ranges set forth above, are allowed to contact and/or impinge against the coat forming substance in the coating start region of the coating space, thereby starting the coating operation.

IV. A coating method comprising:

(A) a dispersing step in which the particles in the powder of core particles are dispersed in a gaseous atmosphere by the group of means for high dispersion treatment of particles which realize the adjustment of dispersity $\beta$ to the values within the ranges set forth above, thereby making a mixture of a gas and the particles in a powder of highly dispersed core particles;

(B) a transport step in which the highly dispersed core particles in said gas-particle mixture are transported via at least one member indispensable to transport that is selected from the group consisting of a hollow member, an intermediate member composed of a member that forms a hollow portion, and a pipe; and (C) a coating step in which the transported core particles in said gas-particle mixture, as they have been dispersed with the dispersity $\beta$ adjusted to the values within the ranges set forth above, are allowed to contact and/or impinge against the coat forming substance in the coating start region of the coating space, thereby starting the coating operation.

47

V. A coating method comprising:

(A) a dispersing step in which the particles in the powder of core particles are dispersed in a gaseous atmosphere by the group of means for high dispersion treatment of particles which realize the adjustment of dispersity β to the values within the ranges set forth above, thereby making a mixture of a gas and the particles in a powder of highly dispersed core particles;

(B) a transport step in which the highly dispersed core particles in said gas-particle mixture are transported to a subsequent coating step via at least one means selected from the group consisting of means for maintaining the dispersion in a gaseous atmosphere of the highly dispersed core particles in said gas-particle mixture, means for enhancing the dispersion in a gaseous atmosphere of the highly dispersed core particles in said gas-particle mixture, and means for separating a mixture of a gas and the particles in a powder of less highly dispersed core particles from said gas-particle mixture so as to select a mixture of a gas and the particles in a powder of highly dispersed core particles in which the core particles are present in the gaseous atmosphere mainly in a single-particle state; and (C) the coating step in which the transported particles in said mixture of a gas and the powder of highly dispersed core particles, as they have been dispersed with the dispersity β adjusted to the values within the ranges set forth above, are allowed to contact and/or impinge against the coat forming substance in the coating start region of the coating space, thereby starting the coating operation.

In each of the coating methods I–V, it is preferred that the coating start region of the coating space is located in either one of the following portions of the space region in which the dispersity β of the particles in the powder of highly dispersed core particles as mixed with a gas and which have been dispersed by the group of means for high dispersion treatment of particles is adjusted to the values within the ranges set forth above:

the space region that includes planes through which all particles in the powder of highly dispersed core particles as mixed with a gas will pass; or the space region that includes planes through which all particles to be recovered into the recovery section of the recovery means will pass.

Alternatively, in each of the coating methods 1 and II, it is preferred that at least one part of the dispersing step, in which the particles in the powder of core particles are dispersed in a gaseous atmosphere by the group of means for high dispersion treatment of particles which realize the adjustment of dispersity β to the values within the ranges set forth above, thereby making a mixture of a gas and the particles in a powder of highly dispersed core particles, is performed sharing one or more parts of the space with at least one part of the coating step.

It should be noted here that the coated diamond or high-pressure phase boron nitride particles occasionally form lumps as a result of association of several particles that contact one another via the coat forming substance on the coated particles. Thus, the powder of the coated diamond or high-pressure phase boron nitride particles consists of coated particles in a single-particle state, lumps formed by the association of from several to several tens of such discrete coated particles as a result of contacting one another, and larger lumps formed by the association of more of such discrete coated particles as a result of contacting one another, and the shapes and sizes of the particles and lumps are nonuniform and irregular. The lumps which are the associations of the discrete coated particles are preferably

48 disagglomerated and/or otherwise reduced in size before they are subjected to the shaping (molding) or sintering process. To disagglomerate and/or otherwise reduce in size the associating lumps of the coated diamond or high-pressure phase boron nitride particles, various disagglomerating means may be utilized, as exemplified by ball mills, vibrating ball mills, mortars and jet mills, etc. Alternatively, the discrete coated particles may be selectively separated from the associating lumps of such discrete coated particles, so that only the discrete coated particles can be subjected to the shaping or sintering process.

In accordance with the present invention, the thus coated diamond or high-pressure phase boron nitride particles or mixtures containing such particles are then sintered at pressures no less than 2000 MPa and at elevated temperatures, or at pressures of less than 2000 MPa and at temperatures not exceeding 1850° C. under such sintering pressure and temperature conditions that diamond or high-pressure phase boron nitride is thermodynamically metastable if not stable.

Alternatively, the coated diamond or high-pressure phase boron nitride particles are mixed with a bonding material in volume ratios of (1–90):(99–10) that is sintrable to a density of at least 85% at pressures less than 2000 MPa and at temperatures not exceeding 1850° C. under such pressure and temperature conditions that diamond or high-pressure phase boron nitride is thermodynamically metastable, and the mixture is then sintered at pressures less than 2000 MPa and at temperatures not exceeding 1850° C. under such sintering pressure and temperature conditions that diamond or high-pressure phase boron nitride is thermodynamically metastable if not stable.

If an auxiliary agent, or a substance that develops another function, is to be added, the substance may be in a powder, plate or particulate form. More specifically, the substance may be selected from among powders and/or particles, etc. that are composed of at least one member selected from the group consisting of metals, semiconductors, metalloids, and rare earth metals of groups 1a, 2a, 3a, 4a, 5a, 6a, 7a, 1b, 2b, 3b, 4b, 5b, 6b, 7b and 8 of the periodic table, as well as oxides, nitrides, carbides, oxynitrides, oxycarbides, carbonitrides, oxycarbonitrides, borides and silicides of these elements, as exemplified below:

Al, B, Si, Fe, Ni, Co, Ti, Nb, V, Zr, Hf, Ta, W, Re, Cr, Cu, Mo, TiAl, Ti$_3$Al, TiAl$_3$, TiNi, NiAl, Ni$_3$Al, SiC, B$_4$C, Cr$_3$C$_2$, TiC, ZrC, WC, W$_2$C, HfC, TaC, Ta$_2$C, NbC, VC, Mo$_2$C, Si$_3$N$_4$, TiN, ZrN, Si$_2$N$_2$O, AlN, HfN, VxN (x=1~3), NbN, TaN, Ta$_2$N, TiB, TiB$_2$, ZrB$_2$, VB, V$_3$B$_2$, VB$_2$, NbB, NbB$_2$, TaB, TAB$_2$, MoB, MOB$_2$, MOB$_4$, Mo$_2$B, WB, W$_2$B, W$_2$B$_5$, LAB$_6$, BP, B$_{13}$P$_2$, MoSi$_2$, Al$_2$O$_3$, ZrO$_2$ (PSZ: partially stabilized zirconia with the addition of Y$_2$O$_3$, MgO or CaO; or TZP: tetragonal zirconia polycrystalline compound), MgAl$_2$O$_4$ (spinel) and Al$_2$SiO$_5$ (mullite).

The auxiliary agent may be a fibrous substance. The fibrous substance to be mixed with the coated diamond or high-pressure phase boron nitride particles is composed of at least one of elemental metals and compounds and has such a morphology that the width is no more than 500 μm, with the length to width ratio being at least 2. The fibrous substance comprises bar- or rod-like substances having widths of no more than 500 μm, with the length to width ratio being at least 2, and/or filaments which are continuous fibers formed by melt spinning and/or short fibers produced by crystals themselves to give shape and/or whiskers produced by unidirectional crystal growth into a fibrous form. The whiskers comprise intrinsic whiskers which, according to the definition, are formed without experiencing any phase transition or any phenomenon such as chemical reactions that affect the overall volume and/or whiskers in the broad sense of the term which refer to single crystals that are formed as long needles by the growth of only one crystal face of the crystal that is created by a phase transition or a chemical change that affects the overall volume and/or other whiskers that are single crystals having cross-sectional areas of no more than $8\times10^{-5}$ in$^2$, with the length being at least 10 times the average diameter.

The fibrous substance to be used may be those which contain at least one compound containing at least one member of the group consisting of metals, semiconductors, metalloids, rare earth metals and nonmetals of groups 1a, 2a, 3a, 4a, 5a, 6a, 7a, 1b, 2b, 3b, 4b, 5b, 6b, 7b and 8 of the periodic table and which have widths of no more than 500 µm, with the length to width ratio being at least 2. More specifically, the fibrous substances to be used are those which are composed of at least one member selected from the group consisting of metals, semiconductors, metalloids, and rare earth metals of groups 1a, 2a, 3a, 5a, 6a, 7a, 1b, 2b, 3b, 4b and 8 of the periodic table, as well as oxides, nitrides, carbides, oxynitrides, oxycarbides, carbonitrides, oxycarbonitrides, borides and silicides and which have widths of no more than 500 µm, with the length to width ratio being at least 2. Preferably, the following fibrous substances may be selected: those which are composed of at least member one selected from the group consisting of Al, B, Si, Fe, Ni, Co, Ti, Nb, V, Zr, Hf, Ta, W, Re, Cr, Cu, Mo, TiAl, Ti$_3$Al, TiAl$_3$, TiNi, NiAl, Ni$_3$Al, SiC, B$_4$C, Cr$_3$C$_2$, TiC, ZrC, WC, W$_2$C, HfC, TaC, Ta$_2$C, NbC, VC, Mo$_2$C, Si$_3$N$_4$, TiN, ZrN, Si$_2$N$_2$O, AlN, HfN, VxN (x=1~3), NbN, TaN, Ta$_2$N, TiB, TiB$_2$, ZrB$_2$, VB, V$_3$B$_2$, VB$_2$, NbB, NbB$_2$, TaB, TAB$_2$, MoB, MOB$_2$, MOB$_4$, Mo$_2$B, WB, W$_2$B, W$_2$B$_5$, LAB$_6$, BP, B$_{13}$P$_2$, MoSi$_2$, Al$_2$O$_3$, ZrO$_2$ (PSZ: partially stabilized zirconia with the addition of Y$_2$O$_3$, MgO or CaO; or TZP: tetragonal zirconia polycrystalline compound), MgAl$_2$O$_4$ (spinel), Al$_2$SiO$_5$ (mullite), etc., and which have widths of no more than 500 µm, with the length to width ratio being at least 2.

As described above, the coated diamond or high-pressure phase boron nitride particles to be used in the present invention have their surfaces coated with the coat forming substance by vapor-phase processes and, hence, the coat forming substance that can be used is basically unlimited. While materials design of diamond or high-pressure phase boron nit ride sinters can be made in any suitable manners depending on their use, the coating of diamond or high-pressure phase boron nitride particles with the coat forming substance may be preceded by preliminary coating of the surfaces of those surfaces with a similar and/or dissimilar coat forming substance by a similar and/or dissimilar coating technique.

Take, for example, the case where the surfaces of diamond or high-pressure phase boron nitride particles are to be eventually provided with coats formed of a desired metal carbide; in this case, those particles may be preliminarily coated with carbon. While the preliminary coating technique is not limited in any particular way, suitable examples include not only the molten salt dip method which is described in Unexamined Published Japanese Patent Application (kokai) Hei 2-252660 and the molten salt disproportionation method which is described in Unexamined Published Japanese Patent Application (kokai) Hei 1-207380 but also electroplating, electroless plating, cladding, physical vapor deposition processes (e.g., sputtering and ion plating) and chemical vapor deposition processes. The metals in the metal components to be eventually coated are not limited to any particular types as long as they are within the class of substances that can be applied as bonding materials and/or sintering aids for the purpose of the invention.

The coating films formed by the molten salt dip method are composed of dense substances having high hardness and melting point and, having typically the capability of isolating diamond or high-pressure phase boron nitride particles from other substances, these films offer the advantage of markedly increasing the latitude in the choice of binders. The diamond or high-pressure phase boron nitride particles provided with coating films by the molten salt dip method are difficult to sinter densely by the conventional process for producing diamond or high-pressure phase boron nitride sinters at pressures less than 2000 MPa under such sintering pressure and temperature conditions that diamond or high-pressure phase boron nitride is thermodynamically metastable. However, if diamond or high-pressure phase boron nitride particles that are coated with the films of high-hardness and high-melting substances which have been formed by the molten salt dip method are coated by the vapor-phase coating techniques of the invention with one or more layers in suitable amounts of substances that can be applied as bonding materials that are sintrable to assure satisfactory density and high hardness, favorable results are attained that are advantageous for the purpose of promoting sintering.

In accordance with the present invention, coated diamond or high-pressure phase boron nitride particles which have the coat forming substance applied to the surfaces of bare diamond or high-pressure phase boron nitride particles by vapor-phase processes may be mixed with a bonding material or, alternatively, the mixture of the coated diamond or high-pressure phase boron nitride particles and the bonding material may be mixed with the aforementioned auxiliary substance in a powder, plate or particulate form and/or the fibrous substance also mentioned above which has a width of no more than 500 µm, with the length to width ratio being at least 2, and either mixture may be sintered in a powder form or after being shaped into a compact.

Diamond or high-pressure phase boron nitride is thermodynamically stable only at ultrahigh pressures and if the pressure is inadequate under elevated temperatures, they will experience a phase transition to the lower-pressure phase (graphite or hexagonal boron nitride (hBN)).

Therefore, in order to prevent the phase transition of diamond or high-pressure phase boron nitride to the lower-pressure phase (graphite or hBN) and to insure sintering to high density, the sinters containing diamond or high-pressure phase boron nitride are produced at ultrahigh pressures exceeding 2000 MPa and at elevated temperatures under such conditions that diamond or high-pressure phase boron nitride is thermodynamically stable.

Therefore, if one selects those sintering pressure and temperature conditions where the pressure is at least 2000 MPa and where diamond or high-pressure phase boron nitride is thermodynamically stable, the temperature is limited by pressure in accordance with the thermodynamic equilibrium line in the phase diagram of diamond or high-pressure phase boron nitride. However, if one selects those sintering pressure and temperature conditions where the pressure is at least 2000 MPa and where diamond or high-pressure phase boron nitride is thermodynamically metastable if not stable, temperatures will suffice if they deviate slightly from the region that is limited by pressure in accordance with the thermodynamic equilibrium line in the phase diagram of diamond or high-pressure phase boron nitride.

On the other hand, if one selects those sintering pressure and temperature conditions where the pressure is less than 2000 MPa and where diamond or high-pressure phase boron nitride is thermodynamically metastable if not stable, one should note that there is a pressure-dependent temperature in the region where diamond or high-pressure phase boron nitride is thermodynamically metastable.

Stated more specifically, in the case of selecting those sintering pressure and temperature conditions where diamond or high-pressure phase boron nitride is thermodynamically metastable if not stable, the upper limit of the sintering temperature will vary with the quality of the diamond or high-pressure phase boron nitride particles to be sintered.

Figure 33A:
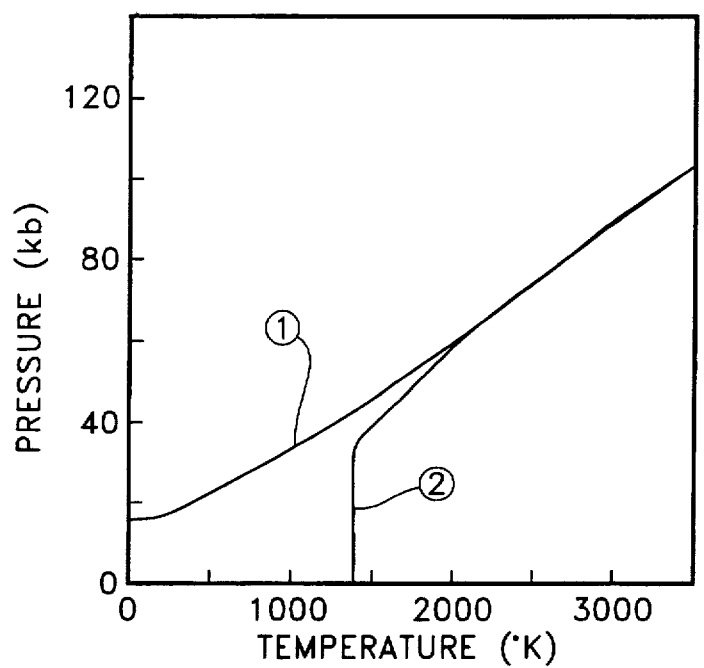
FIG. 33a is a pressure-temperature diagram showing the region where diamond is stable.
Figure 33B:
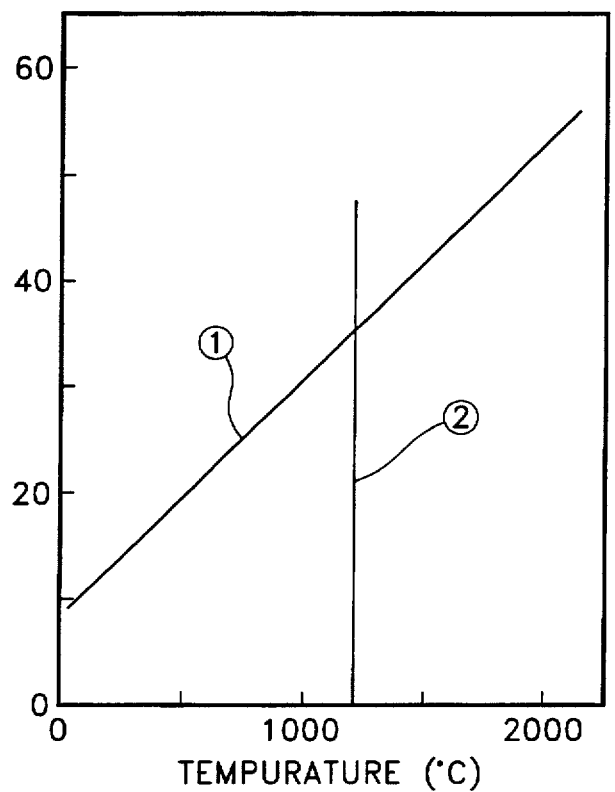
FIG. 33b is a pressure-temperature diagram showing the region where high-pressure phase boron nitride is stable.

Take, for example, the case of diamonds; Hall conducted an experiment under ultrahigh pressures and reported that when a diamond was thermodynamically metastable if not stable, it took such a long time for a phase transition to occur that it remained stable for practical purposes; he then indicated the temperature 1100° C. as the upper limit beyond which the diamond would no longer exist in a practically stable manner (see H. T. Hall, Science, 169 (1970) 868–869, as well as FIG. 15a). Speaking of high-pressure phase boron nitrides, Wakatsuki et al. conducted an experiment on a cubic boron nitride under ultrahigh pressures and reported that when the cubic boron nitride was thermodynamically metastable if not stable, it took such a long time for a phase transition to occur that it remained stable for practical purposes; they then indicated the temperature 1200° C. as the upper limit beyond which the cubic boron nitride would no longer exist in a practically stable manner (see Wakatsuki, Ichise, Aoki and Maeda, Abstracts of the Lectures Read at the 14th Symposium on High-Pressure Technology (1972) p. 78, as well as FIG. 33b).

Therefore, if high-purity diamonds (e.g. natural products of high quality synthetic diamonds produced via the vapor phase by means of PVD or CVD processes, or diamonds synthesized by application of ultrahigh pressures over a long time) are especially selected and if they are sintered either by HIP, optionally under ultrahigh pressures, as they are confined within a degassed, pressure-transmitting capsule or by PC or HP under vacuum or in an inert gas, diamonds will actually exist up to 1850° C. which is much higher than 1100° C., or the temperature reported by Hall, even if they are not in a thermodynamically stable state. However, if the temperature exceeds 1850° C., the diamonds will turn to the graphite phase in a short time. Generally speaking, synthesis catalysts or the like will sometimes remain as impurities in synthetic diamonds. However, if synthetic diamonds are such that impurities have been removed positively to achieve high purity, the diamond will exist up to 1700° C. by application of similar sintering techniques and this is the same as in the case of natural diamonds. Alternatively, with known diamonds that do not contain fine grains smaller than 1 μm, preferably those which are at least 3 μm and whose size is within the class contemplated by the present invention, the diamond will exist up to 1600° C. irrespective of whether they are natural or synthetic products. It should also be noted that in the case of known diamonds of comparatively high purity, both natural and synthetic products will exist up to 1500° C. However, with commonly known types of synthetic diamonds, the suitable temperature is up to 1400° C. Therefore, the upper limit of sintering temperatures is 1850° C.

Speaking of high-pressure phase boron nitrides, if those of high purity (e.g. cubic boron nitrides of ultrahigh purity that are produced via the vapor phase by means of PVD or CVD processes, or cubic boron nitrides of ultrahigh purity that are synthesized by application of ultrahigh pressures over a long time) are especially selected and if they are sintered either by HIP (hot isostatic pressing), optionally under ultrahigh pressures, as they are confined within a degassed, pressure-transmitting capsule or by PC (piston-cylinder) or HP (hot pressing) under vacuum or in an inert gas, cubic boron nitrides will actually exist up to 1850° C. which is much higher than 1200° C., or the temperature reported by Wakatsuki et al:, even if they are not in a thermodynamically stable state. However, if the temperature exceeds 1850° C., the cubic boron nitrides will turn to a graphitic phase in a short time. If conventionally known cubic boron nitrides are used after impurities have been removed positively to achieve high purity, the cubic boron nitride will exist up to 1700° C. by application of similar sintering techniques. Alternatively, with known cubic boron nitrides that do not contain fine grains, preferably those which are at least 3 μm in size, the cubic boron nitride will exist up to 1600° C. by application of similar sintering techniques. It should also be noted that in the case of known cubic boron nitrides of comparatively high purity, the cubic boron nitride will exist up to 1500° C. by application of similar sintering techniques. However, in the case where commonly known types of cubic boron nitrides or wurtzitic boron nitrides are contained, the suitable temperature is up to 1400° C.

Consequently, if one selects those sintering pressure and temperature conditions where the pressure is less than 2000 MPa and where diamond or high-pressure phase boron nitride is thermodynamically metastable if not stable, the upper limit of sintering temperatures is 1850° C. It should be remembered that the temperature at which the diamond or high-pressure phase boron nitride is not in a thermodynamically stable state but exists stably for practical purposes varies with the quality of the diamond or high-pressure phase boron nitride to be used and that, therefore, the sintering temperature must be set in accordance with the quality of the feed of diamond or high-pressure phase boron nitride. If it is necessary that the sintering temperature be set to a value that is close to the right temperature which matches the quality of the feed of diamond or high-pressure phase boron nitride, said sintering temperature must be controlled with close tolerance.

The diamond or high-pressure phase boron nitride sinters of the present invention are produced by sintering processes that adopt two kinds of conditions with different pressures. To produce diamond or high-pressure phase boron nitride sinters by performing sintering for a suitable period of time at ultrahigh pressures of 2000 MPa or above and at elevated temperatures, any conventional equipment that produces ultrahigh pressures can be applied without particular limitations, as exemplified by the cubic, tetragonal, girdle, and belt type ultrahigh pressure apparatus.

Known apparatus and methods may be applied without any particular limitations to produce dynamic ultrahigh pressures (≧2000 MPa) and elevated temperatures and they include: an explosive charge lens (planar explosion generator)_, a cylindrical explosion generator, a method involving collision with a flying object, a magnetic implosion method, a Mach explosion method, an excessive explosion method, a conical implosion method, a single-action shock gun, a double-action light gas gun, etc. According to these apparatus and methods which generate dynamic ultrahigh pressures and elevated temperatures, the pressure that can be produced is at least 10 GPa (10,000 MPa), preferably at least 40 GPa and, therefore, they can be selected as preferred examples in cases where particularly high pressures need be exerted for short periods of time.

Depending on the object, for example, in the case where samples need be pressurized while giving results with good reproducibility, the above-mentioned cubic apparatus and various other types of equipment that are capable of generating ultrahigh temperatures in a static manner may be used to produce pressures of 2000 MPa and above. The sintering temperature condition may deviate slightly from the region where diamond or high-pressure phase boron nitride is thermodynamically stable.

But, more preferably, one may select those sintering pressure and temperature conditions where the pressure is at least 2000 MPa and where diamond or high-pressure phase boron nitride is thermodynamically stable.

To produce diamond or high-pressure phase boron nitride sinters by performing sintering for a suitable period of time at pressures less than 2000 MPa and at temperatures not exceeding 1850° C. under such sintering pressure and temperature conditions that diamond or high-pressure phase boron nitride is thermodynamically metastable if not stable, any conventional equipment can be applied without particular limitations, as exemplified by PC (piston-cylinder) type ultrahigh pressure apparatus, ultrahigh pressure HIP (hot isostatic pressing) apparatus, HIP apparatus and HP (hot pressing) apparatus.

If the PC type ultrahigh pressure apparatus is to be used, pressures less than 2000 MPa may be applied but, considering the durability of this apparatus, the pressure does not preferably exceed 1500 MPa. Conventionally known technologies concerning the production of pressures include ultrahigh pressure HIP apparatus which is capable of operating at HIP pressures up to 1000 MPa, as well as HIP apparatus (excluding the ultrahigh pressure HIP apparatus) and HP apparatus which are each capable of operating at pressures up to 200 MPa.

The diamond or high-pressure phase boron nitride sinters produced by the methods described above have high performance with highly controlled microstructures. While their most common use is as machine parts, it is possible to manufacture diamond or high-pressure phase boron nitride sinters that are superhard, with the Vickers hardness (Hv) being preferably at least 600, and which are dense, with the density being at least 85%. Preferably, it is possible to manufacture diamond or high-pressure phase boron nitride sinters that are superhard, with the Vickers hardness (Hv) being preferably at least 800, and/or which are dense, with the density being at least 90%. More preferably, considering the application to highly wear-resistant machine parts, superhard (Hv≧1000) diamond or high-pressure phase boron nitride sinters can be manufactured by both increasing the relative content of diamond or high-pressure phase boron nitride and sintering to high density. For use in tools and other applications that require even higher levels of wear resistance, diamond or high-pressure phase boron nitride sinters having Vickers hardness values of at least 2000 can be manufactured by further increasing the content of diamond or high-pressure phase boron nitride while sintering to high density.

In a typical case, a diamond sinter may be produced from a diamond powder feed in the following manner using a cubic apparatus to produce ultrahigh pressures. First, the particles in the diamond powder are coated with a suitable coat forming substance on the surfaces. The coated diamond particles are then shaped into a pellet by stamping. The pellet is surrounded by a shaped hexagonal boron nitride (h-BN) part which, in turn, is enclosed with a graphite tubular heater. Provided around the heater as a solid pressure transmitting medium is pyrophyllite from which the water of crystallization has been removed by heat treatment at 700° C. The sample thus prepared is placed in the cubic apparatus; the pressure is increased to a predetermined level and, then, the temperature is also elevated to a predetermined level and sintering is effected for a suitable time. Thereafter, the temperature is lowered and the pressure is also reduced. The pressure-transmitting medium is taken out of the cubic ultrahigh pressure apparatus and the sample is then recovered from the medium. In this way, one can produce a diamond sinter of high performance that is composed of diamond and which is characteristic in that it has a controlled distribution of the bonding material and/or sintering aid and/or surface modifier, that is uniform and dense, and that it has a highly controlled microstructure.

As described in detail on the foregoing pages, a powder of fine diamond or high-pressure phase boron nitride core particles having an average diameter of no more than 10 µm in terms of frequency distribution by volume was dispersed in a gaseous atmosphere and the core particles thus dispersed to a dispersity β of at least 70% were allowed to contact or impinge against a precursor of a coat forming substance, whereby the core particles were covered on their surfaces with the coat forming substance in a single-particle state. In accordance with the invention, the thus coated core particles or mixtures containing them were sintered at ultrahigh atmospheres of at least 2000 MPa and at elevated temperatures, whereby coated diamond or high-pressure phase boron nitride sinters of high performance were produced that had uniform, dense, firmly sintered and highly controlled microstructures.

According to another aspect of the invention, said core particles or mixtures containing them or mixtures of said core particles with bonding materials are sintered at pressures less than 2000 MPa and at temperatures not exceeding 1850° C. under such sintering pressure and temperature conditions that diamond or high-pressure phase boron nitride is thermodynamically metastable if not stable, whereby one can produce coated diamond or high-pressure phase boron nitride sinters of high performance that have uniform, dense, firmly sintered and highly controlled microstructures. This offers the advantage of eliminating the constraint of the need to use equipment capable of creating ultrahigh pressures of at least 2000 MPa. It should be particularly noted that the use of ultrahigh pressure HIP apparatus or other types of HIP apparatus offers the added advantage of enabling the production of complexly shaped sinters, thereby presenting significant benefits to manufacture on an industrial scale.

According to yet another aspect of the invention, even pseudo-fine diamond or high-pressure phase boron nitride particles having an average diameter greater than 10 µm in terms of frequency distribution by volume may be covered with coat forming substances after being dispersed to a dispersity as determined by their average diameter. By sintering the thus coated pseudo-fine particles, one can produce sinters that are substantially free from graphite or a graphitic phase and which have the same features as fine-particulate sinters having an average particle diameter of no more than 10 µm.

EXAMPLES

The diamond or high-pressure phase boron nitride sinters of the present invention, as well as the processes for their production are described below with reference to examples.

EXAMPLE 1

Diamond particles having an average diameter ($D_M$) of 1 µm and a frequency distribution by volume of ($[D_M/2, 3D_M/2]$, ≧90%) were coated with elemental silicon.

Figure 6:
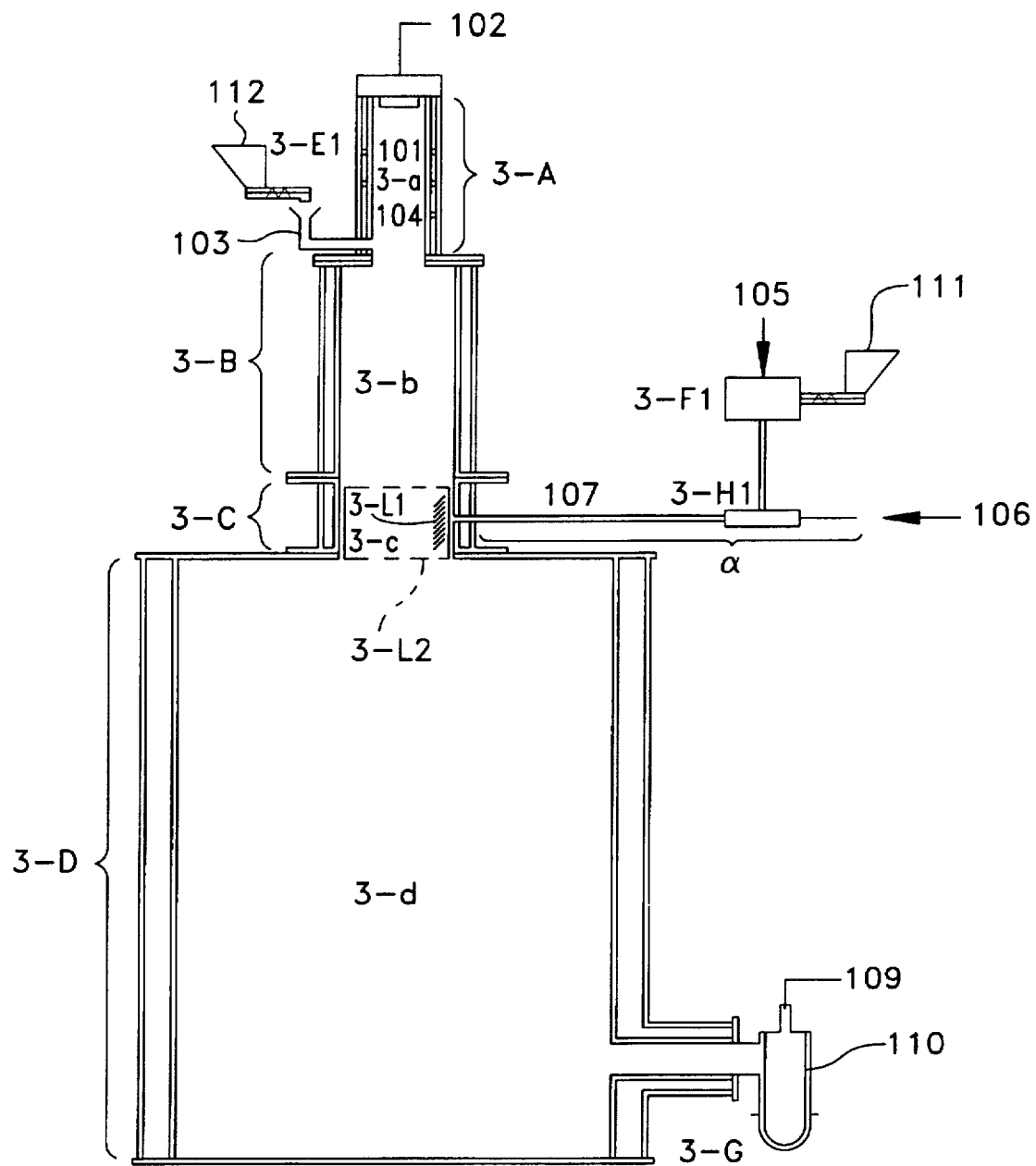
FIG. 6 is a diagram showing the apparatus used in Example 1.
Figure 7:
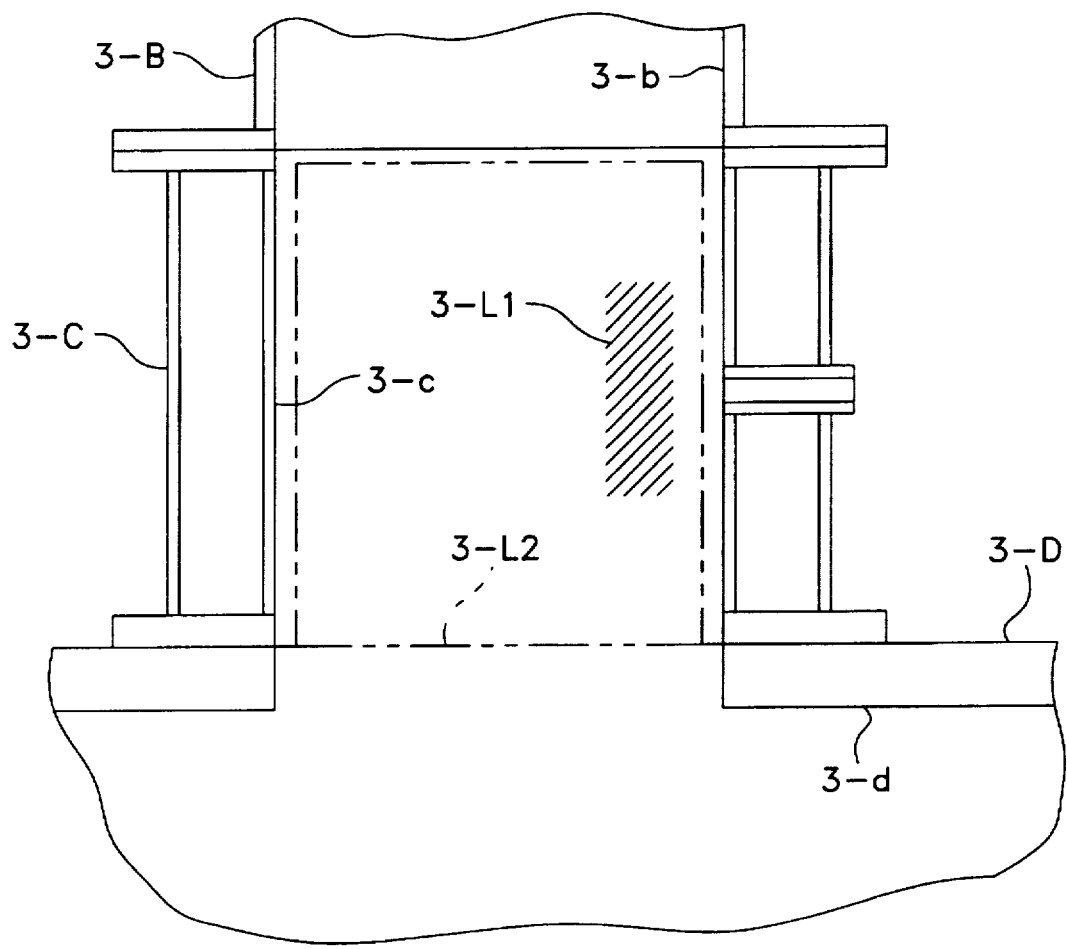
FIG. 7 is a partial enlarged view of the apparatus used in Example 1.

The construction of the apparatus used is shown in FIG. 6 and FIG. 7 which is a partial enlarged view of FIG. 6; the apparatus is a specific example of the design shown in FIG. 5a.

As shown, the apparatus comprises: a plasma torch 3-A including a plasma chamber 3-a, a vessel 3-B for cooling a coat forming substance precursor generating chamber 3-b, a coating chamber cooling vessel 3-C in the narrow sense of the term, a coating chamber 3-c in the narrow sense of the term, a vessel 3-D for cooling a coated particle cooling chamber 3-d, a supply unit 3-El on the side where the feed of the coat forming substance is supplied, an agitating disperser 3-F1 and an ejector-type disperser 3-H1 which are on the side where a powder of core particles is supplied, a capillary disperser 107, and a coated particle recovery section 3-G. The supply unit 3-El is coupled to a feeder 112 equipped with a vessel for supplying the feed powder of the coat forming substance, and the agitating disperser 3-F1 is coupled to a feeder 111 equipped with a vessel for supplying the powder of core particles. According to the definition, the coating chamber used in Example 1 is composed of the plasma chamber 3-a, the coat forming substance precursor generating chamber 3-b, the coating chamber 3-c in the narrow sense of the term, and the coated particle cooling chamber 3-d. These make up the coating chamber in the broad sense of the term and the chamber 3-c where most part of the coating operation is performed is referred to as the "coating chamber in the narrow sense of the term".

The group of means for high dispersion treatment of particles α used in Example 1 is composed of the feeder 111 equipped with a supply vessel, agitating disperser 3-F1, ejector-type disperser 3-H1, and the capillary disperser 107 which is made of a stainless steel pipe having an inside diameter of 4 mm. The basic concept of the group is shown in FIG. 2a and it is a specific example of the group of means for high dispersion treatment of particles that is of the design shown in FIG. 3b. The group is designed in such a way that it can realize an output value β of at least 70% ($\beta \geq 70\%$) given the particles in a powder of diamond core particles that are characterized by ([$D_M/5, 5D_M$], $\geq 90\%$) where $D_M=1$ μm. The capillary disperser 107 which is the final means of treatment in the group of means for high dispersion treatment of particles is coupled directly to the coating chamber 3-c and designed in such a way as to realize $\beta \geq 70\%$ in the coating start region 3-L1 of the coating space 3-L2.

A gas jet port 101 is provided on top of the plasma torch 3-A and an argon gas is supplied from a supply source 102 through this port at a rate of 20 L/min. The supplied argon gas is turned into a plasma by applied high-frequency waves, thereby forming a plasma flame in the plasma chamber 3-a within the plasma torch 3-A.

A silicon powder comprising particles with an average diameter of 10 μm serves as the feed of the coat forming substance and is supplied from the feeder 112 equipped with a vessel for supplying the feed powder of the coat forming substance. The supplied silicon powder is carried by a carrier gas 103 flowing at a rate of 5 L/min so that it is introduced into the plasma flame at a rate of 0.2 g/min via an inlet 104 provided at the bottom of the plasma torch 3-A. Being evaporated by the heat of the plasma flame, the silicon powder goes through the vapor phase to become the precursor of the coat forming substance in the precursor generating chamber 3-b.

The diamond core particles with an average diameter of 1 μm are supplied at a rate of 1.2 g/min from the feeder 111 equipped with a supply vessel of the core particles and they are dispersed with the agitating disperser 3-F1 while being carried by a carrier gas 105 that is supplied at a rate of 5 L/min. The particles are then dispersed to a dispersity (β) of 82% by means of the ejector-type disperser 3-H1 and the capillary disperser 107 with the aid of a dispersing gas 106 that is supplied at a flow rate of 10 L/min. The thusly dispersed core particles are introduced into the coating chamber.

The highly dispersed diamond particles entering the coating start region 3-L1 of the coating space 3-L2 start to contact and/or impinge against the precursor of the coat forming substance as they maintain the dispersity β at 82%.

Thus, the diamond particles are given the coat of the coat forming substance on their surfaces and they descend down the coated particle cooling chamber 3-d together with the gas, eventually reaching the recovery section 3-G. The product comprising the coated particles is separated from the gas 109 by means of a filter 110 and collected for recovery.

Figure 8:
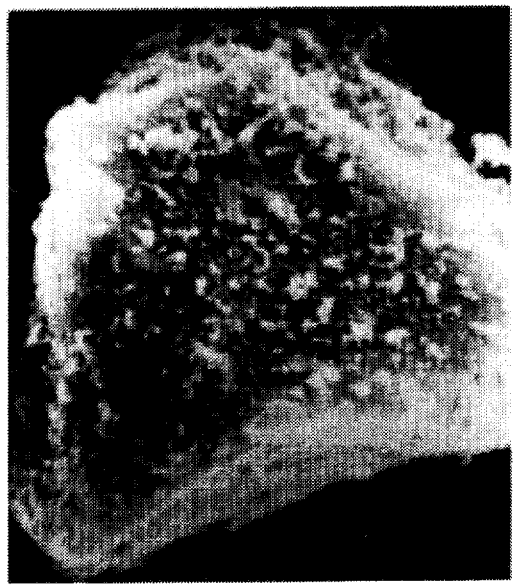
FIG. 8 is a scanning electron micrograph showing one of the coated diamond particles produced in Example 1.

The recovered fine diamond particles having silicon coats on the surfaces were examined with a scanning electron microscope. As FIG. 8 shows, all of these particles were uniformly coated with superfine silicon particles of about 0.005 μm in size. The silicon coating weight was 20% by volume.

The resulting powder of diamond particles coated with 20 vol % silicon was stamped into a pellet having an outside diameter of 6 mm and a height of 2 mm. The pellet was buried in a pressure-transmitting medium surrounded by a shaped hexagonal boron nitride (h-BN) and it was vacuum-dried overnight at 200° C. and at $10^{-3}$ torr to remove low-boiling impurities. The pellet was then set in a cubic ultrahigh pressure apparatus: the pressure was raised to 5.5 GPa at room temperature, then the temperature was elevated to 1450° C., which was held for 30 min; thereafter, the temperature was lowered and the pressure reduced.

The resulting sinter was examined by X-ray diffractiometry; the elemental silicon reacted with the diamond to change to both diamond and SiC while the elemental silicon disappeared. Quantification by X-ray analysis showed that the volume proportions of the diamond sinter and SiC were about 78% and 22%, respectively.

The surface of the sinter was polished with a diamond paste and its Vickers microhardness (Hv) was measured. The diamond sinter synthesized in Example 1 was superhard with the Hv (0.5/10) being about 12,000 and this value was comparable to or higher than that of a commercial cutting tool made of sintered diamond. Furthermore, the hardness of the sinter of Example 1 was uniform over the entire surface subjected to the hardness measurement and it was substantially free from variations.

Figure 9:
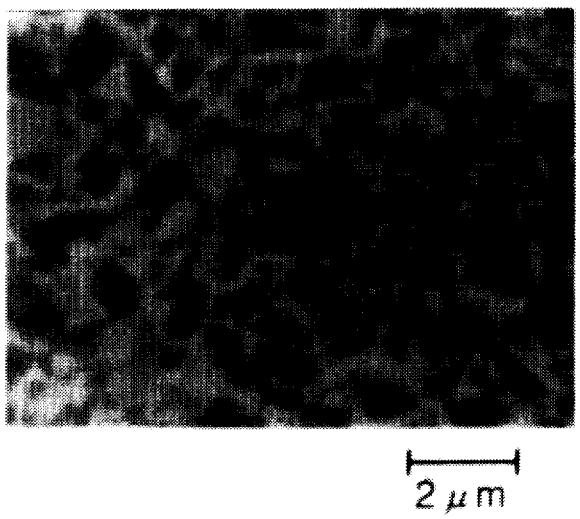
FIG. 9 is an electron micrograph showing a polished surface of the sinter produced in Example 1.
Figure 10:
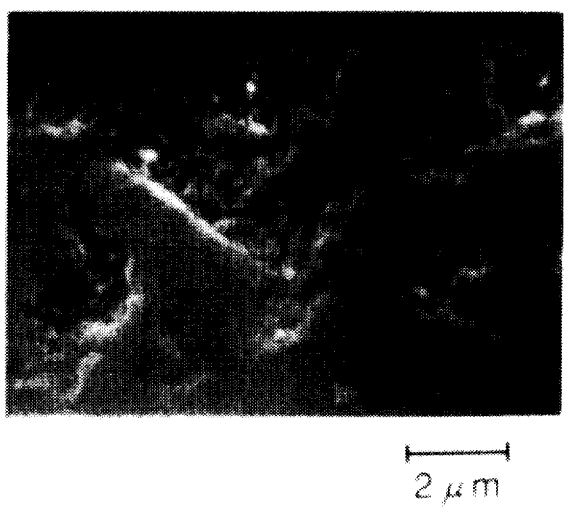
FIG. 10 is an electron micrograph showing a polished surface of a commercial sintered diamond tool.

The polished surface of the sinter resulting of the example 1 was coated with a gold film by a customary evaporation technique and examined with an electron microscope. The result is shown in the FIG. 9 electron micrograph (X5000), from which one can see that the sinter had a relative density of at least 99%. In addition, the sinter had no portion left unsintered. In areas where diamond particles contacted each other via a thin layer of the coat forming substance, the latter was bursted by the contiguous diamond particles, which hence were coupled directly as a result of sintering. In all other areas, SiC was distributed to surround the diamond particles, rendering the sinter to be characteristic in that it was dense, uniform and had the bonding material distributed provide a highly controlled microstructure. It should also be noted that the diamond particles in the sinter did not grow at all compared to the particles in the feed powder and that the coating on the diamond was formed by chemical reaction between the diamond and the elemental silicon which served as the coat forming substance; these facts combined together to offer the characteristic feature that the diamond particles in the sinter were finer than those in the feed although they were coated with silicon. This is very favorable and, hence, ideal for the mechanical characteristics of the sinter. The differences can be clearly seen by comparing FIG. 9 with FIG. 10 which is an electron micrograph (X5000) of a polished surface of the above-mentioned commercial cutting tool that was made of sintered diamond and which was coated with a gold film by a customary evaporation technique for examination. Obviously, the bonding material and the sintering aid were distributed irregularly in the diamond sinter of the commercial cutting tool to form lumps in certain areas. On the other hand, the number of areas that were devoid of the necessary sintering aid and bonding material was by no means small and unsintered portions were found there. Another major difference from the sinter of Example 1 was that every diamond particle in the cutting tool was coarse.

Diamond is the most difficult to sinter of all substances that exist on the earth. In spite of this fact, the coated particles in a diamond powder that were synthesized in Example 1 in accordance with the invention behaved as if they were comparatively easy-to-sinter particles under industrially feasible ultrahigh pressures and elevated temperatures, thereby forming a dense, rigid and superhard structure.

EXAMPLE 2

Cubic boron nitride particles having an average diameter ($D_M$) of 1 μm and a frequency distribution by volume of ($[D_M/2, 3D_M/2]$, $\geq 90\%$) were coated with alumina.

Figure 11:
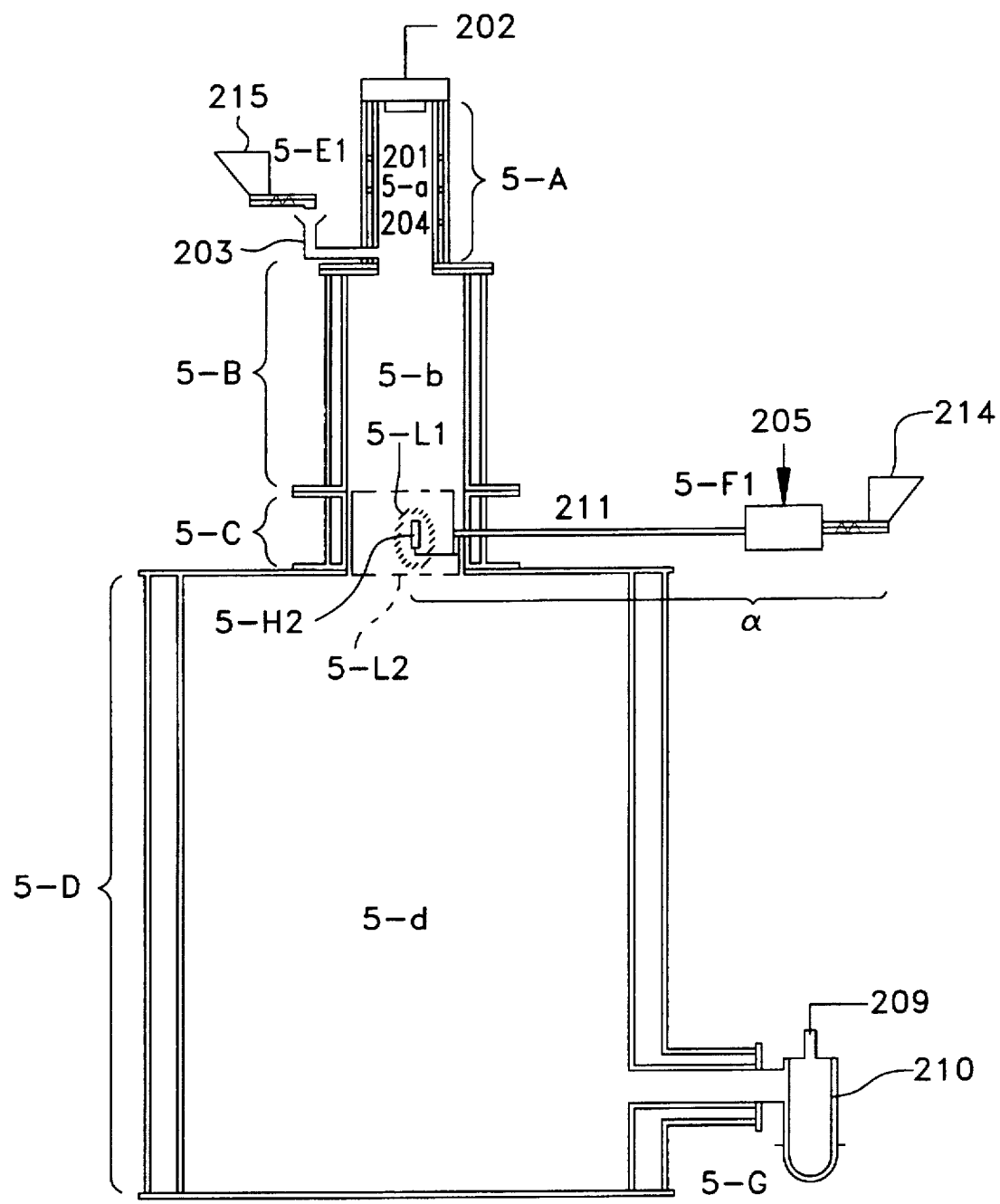
FIG. 11 is a diagram showing the apparatus used in Example 2.
Figure 12:
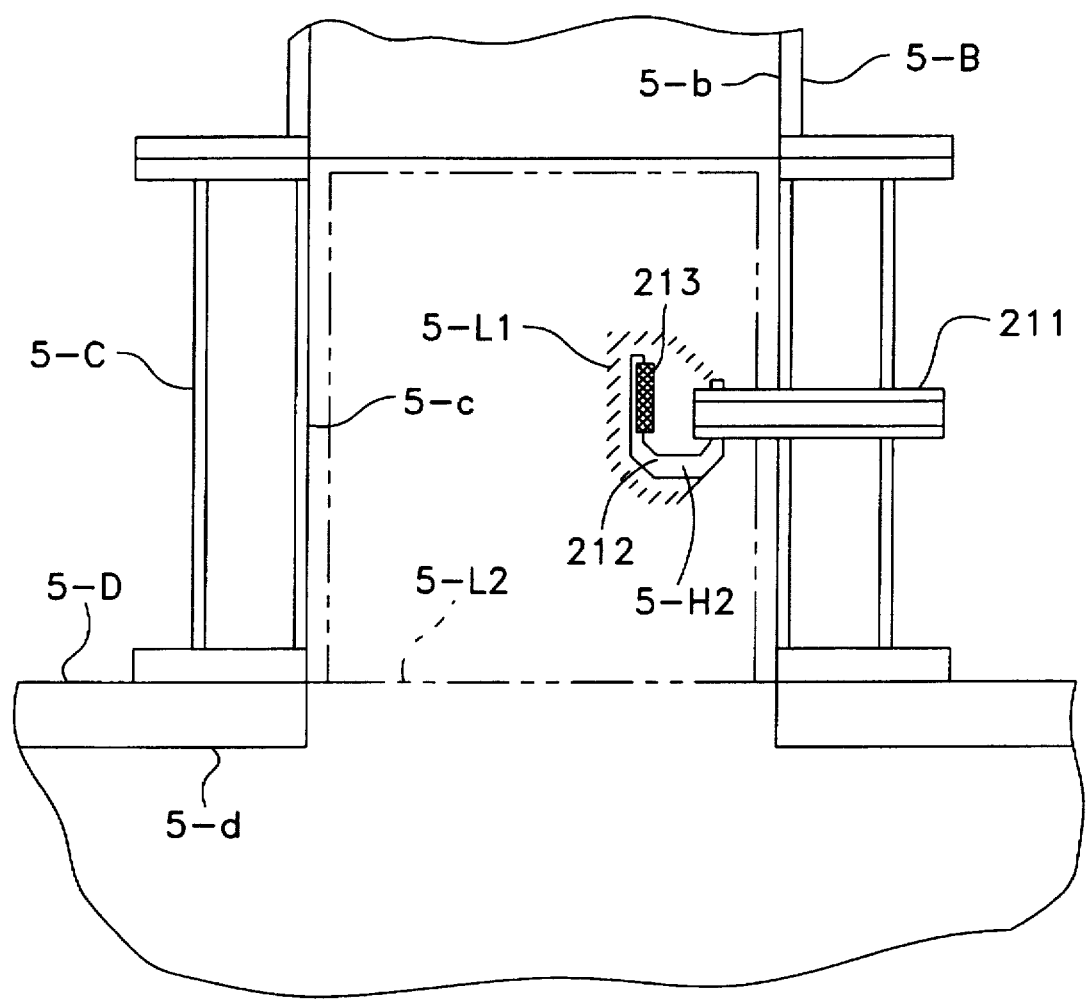
FIG. 12 is a partial enlarged view of the apparatus used in Example 2.

The construction of the apparatus used is shown in FIG. 11 and FIG. 12 which is a partial enlarged view of FIG. 11; the apparatus is a specific example of the design shown in FIG. 5d.

As shown, the apparatus comprises: a plasma torch 5-A including a plasma chamber 5-a, a vessel 5-B for cooling a coat forming substance precursor generating chamber 5-b, a coating chamber cooling vessel 5-C in the narrow sense of the term, a coating chamber 5-c in the narrow sense of the term, a vessel 5-D for cooling a coated particle cooling chamber 5-d, a supply unit 5-E1 on the side where the feed of the coat forming substance is supplied, an agitating disperser 5-F1 which is on the side where a powder of core particles is supplied, a capillary disperser 211 and a disperser 5-H2 that utilizes an impingement plate, and a coated particle recovery section 5-G. That part of this apparatus which was to generate the precursor of the coat forming substance was of the same design as in Example 1. The group of means for high dispersion treatment of particles α was composed of a feeder 214 equipped with a supply vessel, the agitating disperser 5-F1, the capillary disperser 211, and the disperser 5-H2 that utilizes an impingement plate. The basic concept of the group α is shown in FIG. 2a and it is a specific example of the group of means for high dispersion treatment of particles that is of the design shown in FIG. 3b. The capillary disperser 211 is made of a stainless steel pipe having an inside diameter of 4 mm. The disperser 5-H2 is the final means of treatment in the group of means for high dispersion treatment of particles α and it consists of a SiC impingement plate 213 supported by a stainless steel holder 212. The disperser 5-H2 is contained in the coating chamber 5-c in the narrow sense of the term, which shares the space with the group of means for high dispersion treatment of particles α. A coating space 5-L1 and the coating start region 5-L2 of the coating space are also contained in the coating chamber 5-c in the narrow sense of the term. The group of means α in the apparatus of Example 2 has such performance that the particles in a powder of core particles having an average diameter ($D_M$) of 1 μm and a frequency distribution by volume of ($[D_M/5, 5D_M]$, $\geq 90\%$) can be dispersed to a dispersity ($\beta$) of at least 70% ($\beta \geq 70\%$) right after impingement against the plate 213 in the disperser 5-H2 at the last stage of dispersion treatment. Therefore, coating of the core particles starts with the dispersity $\beta$ held at 70% and above.

A gas jet port 201 is provided on top of the plasma torch 5-A and an argon gas is supplied from a supply source 202 through this port at a rate of 20 L/min. The supplied argon gas is turned into a plasma by applied high-frequency waves, thereby forming a plasma flame in a plasma chamber 5-a within the plasma torch 5-A.

An alumina powder comprising particles with an average diameter of 2 μm serves as the feed of the coat forming substance and is supplied at a rate of 1.0 g/min from a feeder 215 equipped with a vessel for supplying the feed powder of the coat forming substance. The supplied alumina powder is carried by a carrier gas 203 flowing at a rate of 5 L/min so that it is introduced into the plasma flame via an inlet 204 of the feed of the coat forming substance provided at the bottom of the plasma torch 5-A. Being evaporated by the heat of the plasma flame, the alumina powder goes through the vapor phase to become the precursor of the coat forming substance in a coat forming substance precursor generating chamber 5-b.

The core particles of cubic boron nitride are supplied at a rate of 0.7 g/min from the feeder 214 equipped with a vessel for supplying the powder of core particles and they are dispersed with the agitating disperser 5-F1 while being carried by a carrier gas 205 that is supplied at a rate of 20 L/min. The particles then pass through the capillary disperser 211 to enter the disperser 5-H2 with the impingement plate in the coating chamber, in which they are dispersed in a gaseous atmosphere to a dispersity ($\beta$) of 82%.

The highly dispersed core particles of cubic boron nitride, entering the coating start region 5-L1 of the coating space 5-L2 start to contact and/or impinge against the precursor of the coat forming substance as they maintain the dispersity $\beta$ of 82%.

Thus, the cubic boron nitride particles are given the coat of the coat forming substance on their surfaces and they descend down a coated particle cooling chamber 5-d together with the gas, eventually reaching a coated particle recovery section 5-G. The product comprising the coated cubic boron nitride particles is separated from the gas 209 by means of a filter 210 and collected for recovery. The recovered cubic boron nitride particles had alumina coats in an amount of 50% by volume.

The recovered fine cubic boron nitride particles having alumina coats on their surfaces were examined with a scanning electron microscope. All of those particles were uniformly coated with superfine alumina particles of about 0.005 μm in size.

The resulting cubic boron nitride particles with 50 vol % alumina were stamped into a pellet having a diameter of 8 mm and a thickness of 5 mm. The pellet was put into a Pyrex glass capsule of generally the same design as in Example 1 and sealed after degassing by heating.

Thereafter, the encapsulated pellet was set in a ultrahigh pressure HIP apparatus and sintered by holding at a temperature of 1200° C. and at a pressure of 1000 MPa for 3 h.

The sinter of Example 2 was checked for its crystalline phase by powder X-ray diffraction and no diffraction peaks were observed except for the cubic boron nitride and α-form alumina.

As Table 4 shows, the sinter was considerably dense, with a density of 95 8%, and at the same time it was superhard, with the Vickers microhardness being Hv (0.5/10)=3750.

It should also be mentioned that the cubic boron nitride particles in the sinter were surrounded by alumina to provide a uniform distribution and a highly controlled microstructure.

EXAMPLE 3

Quasi-fine diamond particles having an average diameter (DM) of 17 μm and a frequency distribution by volume of ([DM/2, 3DM/2], ≧90%) were coated with metallic zirconium.

Figure 13:
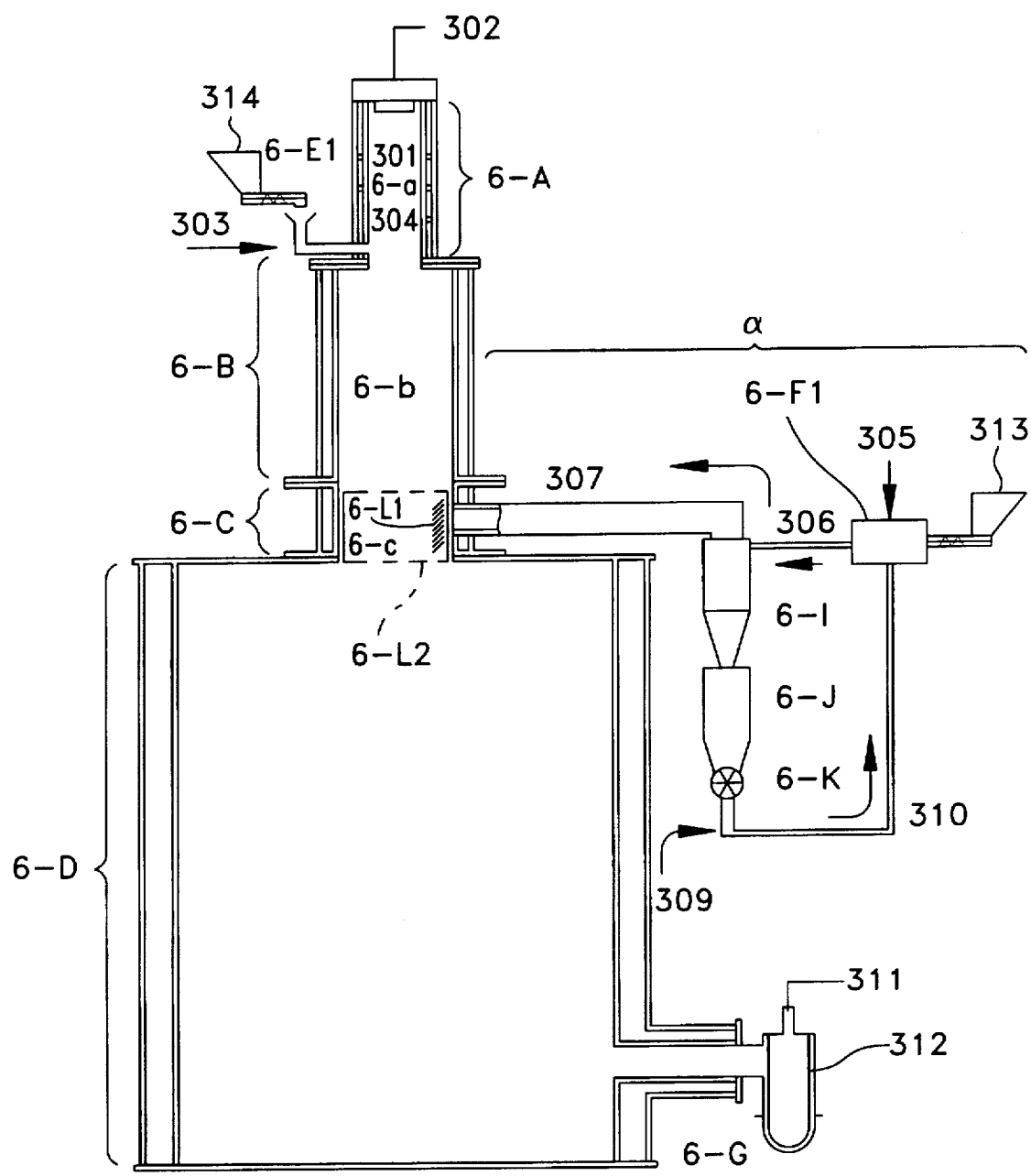
FIG. 13 is a diagram showing the apparatus used in Example 3.
Figure 14:
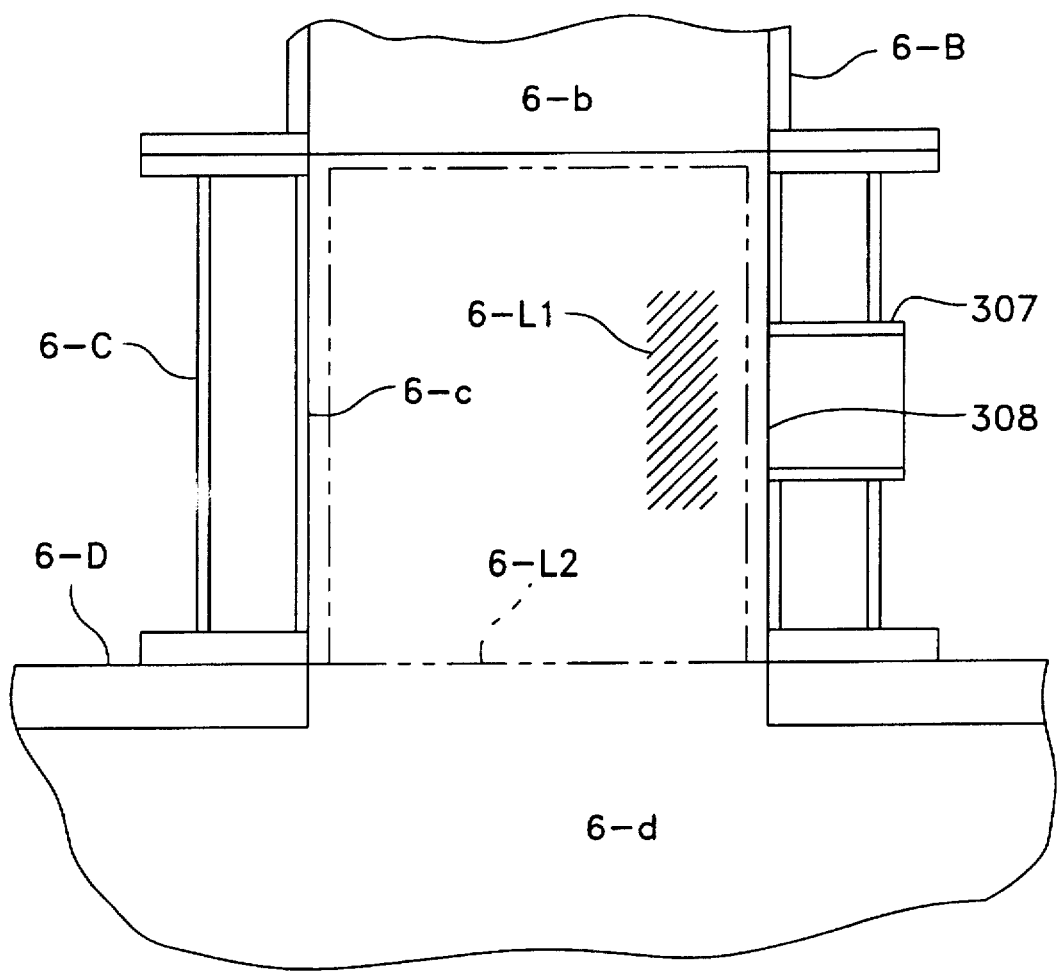
FIG. 14 is a partial enlarged view of the apparatus used in Example 3.

The construction of the apparatus used is shown in FIG. 13 and FIG. 14 which is a partial enlarged view of FIG. 13; the apparatus is a specific example of the design shown in FIG. 5b.

As shown, the apparatus comprises: a plasma torch 6-A including a plasma chamber 6-a, a vessel 6-B for cooling a coat forming substance precursor generating chamber 6-b, a coating chamber cooling vessel 6-C in the narrow sense of the term, a coating chamber 6-c in the narrow sense of the term, a vessel 6-D for cooling a coated particle cooling chamber 6-d, a supply unit 6-E1 on the side where the feed of the coat forming substance is supplied, an agitating disperser 6-F1, a cyclone 6-I, a hopper 6-J and a rotary value 6-K which are on the side where a powder of core particles is supplied, a pipe 307 inevitable to transport, and a coated particle recovery section 6-G. That part of this apparatus which was to generate the precursor of the coat forming substance was of the same design as in Example 1. The group of means for high dispersion treatment of particles α was composed of a feeder 313 equipped with a supply vessel, the agitating disperse 6-F1 which is dispersing means, and the cyclone 6-I which is means for selecting a mixture of a gas and the particles in a powder of highly dispersed core particles. The basic concept of the group α is shown in the FIG. 2b block diagram. The section of cyclone 6-I discharging the mixture of a gas and the particles in a powder of highly dispersed core particles is connected to the coating chamber 6-c in the narrow sense of the term by means of the pipe 307 inevitable to transport, whereas the section of cyclone 6-I discharging the powder portion consisting of less highly dispersed core particles is connected to the agitating disperser 6-F1 by means of a transport pipe 310 via the hopper 6-J and the rotary valve 6-K. Using the group of means α in the apparatus of Example 3, the particles in a powder of core particles having an average (DM) of 17 μm and a frequency distribution by volume of ([DM/5, 5DM], ≧90%) can be dispersed to a dispersity (β) of at least 85% in the section of cyclone 6-I (i.e., the means of final treatment) discharging the powder stream of highly dispersed particles. As shown, the coating space 6-L2 and the coating start region 6-L1 of this coating space are contained in the coating chamber 6-c in the narrow sense of the term. Because of the constraint by the flange portion coupling a coating chamber cooling vessel 6-C in the narrow sense of the term with the vessel 6-D for cooling the coated particle cooling chamber 6-d, the pipe 307 was indispensable to transport, but the resulting drop in dispersity β could be held at a reduced level. Hence, coating of the core particles starts with the dispersity β held at 80% and above in the coating start region.

A gas jet port 301 is provided on top of the plasma torch 6-A and an argon gas is supplied from a supply vessel 302 through this port at a rate of 20 L/min. The supplied argon gas is turned into a plasma by applied high-frequency waves, thereby forming a plasma flame in the plasma chamber 6-a within the plasma torch 6-A.

A zirconium powder serving as the feed of the coat forming substance is supplied at a rate of 0.5 g/min from a feeder 314 equipped with a vessel for supplying the feed powder of the coat forming substance. The supplied zirconia powder is carried by a carrier gas 303 flowing at a rate of 5 L/min so that it is introduced into the plasma flame via an inlet 304 the feed of the coat forming substance provided at the bottom of the plasma torch 6-A. Being evaporated by the heat of the plasma flame, the zirconia powder goes through the vapor phase to become the precursor of the coat forming substance in the coat forming substance precursor generating chamber 6-b.

Diamond core particles are supplied at a rate of 2.0 g/min from the feeder 313 equipped with a vessel for supplying the powder of core particles and they are dispersed with the agitating disperser 6-F1 while being carried by a carrier gas 305 that is supplied at a rate of 15 L/min. The particles then pass through a pipe 306 and thence enter the cyclone 6-I. The cyclone 6-I is adjusted in such a way that the fines produced will have a maximum particle diameter of 20 μm; a mixture of the gas and the particles in a powder of highly dispersed (β=92%) core particles which are mostly single particles passes through the pipe 307 which is indispensable to transport, so that it is discharged into the coating chamber 6-c in the narrow sense of the term via a discharge port 308. On the other hand, the powder portion consisting of less highly dispersed core particles which have been selectively separated by cyclone 6-I passes through hopper 6-J and rotary valve 6-K to be transported through a pipe 310 by a carrier gas 309 flowing at a rate of 10 L/min so that it is fed back to the agitating disperser 6-Fl.

The highly dispersed diamond particles entering the coating start region 6-L1 of the coating space 6-L2 start to contact and/or impinge against the precursor of the coat forming substance as they maintain the dispersity (β) of 89%.

Thus, the diamond particles are given the coat of the coat forming substance on their surfaces and they descend down a coated particle cooling chamber 6-d together with the gas, eventually reaching a coated particle recovery section 6-G. The product comprising the coated diamond particles is separated from the gas 311 by means of a filter 312 and collected for recovery.

The recovered diamond particles having zirconium coats on the surfaces were examined with a scanning electron microscope. All of these particles were uniformly coated with superfine zirconium particles of about 0.005 μm in size. The zirconium coating weight was 10% by volume.

To provide a bonding material for binding the resulting zirconium-coated diamond particles, another lot of diamond particles were coated with titanium carbide under generally the same conditions as those used to produce the zirconium-coated diamond particles, thereby producing a coated diamond powder in which fine diamond particles of diameters ranging from 0.5 to 2 μm (average diameter=1 μm) were coated with 15 vol % of titanium carbide. Thirty percent by volume of the previously prepared zirconium-coated diamond particles were wet mixed in acetone with seventy percent by volume of the thus prepared titanium carbide coated diamond particles. The mixture was stamped to a pellet having an outside diameter of 6 mm and a height of 2 mm. The pellet was buried in a pressure-transmitting medium surrounded by a shaped hexagonal boron nitride (h-BN) part and it was vacuum-dried overnight at 200° C. and at $10^{-3}$ torr to remove low-boiling impurities. The pellet was then set in a cubic ultrahigh pressure apparatus; the pressure was raised to 5.5 GPa at room temperature, then the temperature was elevated to 1450° C., which was held for 30 min; thereafter, the temperature was lowered and the pressure reduced.

The resulting sinter was examined by X-ray diffractiometry and only diamond, zirconium carbide and titanium carbide were found in it. The sinter was dense with a relative density of at least 99%. Quantification by X-ray analysis showed that the volume proportions of diamond, zirconium carbide and titanium carbide were about 86%, 3% and 11%, respectively.

The sinter was dense and rigid, forming a very highly controlled microstructure.

EXAMPLE 4

Coated diamond particles were prepared by coating the bare diamond particles of Example 1 with various coat forming substances using apparatus of the same types as used in Examples 1–3. The names of the coat forming substances used to prepare the coated diamond particles and their coating weights (relative proportions by vol %), as well as the specific types of the apparatus used and the conditions for their use (coating operation) are shown in Table 1 together with the data for Example 1.

The coated diamond particles thus obtained were examined with a scanning electron microscope. All of the particles prepared in Runs 4-1 and 4-2 were uniformly covered with superfine particles of coat forming substances in sizes of about 0.005 μm.

The apparatus used in Run 4-1 was of the same type as used in Example 2; a metallic zirconium powder having an average diameter of 12 μm was supplied as a feed of coat forming substance from the feeder 215 at a rate of 0.6 g/min, and the core diamond particles were supplied from the feeder 214 at a rate of 1.2 g/min. The other conditions in Run 4-1 were the same as in Example 2.

The apparatus used in Run 4-2 was of the same type as used in Example 3; the group of means for high dispersion treatment of particles in this apparatus was to treat core diamond particles having an average diameter $D_M$ of 1 μm and a distribution by volume of ($[D_M/5, 5D_M]$, ≧90%), so the particles in the powder of core particles could be dispersed to a dispersity of 75% or more ($\beta \geq 75\%$) at the discharge section of cyclone 6-I, making it possible to start the coating operation at a dispersity of 70% or more ($\beta \geq 70\%$) in the coating start region. In Run 4-2, a metallic titanium powder was supplied as a feed of coating forming substance from the feeder 314 at a rate of 0.6 g/min and the core diamond particles were supplied from the feeder 313 at a rate of 1.2 g/min; the cyclone 6-1 was adjusted in such a way that the fines produced would have a maximum particle diameter of 1.5 μm and the dispersity that could be attained in the discharge section was 85% ($\beta=85\%$) whereas the dispersity attainable in the coating start region was 82% ($\beta=82\%$); the other conditions in Run 4-2 were the same as in Example 3.

The apparatus used in Runs 4-7 and 4-8 were both of the same type as used in Example 1 and operated under generally the same conditions as in Example 1 except that aluminum and metallic nickel were deposited in that order to give a total coating weight of 15% in Run 4-7 as calculated for NiAl (Al to Ni molar ratio being 1:1) and 20% in Run 4-8 for $Ni_3Al$ (Al to Ni molar ratio being 1:3).

The thus prepared powders of coated diamond particles or mixtures thereof with silicon carbide whiskers (addition aids) were shaped as in Example 1 and set in a cubic ultrahigh pressure apparatus; the pressure was raised to 5.5 GPa at room temperature, then the temperature was elevated to 1450°–1460° C. which was held for 30 min; thereafter, the temperature was lowered and the pressure reduced.

In Runs 4-9 and 4-10, 30% by volume of the titanium carbide and silicon carbide coated diamond particles prepared in Runs 4-4 and 4-6, respectively, were wet mixed in acetone with 10% by volume of silicon carbide whiskers as a fibrous substance (SiC; width=0.5 μm; average length=30 μm) and subsequently vacuum dried to produce dry blends.

Each of the sinters thus produced was entirely free from pores, could be densified to a relative density of 100% and had no portion left unsintered. As in Example 1, the surfaces of the sinters were polished with a diamond paste and their Vickers microhardness Hv (0.5/10) values were measured. The results are shown in Table 1 together with the sintering conditions including the data for Example 1.

The crystalline phases of the sinters were examined by powder X-ray diffraction. In Run 4-1, only diamond and ZrC were observed and quantification by X-ray analysis showed that the volume proportions of diamond and ZrC were about 78% and 22%, respectively. In Run 4-2, only diamond and TiC were observed and quantification by X-ray analysis showed that the volume proportions of diamond and TiC were about 76% and 24%. In Runs 4-3 to 4-8, only diamond and the coat forming substances used (TIC, TiC, SiC, SiC, NiAl and $Ni_3Al$, respectively) were observed; in Run 4-9, only diamond and TiC were observed in addition to SiC; in Run 4-10, only diamond and SiC were observed.

All of the sinters thus produced were superhard, dense, uniform and had a uniform distribution of bonding materials to establish highly controlled microstructures. In particular, the composite sinters produced in Runs 4-9 and 4-10 had highly controlled microstructures in which the TiC bonding material (Run 4-9) or SiC bonding material (Run 4-10) and the SiC whiskers were dispersed uniformly between coated diamond particles.

TABLE 1

| Run No. | Relative Proportions (vol %) | | | | Coating Apparatus | Coating Conditions (Approximate) Ex. or | Sintering Conditions | | | Sinter | | |
|---|---|---|---|---|---|---|---|---|---|---|---|---|
| | Core Particle | Coat Forming Substance | | Whisker | | | Pressure | Temperature | Time | Sinter | Density | Hardness |
| | Diamond | Name | Amount | SiC | Ex. No. | Run No. | GPa | °C | min | apparatus | % | Hv |
| 1 | 80 | Si | 20 | — | 1 | 1 | 5.5 | 1450 | 30 | CB | ≧99 | 12000 |
| 4-1 | 80 | Zr | 20 | — | 2 | 4-1 | 5.5 | 1450 | 30 | CB | 100 | 11000 |
| 4-2 | 80 | Ti | 20 | — | 3 | 4-2 | 5.5 | 1450 | 30 | CB | 100 | 11500 |
| 4-3 | 85 | TiC | 15 | — | 1 | 1 | 5.5 | 1460 | 30 | CB | 100 | 12000 |
| 4-4 | 80 | TiC | 20 | — | 1 | 4-3 | 5.5 | 1460 | 30 | CB | 100 | 11000 |
| 4-5 | 80 | SiC | 20 | — | 1 | 4-4 | 5.5 | 1450 | 30 | CB | 100 | 12000 |
| 4-6 | 70 | SiC | 30 | — | 2 | 4-5 | 5.5 | 1450 | 30 | CB | 100 | 11000 |
| 4-7 | 85 | NiAl | 15 | — | 1 | 1 | 5.5 | 1450 | 30 | CB | 100 | 8900 |
| 4-8 | 80 | Ni$_3$Al | 20 | — | 1 | 4-7 | 5.5 | 1450 | 30 | CB | 100 | 6700 |
| 4-9 | 72 | TiC | 18 | 10 | 1 | 4-4 | 5.5 | 1460 | 30 | CB | 100 | 9800 |
| 4-10 | 72 | SiC | 18 | 10 | 1 | 4-6 | 5.5 | 1450 | 30 | CB | 100 | 9400 |

CB: Cubic ultrahigh pressure apparatus

EXAMPLE 5

Using apparatus of the same types as used in Examples 1–3, high-pressure phase boron nitride powder particles, or cubic boron nitride (cBN) particles of the same type as used in Example 2 that had an average diameter ($D_M$) of 1 μm and a frequency distribution by volume of ([$D_M/2$, $3D_M/2$], ≧90%) were covered with various coat forming substances. The names of the coat forming substances used to prepare the coated cubic boron nitride particles and their coating weights (relative proportions by vol %), as well as the specific types of the coating apparatus used and the conditions for their use (generally the same) are shown in Table 2.

The apparatus used in Run 5-1 was of the same type as used in Example 1; a metallic zirconium powder having an average diameter of 12 μm was supplied as a feed of coat forming substance from the feeder 112 at a rate of 0.6 g/min, and the cubic boron nitride core particles were supplied from the feeder 111 at a rate of 1.2 g/min. The other conditions in Run 5-1 were the same as in Example 1. The apparatus used in Run 5-2 was of the same type as used in Example 2; a metallic titanium powder having an average diameter of 25 μm was supplied as a feed of coat forming substance at a rate of 0.4 g/min whereas the core particles were supplied at a rate of 1.2 g/min; the other conditions in Run 5-2 were the same as in Example 2.

The apparatus used in Run 5-3 was of the same type as used in Example 3. Notwithstanding the difference in the core particles used (diamond or cubic boron nitride), the values of dispersity (β) attained in the discharge section of cyclone 6-I and in the coating start region were the same as in Run 4-2 and titanium nitride as a feed of coat forming substance was supplied at a rate of 0.6 g/rain whereas the core particles were supplied at a rate of 2.0 g/min. The other conditions in Run 5-3 were the same as in Example 3.

Figure 15:
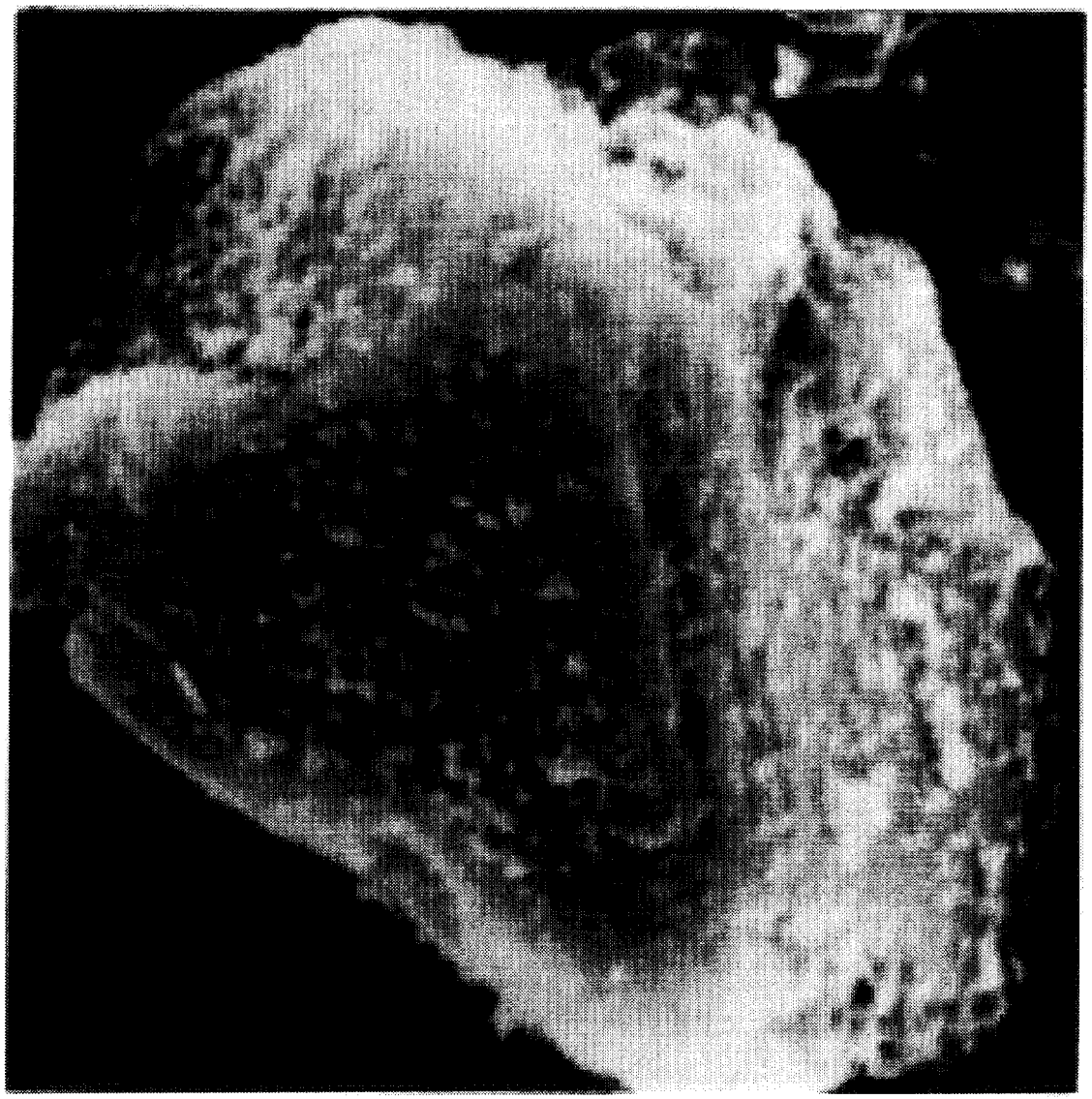
FIG. 15 is a scanning electron micrograph showing one of the coated cubic boron nitride particles produced in Example 5-1.

The coated cubic boron nitride particles thus prepared were examined with a scanning electron microscope. All of the particles prepared in Runs 5-1 to 5-3 were uniformly covered with superfine particles (ca. 0.005 μm) of coat forming substances as FIG. 15 shows (particularly for the case of Run 5-1).

The coating with NiAl in Run 5-14 and with Ni$_3$Al in Run 5-13, as well as the production of mixtures with SiC whiskers in Runs 5-15 and 5-16 were performed as in Runs 4-7 to 4-10, respectively.

The thus prepared powders of coated cubic boron nitride particles or mixtures thereof with SiC whiskers were shaped as in Example 1 and set in a cubic ultrahigh pressure apparatus; the pressure was raised to 5.1–5.6 GPa at room temperature, then the temperature was elevated to 1450°–1500° C., which was held for 30 min; thereafter the temperature was lowered and the pressure reduced.

Each of the thus produced sinters was entirely free from pores, could be densified to a relative density of 100% and had no portion left unsintered. As in Example 1, the surfaces of the sinters were polished with a diamond paste and their Vickers microhardness Hv (0.5/10) values were measured. The results are shown in Table 2 together with the sintering conditions.

The crystalline phases of the sinters were examined by powder X-ray diffraction. In Run 5-1, Zr reacted with the cubic boron nitride, whereupon metallic Zr disappeared, changing to cubic boron nitride, ZrN and ZrB$_2$ which were found to be present in respective volume proportions of about 77%, 14% and 9% according to quantification by X-ray analysis. In the sinter of Run 5-2, only cubic boron nitride, TiN and TiB$_2$ were observed and their respective volume proportions were about 74%, 15% and 11%. In Runs 5-3 to 5-14, only the cubic boron nit ride and the coating forming substances used (TIN, TiN, AlN, AlN, α- and β-Si$_3$N$_4$, α- and β-Si$_3$N$_4$, α-Al$_2$O$_3$, α-Al$_2$O$_3$, Co, Co, Ni$_3$Al and NiAl, respectively) were observed; in Runs 5-15 and 5-16, only TiN and α- and β-Si$_3$N$_4$, respectively, were observed in addition to the aid SiC and the cubic boron nitride core particles. It should be noted that the sinter produced in Run 5-11 and 5-12 were entirely free from the pool of metallic Co.

Figure 16:
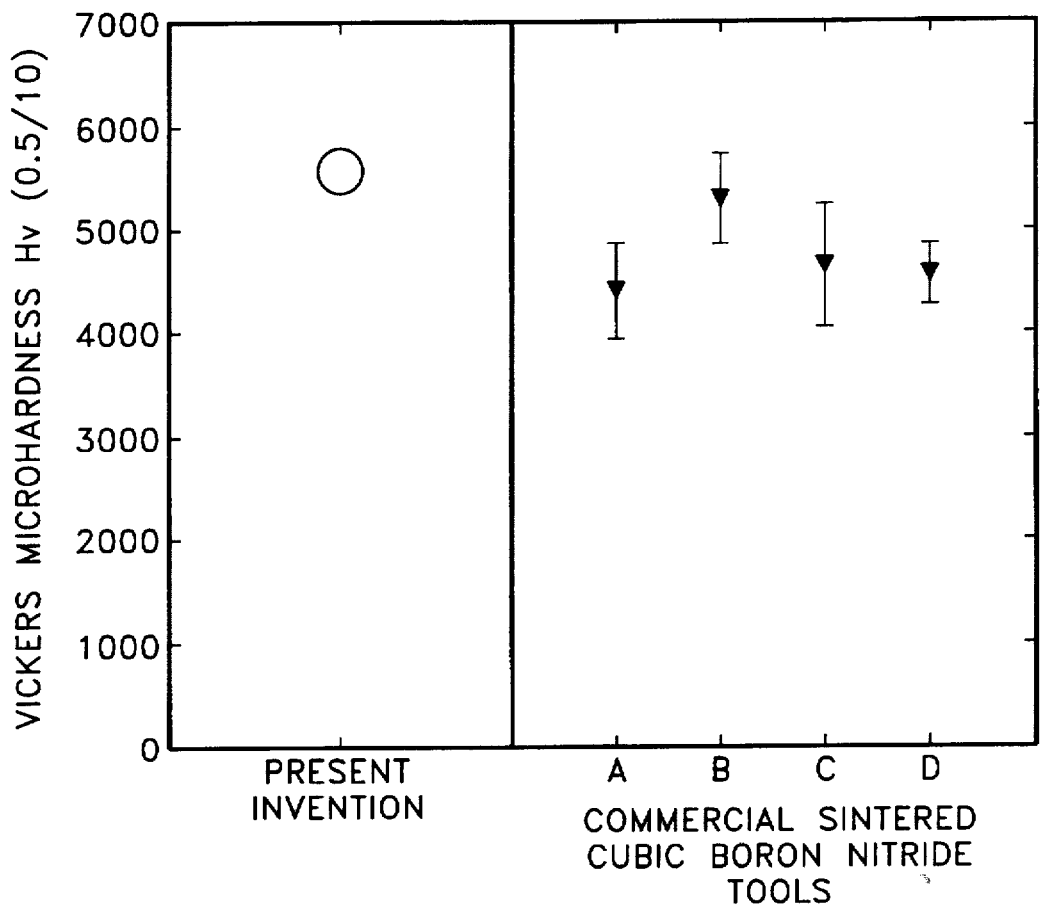
FIG. 16 is a graph showing Vickers microhardness of the cubic boron nitride sinters.

FIG. 16 is a graph showing the Hv (0.5/10) value of the cubic boron nitride sinter of Run 5-1 in comparison with the hardness data of four typical commercial cutting tools made from cubic boron nitride sinters using ceramic bonding materials or sintering aids. The sinter produced in Run 5-1 was superhard with the Hv (0.5/10) being about 5500 and this value was comparable to or higher than those of the commercial cutting tools made of sintered cubic boron nitride. Furthermore, the hardness of the sinter of Run 5-1 was uniform over the entire surface subjected to the hardness measurement and it was substantially free from variations.

Figure 17:
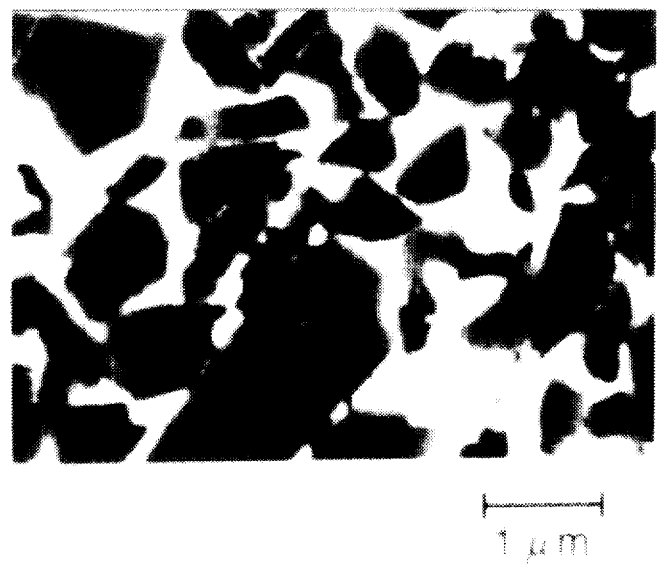
FIG. 17 is an electron micrograph showing a polished surface of the sinter produced in Example 5-1.

The polished surface of the sinter of Run 5-1 was coated with a gold film by a customary evaporation technique and examined with an electron microscope. The result is shown in the FIG. 17 electron micrograph (X5000), in which the dark area represents the cubic boron nitride and the light area the $ZrN-ZrB_2$ base substance. As one can see from FIG. 17, the sinter was entirely free from pores and could be sintered to a relative density of 100%. In addition, it had no portion left unsintered. In areas where cubic boron nitride particles contacted each other via a thin layer of the coat forming substance, the latter was bursted by the contiguous cubic boron nitride particles, which hence were coupled directly as a result of sintering. In all other areas, the $ZrN-ZrB_2$ base comparatively easy-to-sinter particles under industrially feasible ultrahigh pressures and elevated temperatures, thereby forming dense, rigid and superhard structures.

The sinters thus produced were similar to those produced in Examples 1 and 4 in that they were sinters or composite sinters that were superhard and which had dense, uniform and highly controlled microstructures with substantially uniform distributions of the bonding materials.

TABLE 2

| | Relative proportions (vol %) | | | | Coating Conditions | Sintering Conditions | | | Sinter | | |
|---|---|---|---|---|---|---|---|---|---|---|---|
| Run No. | Core Particle cBN | Coat Forming Substance Name | Amount | Whisker SiC | Coating Apparatus Ex. No. | (Approximate) Ex. or Run No. | Pressure GPa | Temperature °C. | Time min | Sinter apparatus | Density % | Hardness Hv |
| 5-1 | 80 | Zr | 20 | — | 1 | 5-1 | 5.5 | 1450 | 30 | CB | 100 | 5500 |
| 5-2 | 80 | Ti | 20 | — | 2 | 5-2 | 5.3 | 1480 | 30 | CB | 100 | 5600 |
| 5-3 | 85 | TiN | 15 | — | 3 | 5-3 | 5.3 | 1480 | 30 | CB | 100 | 6400 |
| 5-4 | 80 | TiN | 20 | — | 3 | 5-3 | 5.3 | 1480 | 30 | CB | 100 | 5900 |
| 5-5 | 80 | AlN | 20 | — | 1 | 5-1 | 5.4 | 1450 | 30 | CB | 100 | 5800 |
| 5-6 | 70 | AlN | 30 | — | 1 | 5-5 | 5.4 | 1450 | 30 | CB | 100 | 5200 |
| 5-7 | 80 | $Si_3N_4$ | 20 | — | 1 | 5-1 | 5.3 | 1470 | 30 | CB | 100 | 5900 |
| 5-8 | 70 | $Si_3N_4$ | 30 | — | 1 | 5-7 | 5.3 | 1470 | 30 | CB | 100 | 5100 |
| 5-9 | 85 | $Al_2O_3$ | 15 | — | 2 | 5-2 | 5.5 | 1450 | 30 | CB | 100 | 6100 |
| 5-10 | 80 | $Al_2O_3$ | 20 | — | 2 | 5-9 | 5.6 | 1450 | 30 | CB | 100 | 5900 |
| 5-11 | 90 | Co | 10 | — | 1 | 5-1 | 5.5 | 1450 | 30 | CB | 100 | 6000 |
| 5-12 | 70 | Co | 30 | — | 1 | 5-1 | 5.5 | 1450 | 30 | CB | 100 | 2800 |
| 5-13 | 85 | $Ni_3Al$ | 15 | — | 1 | 5-1 | 5.1 | 1450 | 30 | CB | 100 | 4300 |
| 5-14 | 80 | NiAl | 20 | — | 1 | 5-13 | 5.1 | 1450 | 30 | CB | 100 | 3300 |
| 5-15 | 72 | TiN | 18 | 10 | 3 | | 5.5 | 1500 | 30 | CB | 100 | 5000 |
| 5-16 | 72 | $Si_3N_4$ | 18 | 10 | 1 | | 5.3 | 1470 | 30 | CB | 100 | 5100 |

Figure 18:
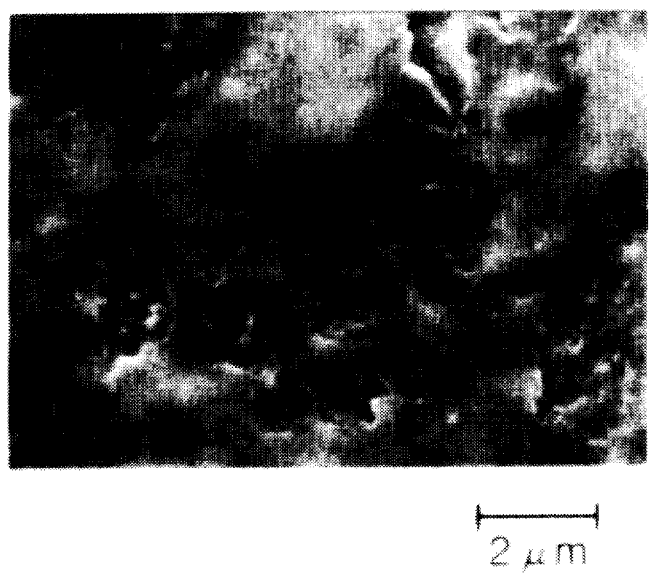
FIG. 18 is an electron micrograph showing a polished surface of a commercial sintered cubic boron nitride tool.

CB: Cubic ultrahigh pressure apparatus material was distributed to surround the cubic boron nitride particles, rendering the sinter to be characteristic in that it was dense, uniform and had the bonding material distributed to provide a highly controlled microstructure. It should also be noted that the cubic boron nitride particles in the sinter did not grow at all compared to the particles in the feed powder and that the coating on the cubic boron nitride was formed by chemical reaction between the cubic boron nitride and the metallic zirconium which served as the coat forming substance; these factors combined together to offer the characteristic feature that the cubic boron nitride particles in the sinter were finer than those in the feed although they were coated zirconium. This is very favorable and, hence, ideal for the mechanical characteristics of the sinter. The differences can be clearly seen by comparing FIG. 17 with FIG. 18 which is an electron micrograph (X5000) of a polished surface of one of the above-mentioned commercial cutting tools that was made of sintered cubic boron nitride and which was coated with a gold film by a customary evaporation technique for examination. Obviously, the bonding material and the sintering aid were distributed irregularly in the cubic boron nitride sinter of the commercial cutting tool to form lumps in certain areas. On the other hand, the number of areas that were devoid of the necessary sintering aid and bonding material was by no means small and unsintered portions were found there. Another major difference from the sinter of Run 5-1 was that every cubic boron nitride particle in the cutting tool was coarse.

The cubic boron nitride is inherently very difficult to sinter. In spite of this fact, the coated particles in a cubic boron nitride powder that were produced in Example 5 in accordance with the invention behaved as if they were

EXAMPLE 6

Coated diamond particles were prepared by coating the bare diamond particles of Example 1 with various coat forming substances using apparatus of the same types as used in Examples 1–3. The names of the coat forming substances used to prepare the coated diamond particles and their coating weights (relative proportions by vol %) are shown in Table 3.

The apparatus used in Run 6-1 was of the same type as used in Example 1; an alumina powder having an average diameter of 2 μm was supplied as a feed of coat forming substance from the feeder 112 at a rate of 1.5 g/min and the core diamond particles were supplied from the feeder 111 at a rate of 0.3 g/min. The other conditions in Run 6-1 were the same as in Example 1. The apparatus used in Run 6-2 was of the same type as used in Example 2; an alumina powder having an average diameter of 2 μm was supplied as a feed of coat forming substance at a rate of 1.0 g/min and the diamond particles were supplied at a rate of 0.7 g/min. The other conditions in Run 6-2 were the same as in Example 2. The apparatus used in Run 6-3 was of the same type as in Example 3; the values of dispersity (β) attained in the discharge section of cyclone 6-I and in the coating start region were the same as in Run 4-2 and an alumina powder was supplied at a rate of 0.6 g/min whereas the diamond particles were supplied at a rate of 1.5 g/min. The other conditions in Run 6-3 were the same as in Example 3.

The apparatus used in Run 6-4 was of the same type as used in Example 1 and operated to perform the coating operation under generally the same conditions as in Run 6-1. In Runs 6-5 to 6-9, inorganic salts consisting of KCl, $BaCl_2$ and NaF were mixed with $TiO_2$ and ferroalloy (Fe-Ti) to prepare an immersing bath. In this bath, diamond powder particles (up to 2 μm in diameter) were dipped for 1 h by the molten salt disproportionation method with the bath being melted at 900° C. As a result, the surfaces of the diamond powder particles were coated with TiC in such a way that the amount of internal addition would be 5% by volume. The surfaces of diamond particles were further coated with the apparatus of Example 1 under generally the same conditions as in Run 6-1.

Figure 19:
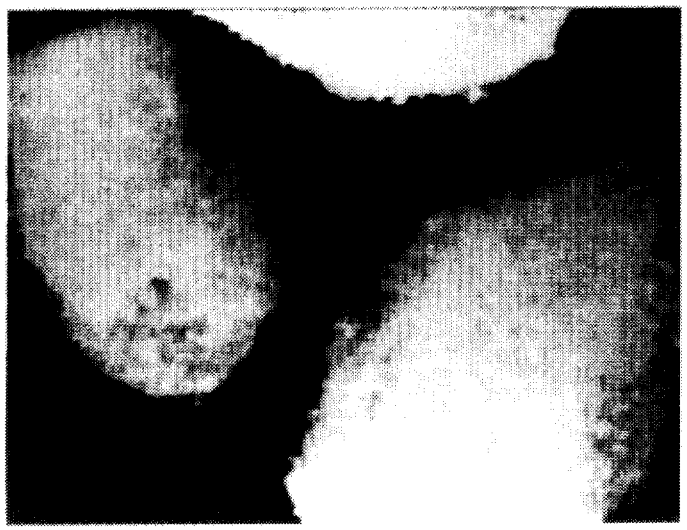
FIG. 19 is a scanning electron micrograph showing one of the coated diamond particles produced in Example 6-1.

The coated diamond particles thus prepared were examined with a scanning electron microscope. All of the particles prepared in Runs 6-1 to 6-3 were uniformly covered with superfine particles (ca. 0.005 μm) of coat forming substances as FIG. 19 shows (particularly for the case of Run 6-1).

In Runs 6-10 and 6-11, the powders of alumina-coated diamond particles prepared in Runs 6-1 and 6-2, respectively, were wet mixed with SiC whiskers at a volume ratio of 90:10 in acetone for 2 h in an alumina ball mill. In Run 6-12, a powder of diamond particles was coated with 53% by volume of alumina using the apparatus of Example 1 under generally the same conditions as in Run 6-1 and then wet mixed with SiC whiskers at a volume ratio of 85:15 in acetone for 2 h in an alumina ball mill. The SiC whiskers had their surfaces coated with the target TiC by sputtering in a coating weight of 33% by volume in terms of internal addition. The mixtures was vacuum dried at $10^{-6}$ torr at 200° C. to make dry blends.

The coated diamond particles thus prepared or mixtures thereof with SiC whiskers were stamped into disks having a diameter of 16 mm and a thickness of 5 mm in Runs 6-1 and 6-10 and into disks having a diameter of 8 mm and a thickness of 5 mm in Runs 6-2 and 6-11. The disks were placed into Pyrex glass capsules packed with a h-BN powder, degassed to $10^{-6}$ torr at 400° C. over 12 h and then sealed. The sealed capsules were set in a HIP or a ultrahigh pressure HIP apparatus using an argon gas as a pressure-transmitting medium and sintering was performed under the conditions shown in Table 3. In Runs 6-9 to 6-12, the coated diamond particles or mixtures thereof with whiskers were stamped into pellets having a diameter of 10 mm and a thickness of 8 mm and the pellets were buried in a pyrophyllite pressure-transmitting medium surrounded by a h-BN shaped part; the assemblies were set in a piston-cylinder (PC) ultrahigh pressure apparatus and sintering was performed under the conditions shown in Table 3. Following furnace cooling, the pressure was opened to atmosphere and the sinters were recovered.

The recovered sinters were measured for their density and Vickers microhardness Hv (0.5/10) as in Example 1 and the results are shown in Table 3.

The sinters of Runs 6-1 to 6-4 were checked for their crystalline phases by powder X-ray diffraction and no diffraction peaks were observed except for the diamond and α-form alumina. Similar results were obtained in the other runs: only diffraction peaks for diamond, titanium carbide and α-form alumina were observed in Runs 6-5 to 6-7; only diffraction peaks for diamond, titanium carbide and the monoclinic and tetragonal zirconium oxide each composing the PSZ were observed in Runs 6-8 and 6-9; only diffraction peaks for diamond, α-form alumina and silicon carbide were observed in Runs 6-10 and 6-11; and only diffraction peaks for diamond, α-form alumina, silicon carbide and titanium carbide were observed in Run 6-12. No other diffraction peaks were observed.

The surface of the sinter produced in Run 6-1 was polished with a diamond paste; the polished surface was coated with a gold film by a customary evaporation technique and examined with an electron microscope. The result is shown in the FIG. 20 micrograph (X5000), in which the dark area represents the diamond and the light area the alumina bonding material.

For comparison, bare diamond particles of the same type as used in Example 6 were mixed with an alumina powder at a ratio of 70:30 in volume percent and the mixture was sintered under the same conditions as in Example 6. The resulting sinter had a density of 92% and a Vickers microhardness of 2200. The difference is clearly visible by comparing FIG. 20 with FIG. 21 which is an electron micrograph (X5000) of a polished surface of the comparative sinter that was coated with a gold film by a customary evaporation technique for examination. Obviously, the bonding material and the sintering aid were distributed irregularly in the comparative sinter to form lumps in certain areas. On the other hand, the number of areas that were devoid of the necessary sintering aid and bonding material was by no means small and unsintered portions were found there. Thus, the sinter produced in Run 6-1 in accordance with the invention was significantly superior to the comparative sinter in terms of density, hardness and microstructure.

Each of the sinters produced in Runs 6-5 to 6-7 presented considerable difficulty in forming a polished surface for the hardness measurement and this fact shows that those sinters had high wear resistance, which was probably due to the formation of the titanium carbide coating film by dip coating.

Figure 20:
FIG. 20 is an electron micrograph showing a polished surface of the sinter produced in Example 6-1.
Figure 21:
FIG. 21 is an electron micrograph showing a polished surface of a sinter comprising uncoated diamond particles.

The foregoing data, when considered with particular reference to FIGS. 20 and 21, demonstrate that the sinters produced in Example 6 were entirely free from unsintered portions, pores, defects, etc., highly dense, superhard and comprised of highly controlled microstructures in which the diamond particles were surrounded by uniform distributions of the bonding material (s), i.e., α-form alumina, the combination of titanium carbide and α-form alumina, or the combination of titanium carbide and PSZ, or in which these coated diamond particles were further surrounded with a uniform dispersion of SiC.

TABLE 3

| | | Relative Proportions (vol %) | | | | | | | | | |
|---|---|---|---|---|---|---|---|---|---|---|---|
| | Coated Diamond Particles | | | | Fibrous Substance | | Sintering Conditions | | | | Sinter | |
| Run | | Coat Forming Substance | | | Whisker | Coating Substance | Pressure | Temperature | Time | | Density | Hardness |
| No. | Diamond | TiC | Al$_2$O$_3$ | PSZ | SiC | TiC | MPa | °C. | hr. | Apparatus | % | Hv |
| 6-1 | 30 | — | 70 | — | — | — | 150 | 1200 | 3 | HIP1 | 96.0 | 2740 |
| 6-2 | 50 | — | 50 | — | — | — | 1000 | 1200 | 3 | HIP2 | 95.0 | 3350 |
| 6-3 | 50 | — | 50 | — | — | — | 1500 | 1200 | 3 | PC | 95.3 | 3380 |
| 6-4 | 50 | — | 50 | — | — | — | 1500 | 1300 | 3 | PC | 95.5 | 3400 |
| 6-5 | 55 | 5 | 40 | — | — | — | 1500 | 1200 | 6 | PC | 94.8 | 3670 |
| 6-6 | 50 | 5 | 45 | — | — | — | 1500 | 1300 | 3 | PC | 95.0 | 3700 |
| 6-7 | 60 | 5 | 35 | — | — | — | 1500 | 1300 | 6 | PC | 94.6 | 3730 |
| 6-8 | 55 | 5 | — | 40 | — | — | 1500 | 1300 | 6 | PC | 99.3 | 2360 |
| 6-9 | 50 | 5 | — | 45 | — | — | 1500 | 1300 | 3 | PC | 99.6 | 2120 |
| 6-10 | 27 | — | 63 | — | 10 | — | 150 | 1200 | 3 | HIP1 | 94.8 | 2660 |
| 6-11 | 45 | — | 45 | — | 10 | — | 1000 | 1200 | 3 | HIP2 | 94.0 | 3220 |
| 6-12 | 40 | — | 45 | — | 10 | 5 | 1500 | 1300 | 3 | PC | 95.1 | 3170 |

HIP1: HIP apparatus incapable of producing ultrahigh pressures
HIP2: Superhigh pressure HIP apparatus
PC: Piston-cylinder (PC) ultrahigh pressure apparatus

EXAMPLE 7

Cubic boron nitride (cBN) particles of the same type as used in Example 2 were coated with various coat forming substances using apparatus of the same types as used in Examples 1–3. The names of the coat forming substances used to prepare the coated cubic boron nitride particles and their coating weights (relative proportions by vol %) are shown in Table 4.

The apparatus used in Runs 7-1 and 7-2 were of the same types as used in Examples 1 and 3, respectively; an alumina powder having an average diameter of 2 μm was supplied as a feed of coat forming substance at respective rates of 1.5 and 2.1 g/min and the cubic boron nitride core particles were supplied at respective rates of 0.3 and 1.5 g/min. The other conditions in Runs 7-1 and 7-2 were the same as in Example 1 and Run 4-2, respectively. The apparatus used in Runs 7-3 and 7-4 was of the same type as used in Example 1 and the other conditions were the same as in Run 7-1. In Runs 7-5, 7-6 and 7-8, the procedures of Runs 6-6, 6-7 and 6-9 were repeated, except that the surfaces of cubic boron nitride particles were dip coated with the combination of titanium nitride (TIN) and titanium diboride (TiB$_2$) in place of titanium carbide and, further, alumina or PSZ coating was performed using the same apparatus as in Example 1 under generally the same conditions as in Run 7-1. In Run 7-7, the apparatus of Example 1 was used and coating was performed under generally the same conditions as in Run 7-1, except that alumina was replaced by PSZ. In Runs 7-9 and 7-10, the alumina coated cubic boron nitride particles as prepared in Run 7-1 and Example 2, respectively, were each mixed with SiC whiskers as in Runs 6-10 and 6-11. In Run 7-11, cubic boron nitride particles were coated with 53% alumina using the apparatus of Example 1 under generally the same conditions as in Run 7-1 and then mixed with TiC coated SiC whiskers that were prepared as in Run 6-12.

Figure 22:
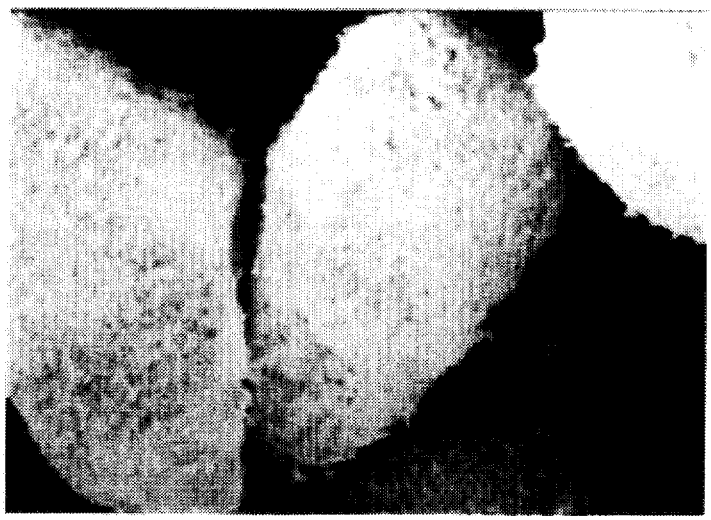
FIG. 22 is a scanning electron micrograph showing one of the coated cubic boron nitride particles produced in Example 7-1.

The coated cubic boron nitride particles thus prepared were examined with a scanning electron microscope. All of the particles prepared in Runs 7-1 to 7-3 were uniformly covered with superfine particles (ca. 0.005 μm) of coat forming substances as FIG. 22 shows (particularly for the case of Run 7-1).

The powders of coated cubic boron nitride particles thus prepared in Runs 7-1 to 7-8 or the mixtures thereof with SiC whiskers which were prepared in Runs 7-9 to 7-11 were shaped by stamping as in Runs 6-1, 6-3 to 6-12, respectively, and sintered with the sinter apparatus shown in Table 4 under the sintering conditions shown in Table 4.

The sinters thus produced were measured for their density and Vickers microhardness Hv (0.5/10) as in Example 1 and the results are shown in Table 4.

The crystalline phases of the sinters were examined by powder X-ray diffraction; as in Runs 6-1 to 6-12, no diffraction peaks were observed except for the cubic boron nitride (core particles), the bonding materials or coat forming substances ((x-alumina, titanium nitride, titanium diboride, as well as the PSZ composing monoclinic and tetragonal zirconium oxide), and whiskers (silicon carbide) and the titanium carbide coating thereon.

Figure 23:
FIG. 23 is an electron micrograph showing a polished surface of the sinter produced in Example 7-1.
Figure 24:
FIG. 24 is an electron micrograph showing a polished surface of a sinter comprising uncoated cubic boron nitride particles.

The polished surface of the sinter of Run 7-1 was coated with a gold film by a customary evaporation technique and examined with an electron microscope. The result is shown in the FIG. 23 electron micrograph (X5000), in which the dark area represents the cubic boron nitride and the light area the bonding material alumina. As one can see from FIG. 23, the sinter was entirely free from unsintered portions, pores, defects, etc. and it was comprised of a highly controlled microstructure in which the bonding material alumina was distributed uniformly around the cubic boron nitride particles.

For comparison, bare cubic boron nitride particles of the same type as used in Run 7-1 were mixed with an alumina powder at a ratio of 70:30 in volume percent and the mixture was sintered under the same conditions as in Run 7-1. The resulting sinter had a density of 94% and a Vickers microhardness of 2300. From an electron micrograph (X5000) of a polished surface of the comparative sinter that was coated with a gold film by a customary evaporation technique for examination. Obviously, the bonding material and the sintering aid were distributed irregularly in the comparative sinter to form lumps in certain areas. On the other hand, in the comparative sinter, the number of areas that were devoid of the necessary sintering aid and bonding material was by no means small and unsintered portions were found there.

In Runs 7-5, 7-6 and 7-9, the TiN-TiB$_2$ coating film formed by dip coating were found to be as effective as the TiC coating film formed by dip coating in Runs 6-5 to 6-7.

Thus, the sinters produced in Example 7 were entirely free from unsintered portions, pores, defects, etc., highly dense, superhard and comprised of highly controlled microstructures in which the cubic boron nitride particles were surrounded by uniform distributions of the bonding material(s), i.e., α-alumina, PSZ, the combination of $TiN-TiB_2$ and α-alumina, or the combination of $TiN-TiB_2$ and PSZ, or in which these coated cubic boron nitride particles were further surrounded with a uniform dispersion of SiC as whiskers.

The thus prepared powders of coated diamond particles and powders of bonding materials having the various formulations shown in Table 5 were added in the various proportions shown in Table 5 and wet mixed in acetone for 2 h in an alumina ball mill. Thereafter, the mixtures were vacuum dried at $10^{-6}$ torr and at 200° C. to produce dry blends. The bonding material powder used in Runs 8-1 to 8-4 was easily sintrable alumina of high purity (i.e., the alumina powder described in the official gazette of Unex-

TABLE 4

| | Relative Proportions (vol %) | | | | | | Sintering Conditions | | | | Sinter | |
|---|---|---|---|---|---|---|---|---|---|---|---|---|
| | Coated Diamond Particles | | | | Fibrous Substance | | | | | | | |
| | | Coat Forming Substance | | | Whisker | Coating Substance | Pressure | Temperature | Time | | Density | Hardness |
| Run No. | cBN | TiN—TiB$_2$ | Al$_2$O$_3$ | PSZ | SiC | TiC | MPa | °C. | hr. | Apparatus | % | Hv |
| 2 | 50 | — | 50 | — | — | — | 1000 | 1200 | 3 | HIP2 | 95.8 | 3750 |
| 7-1 | 30 | — | 70 | — | — | — | 150 | 1200 | 3 | HIP1 | 97.1 | 2960 |
| 7-2 | 50 | — | 50 | — | — | — | 1500 | 1200 | 3 | PC | 98.3 | 3930 |
| 7-3 | 50 | — | 50 | — | — | — | 1500 | 1300 | 3 | PC | 98.8 | 3970 |
| 7-4 | 60 | — | 40 | — | — | — | 1500 | 1200 | 6 | PC | 98.2 | 4700 |
| 7-5 | 50 | 5 | 45 | — | — | — | 1500 | 1300 | 3 | PC | 99.0 | 4030 |
| 7-6 | 60 | 5 | 35 | — | — | — | 1500 | 1300 | 6 | PC | 98.5 | 4780 |
| 7-7 | 60 | — | — | 40 | — | — | 1500 | 1300 | 6 | PC | 99.8 | 2300 |
| 7-8 | 50 | 5 | — | 45 | — | — | 1500 | 1300 | 3 | PC | 99.8 | 2100 |
| 7-9 | 27 | — | 63 | — | 10 | — | 150 | 1200 | 3 | HIP1 | 96.0 | 2780 |
| 7-10 | 45 | — | 45 | — | 10 | — | 1000 | 1200 | 3 | HIP2 | 95.0 | 3560 |
| 7-11 | 40 | — | 45 | — | 10 | 5 | 1500 | 1300 | 3 | PC | 98.7 | 3400 |

HIP1: HIP apparatus incapable of producing ultrahigh pressures
HIP2: Superhigh pressure HIP apparatus
PC: Piston-cylinder (PC) ultrahigh pressure apparatus

EXAMPLE 8

Coated diamond particles were prepared by coating the bare diamond particles of Example 1 with various coat forming substances using apparatus of the same type as used in Examples 1–3. The names of the coat forming substances used to prepare the coated diamond particles and their coating weights (relative proportions by vol %) are shown in Table 5.

The apparatus used in Runs 8-1, 8-2 and 8-4 were of the same types as used in Examples 1, 2 and 3, respectively; a titanium carbide powder having an average diameter of 2 μm was supplied as a feed of coat forming substance at a rate of 0.4 g/min and the core diamond particles were supplied at a rate of 2.0 g/min; the other conditions in Runs 8-1, 8-2 and 8-4 were generally the same as in Example 1 and Runs 4-1 and 4-2, respectively. In each of those runs, 10% titanium carbide coated diamond particles were obtained. In Runs 8-5 and 8-6, an apparatus of the same type as used in Example 1 was operated under generally the same conditions as in Run 8-1 to produce 10% titanium carbide coated diamond particles; in Runs 8-7 and 8-8, the same procedure was repeated to produce 10% metallic titanium coated diamond particles; in Runs 8-9 and 8-10, the same procedure was repeated to yield 20% titanium carbide coated diamond particles; in Run 8-3, the 10% titanium carbide coated particles prepared in Run 8-2 were used.

Figure 25:
FIG. 25 is a scanning electron micrograph showing one of the coated diamond particles produced in Example 8-1.

The coated diamond particles thus prepared were examined with a scanning electron microscope. All of the particles prepared in Runs 8-1 to 8-4 were uniformly covered with superfine particles (ca. 0.005 μm) of coat forming substances as FIG. 25 shows (particularly for the case of Run 8-1).

amined Published Japanese Patent Application (kokai) Sho 63-151616); in Runs 8-5 and 8-6, PSZ was used as a bonding material powder; and in Runs 8-7 to 8-10, TiC was used. Take, for example, Run 8-1; in this run, 55 vol % of 10% TiC coated diamond particles were mixed with 43.4 vol % of easily sintrable alumina of high purity as a bonding material powder, and with sintering aids for the alumina powder which were 0.6 vol % and 1.0 vol %, respectively, of magnesia (MgO) and titania (TiOx; x=1'2).

In Runs 8-11 and 8-12, 90 vol % of the mixtures prepared in Runs 8-4 and 8-5, respectively, were mixed with 10 vol % of SiC whiskers and the mixtures thus prepared were used as sinter feeds.

The thus prepared mixtures of coated diamond particles with bonding material powders were stamped into disks having a diameter of 10 mm and a thickness of 8 mm in Runs 8-1, 8-7, 8-8 and 8-10. The disks were buried in a pyrophyllite pressure-transmitting medium surrounded by a h-BN shaped part and the assemblies were set in a piston-cylinder (PC) ultrahigh pressure apparatus, and sintering was performed under the conditions set forth in Table 5. In the other runs, the same mixtures of coated diamond particles with bonding material powders, or mixtures further containing SiC whiskers were stamped into disks having a diameter of 16 mm and a thickness of 5 mm. The disks were placed in a Pyrex glass capsule packed with a h-BN shaped part and the assemblies were degassed to $10^{-6}$ torr by heating at 400° C. for 12 h and sealed. Thereafter, the capsules were set in a HIP or ultrahigh pressure HIP apparatus using an argon gas as a pressure-transmitting medium and sintering was performed under the conditions set forth in Table 5. Subsequently, the temperature was lowered and the pressure reduced for recovering the sinters.

The recovered sinters were measured for their density and Vickers microhardness Hv (0.5/10); the results are shown in Table 5 together with the sintering conditions and the types of sintering apparatus used.

The sinters were also checked for their crystalline phases by powder X-ray diffraction. In Example 8, no diffraction peaks were observed except for the diamond, coat forming substances (coating materials) and the bonding material powders or whisker SiC. Take, for example, Runs 8-1 to 8-4; in these cases, the only diffraction peaks observed were those for diamond, TiC and α-alumina. In the other runs, the only diffraction peaks observed were those for the following: diamond, TiC and PSZ composing monoclinic and tetragonal zirconium oxide (Runs 8-5 and 8-6); diamond, the TiC that was generated by the reaction between the coating metallic titanium and the diamond, as well as TiN (Runs 8-7 and 8-8); diamond and TiC (Run 8-9 and 8-10); diamond, TiC, α-alumina and SiC (Run 8-11); diamond, TiC, the PSZ composing monoclinic and tetragonal zirconium oxide, and SiC (Run 8-12).

The surface of the sinter produced in Run 8-1 was polished with a diamond paste and coated with a gold film by a customary evaporation technique and examined with an electron microscope. The result is shown in the FIG. 26 electron micrograph (X5000), in which the dark area represents the diamond and the light area the alumina-base bonding material.

Figure 26:
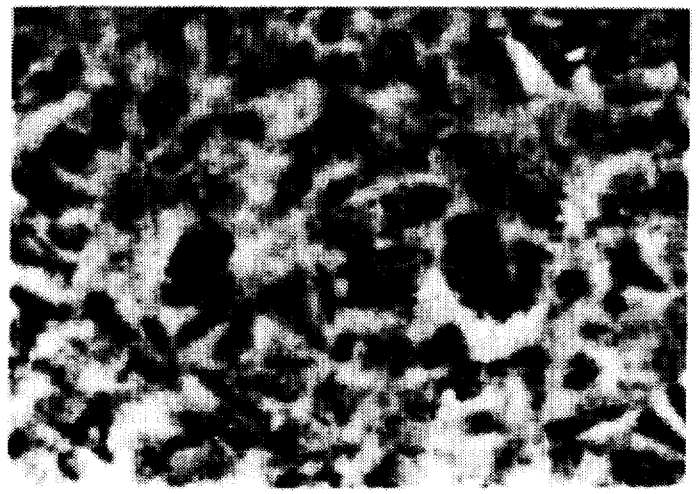
FIG. 26 is an electron micrograph showing a polished surface of the sinter produced in Example 8-1.

As one can see from FIG. 26, all the sinters of Example 8 were entirely free from unsintered portions, pores, defects, etc., highly dense, superhard and comprised of highly controlled microstructures in which the diamond particles were surrounded by uniform distributions of the coating materials, the bonding materials (TIC, TiN, α-alumina and PSZ) and the SiC whiskers, if any.

The apparatus used in Runs 9-1, 9-2 and 9-3 were of the same types as used in Examples 1, 2 and 3, respectively; a titanium nitride powder having an average diameter of 2 μm was supplied as a feed of coat forming substance at a rate of 0.3 g/min and the cubic boron nitride core particles were supplied at a rate of 1.5 g/min; the other conditions in Runs 9-1, 9-2 and 9-3 were generally the same as in Example 1, Runs 4-2 and 4-2, respectively. In each of those runs, 10% titanium nitride coated cubic boron nitride particles were obtained. In Runs 9-4 and 9-5, an apparatus of the same type as used in Example 1 was operated under generally the same conditions as in Run 9-1 to produce 10% titanium nitride coated cubic boron nitride particles; in Runs 9-6 and 9-7, the same procedure was repeated to produce 10% metallic titanium coated cubic boron nitride particles; and in Runs 9-8 and 9-9, the same procedure was repeated to yield 20% titanium nitride coated cubic boron nitride particles.

Figure 27:
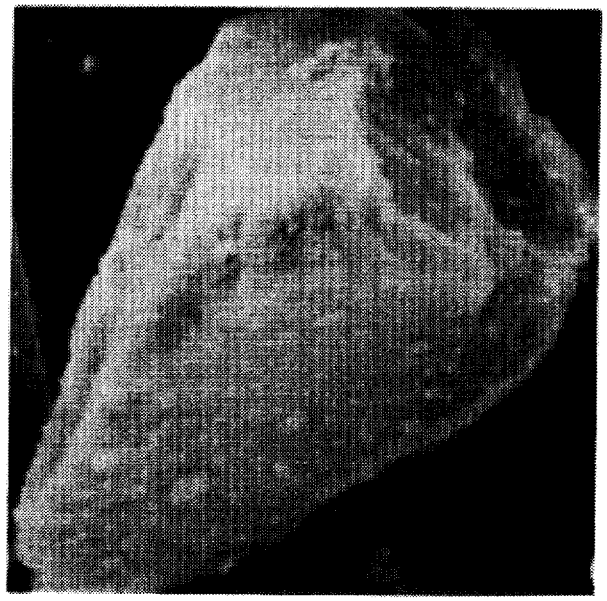
FIG. 27 is a scanning electron micrograph showing one of the coated cubic boron nitride particles produced in Example 9-1.

The coated cubic boron nitride particles thus prepared were examined with a scanning electron microscope. All of the particles prepared in Runs 9-1 to 9-3 were uniformly covered with superfine particles (ca. 0.005 μm) of coat forming substances as FIG. 27 shows (particularly for the case of Run 9-1).

The thus prepared powders of coated cubic boron nitride particles and powders of bonding materials having the various formulations shown in Table 6 were added in the various proportions shown in Table 6. Those powders were wet mixed in acetone for 2 h in an alumina ball mill as in Example 8. Thereafter, the mixtures were vacuum dried at $10^{-6}$ torr and at 200° C. to produce dry blends. The bonding material powders used in Example 9 were the same as those used in Example 8, i.e., easily sintrable alumina of high purity, PSZ, and TiN. As in Example 8, the use of easily sintrable high-purity alumina with an average particle diameter of 0.2 μm as a bonding material powder was accompa-

TABLE 5

| Run No. | Relative Proportions (vol %) | | | | | | | | | | Sintering Conditions | | | | Sinter | |
|---|---|---|---|---|---|---|---|---|---|---|---|---|---|---|---|---|
| | | Coating | | | | | | | | | Pressure | Temperature | | | | |
| | | Material | | | Bonding Material Powder | | | | | Whisker | | | Time | Appa- | Density | Hardness |
| | Diamond | TiC | TiN | Ti | PSZ | TiN | Al₂O₃ | MgO | TiOₓ | SiC | MPa | °C. | hr. | ratus | % | Hv |
| 8-1 | 50.0 | 5.0 | — | — | — | — | 43.4 | 0.6 | 1.0 | — | 1500 | 1300 | 3 | PC | 96.0 | 4110 |
| 8-2 | 30.0 | 3.0 | — | — | — | — | 65.4 | 0.6 | 1.0 | — | 150 | 1300 | 3 | HIP1 | 98.8 | 3150 |
| 8-3 | 40.0 | 4.0 | — | — | — | — | 54.4 | 0.6 | 1.0 | — | 1000 | 1300 | 3 | HIP2 | 98.8 | 3580 |
| 8-4 | 20.0 | 2.0 | — | — | — | — | 76.4 | 0.6 | 1.0 | — | 150 | 1300 | 3 | HIP1 | 97.8 | 2930 |
| 8-5 | 30.0 | 3.0 | — | — | 67.0 | — | — | — | — | — | 150 | 1300 | 3 | HIP1 | 98.5 | 1810 |
| 8-6 | 45.0 | 4.5 | — | — | 50.5 | — | — | — | — | — | 150 | 1300 | 3 | HIP1 | 98.0 | 1990 |
| 8-7 | 20.0 | — | — | 2.0 | — | 78.0 | — | — | — | — | 1500 | 1300 | 3 | PC | 99.1 | 2860 |
| 8-8 | 40.0 | — | — | 4.0 | — | 56.0 | — | — | — | — | 1500 | 1300 | 3 | PC | 97.8 | 3430 |
| 8-9 | 20.0 | — | 4.0 | — | — | 76.0 | — | — | — | — | 1000 | 1300 | 3 | HIP2 | 99.0 | 2840 |
| 8-10 | 40.0 | — | 8.0 | — | — | 52.0 | — | — | — | — | 1500 | 1300 | 3 | PC | 99.7 | 3400 |
| 8-11 | 18.0 | 1.8 | — | — | — | — | 68.8 | 0.5 | 0.9 | 10.0 | 150 | 1300 | 3 | HIP1 | 99.4 | 2880 |
| 8-12 | 27.0 | 2.7 | — | — | 60.3 | — | — | — | — | 10.0 | 150 | 1300 | 3 | HIP1 | 98.8 | 1880 |

HIP1: HIP apparatus incapable of producing ultrahigh pressures
HIP2: Superhigh pressure HIP apparatus
PC: Piston-cylinder (PC) ultrahigh pressure apparatus

EXAMPLE 9

Coated cubic boron nitride particles were prepared by coating the bare cubic boron nitride (cBN) particles of Example 1 with various coat forming substances using the apparatus employed in Examples 1–3. The names of the coat forming substances used to prepare those coated cubic boron nitride particles and their coating weights (relative proportions by vol %) are shown in Table 6.

nied by the use of sintering aids for the alumina powder which were magnesia (MgO) and titania (TiOx; x=1–2).

In Runs 9-10 and 9-11, 90 vol % of the mixtures prepared in Runs 9-3 and 9-4, respectively, were mixed with 10 vol % of SiC whiskers and the mixtures thus prepared were used as sinter feeds.

The thus prepared mixtures of coated cubic boron nitride particles with bonding material powders were stamped into disks in Runs 9-1, 9-6, 9-7 and 9-9 as in Run 8-1; in the other runs, the same mixtures of coated cubic boron nitride particles with bonding material powders, or mixtures further containing SiC whiskers were stamped into disks as in Run 8-2. The disks were then sintered with the sinter apparatus listed in Table 6 under the sinter conditions also set forth in Table 6. Thereafter, the temperature was lowered and the pressure reduced for recovering the sinters.

The recovered sinters were measured for their density and Vickers microhardness Hv (0.5/10); the results are shown in Table 6 together with the sintering conditions and the types of sintering apparatus used.

The sinters were also checked for their crystalline phases by powder X-ray diffraction. In Example 9, no diffraction peaks were observed except for the cubic boron nitride, coat forming substances (coating materials) and the bonding materials or whisker SiC. Take, for example, Runs 9-1 to 9-3; in these cases, the only diffraction peaks observed were those for cubic boron nitride, TiN and α-alumina. In the other runs, the only diffraction peaks observed were those for the following: cubic boron nitride, TiN and the PSZ composing monoclinic and tetragonal zirconium oxide (Runs 9-4 and 9-5); cubic boron nitride, the TiB$_2$ that was generated by the reaction between the coating metallic titanium and cubic boron nitride, as well as TiN (Runs 9-6 and 9-7); cubic boron nitride and TiN (Runs 9-8 and 9-9); cubic boron nitride, TiC, α-alumina and SiC (Run 9-10); and cubic boron nitride, TiC, the PSZ composing monoclinic and tetragonal zirconium oxide, and SiC (Run 9-11).

Quantification by X-ray analysis showed that the sinter of Run 9-6 consisted of cubic boron nitride, TiB$_2$ and TiN in proportions of 19.5%, 1.0% and 79.5%, respectively, by volume whereas the sinter of Run 9-7 had relative volume proportions of 39.1%, 2.0% and 58.9%.

The surface of the sinter produced in Run 9-1 was polished with a diamond paste and coated with a gold film by a customary evaporation technique and examined with an electron microscope. The result is shown in the FIG. 28 electron micrograph (X5000), in which the dark area represents the cubic boron nitride and the light area the alumina base bonding material.

Figure 28:
FIG. 28 is an electron micrograph showing a polished surface of the sinter produced in Example 9-1.

As one can see from FIG. 28, all the sinters of Example 9 were entirely free from unsintered portions, pores, defects, etc., highly dense, superhard and comprised of highly controlled microstructures in which the cubic boron nitride particles were surrounded by uniform distributions of the coating materials, the bonding materials (TiN, TiB$_2$, α-alumina and PSZ) and the SiC whiskers, if any.

TABLE 6

| Run No. | Relative Proportions (vol %) | | | | | | | | Sintering Conditions | | | | Sinter | |
|---|---|---|---|---|---|---|---|---|---|---|---|---|---|---|
| | Coating Material | | | Bonding Material Powder | | | | | Whisker | Pressure | Temperature | Time | Apparatus | Density | Hardness |
| | cBN | TiN | Ti | PSZ | TiN | Al$_2$O$_3$ | MgO | TiO$_x$ | SiC | MPa | °C. | hr. | | % | Hv |
| 9-1 | 50.0 | 5.0 | — | — | — | 43.4 | 0.6 | 1.0 | — | 1500 | 1300 | 3 | PC | 97.5 | 4020 |
| 9-2 | 40.0 | 4.0 | — | — | — | 54.4 | 0.6 | 1.0 | — | 1000 | 1300 | 3 | HIP2 | 98.7 | 3500 |
| 9-3 | 20.0 | 2.0 | — | — | — | 76.4 | 0.6 | 1.0 | — | 150 | 1300 | 3 | HIP1 | 98.3 | 2870 |
| 9-4 | 30.0 | 3.0 | — | 67.0 | — | — | — | — | — | 150 | 1300 | 3 | HIP1 | 99.8 | 1830 |
| 9-5 | 45.0 | 4.5 | — | 50.5 | — | — | — | — | — | 150 | 1300 | 3 | HIP1 | 99.6 | 2010 |
| 9-6 | 20.0 | — | 2.0 | — | 78.0 | — | — | — | — | 1500 | 1300 | 3 | PC | 99.0 | 2890 |
| 9-3 | 40.0 | — | 4.0 | — | 56.0 | — | — | — | — | 1500 | 1300 | 3 | PC | 98.0 | 3430 |
| 9-8 | 20.0 | 4.0 | — | — | 76.0 | — | — | — | — | 1000 | 1300 | 3 | HIP2 | 99.0 | 2900 |
| 9-9 | 40.0 | 8.0 | — | — | 52.0 | — | — | — | — | 1500 | 1300 | 3 | PC | 99.4 | 3510 |
| 9-10 | 18.0 | 1.8 | — | — | — | 68.8 | 0.5 | 0.9 | 10.0 | 150 | 1300 | 3 | HIP1 | 99.8 | 2790 |
| 9-11 | 27.0 | 2.7 | — | 60.3 | — | — | — | — | 10.0 | 150 | 1300 | 3 | HIP1 | 99.7 | 1840 |

HIP1: HIP apparatus incapable of producing ultrahigh pressures
HIP2: Superhigh pressure HIP apparatus
PC: Piston-cylinder (PC) ultrahigh pressure apparatus

EXAMPLES 10 and 11

Using the apparatus employed in Examples 1–3, pseudo-fine diamond particles (Example 10) or pseudo-fine particles in a high-pressure phase boron nitride powder (Example 11) were covered with various coat forming materials. The pseudo-fine diamond particles were the same as those used in Example 3; the pseudo-fine particles in a high-pressure phase boron nitride powder were pseudo-fine cubic boron nitride (cBN) particles that had an average diameter ($D_M$) of 17 μm and a frequency distribution by volume of ([$D_M/2, 3D_M/2$], ≧90%). The names of the coat forming substances used to prepare the pseudo-fine coated diamond and cubic boron nitride particles and their coating weights (relative proportions by vol %), as well as the specific types of the coating apparatus used and the conditions for their use (generally the same) are shown in Tables 7 and 8 together with the data for Example 3.

The apparatus used in Runs 10-1 and 11-1 was of the same type as used in Example 1; the group of means for high dispersion treatment of particles in this apparatus was to treat the pseudo-fine particles of either a diamond powder or a cubic boron nitride powder, in which the core particles had an average diameter of 17 μm and a frequency distribution by volume of ([$D_M/5, 5D_M$], ≧90%) and, hence, said group of means was designed in such a way that it could realize an output dispersity (β) value of at least 80% (β≧80%) for the core particles in those powders while, at the same time, the coating operation could be started with a dispersity (β) of at least 80% (β≧80%) in the coating start region. A titanium carbide powder (Run 10-1) or a titanium nitride powder (Run 11-1) that were feeds for coat forming substances and which had an average particle diameter of 2 μm were supplied from the feeder 112 at a rate of 0.3 g/min whereas the pseudo-fine diamond or cubic boron nitride core particles were supplied from the feeder 111 at a rate of 3.0 g/min and introduced into the coating chamber after being dispersed to a dispersity (β) of 89%, and the dispersity (β) in the coating start region 3-L1 was 89%. The other conditions in Examples 10 and 11 were the same as in Example 1. The coating weights of titanium carbide and titanium nitride were each 5% by volume.

The apparatus used in Runs 10-2 and 11-2 was of the same type as used in Example 2; the dispersity (β) value attainable in these runs was the same as in Runs 10-1 and 11-1; a metallic titanium powder having an average particle diameter of 25 μm was supplied as a feed for coat forming substance from the feeder 215 at a rate of 0.5 g/min, and the pseudo-fine diamond or cubic boron nitride core particles were supplied from the feeder 214 at a rate of 2.5 g/min; the Other conditions in Runs 10-2 and 11-2 were the same as in Example 2. The apparatus used in Run 11-3 was of the same type as used in Example 3; a zirconium powder having an average particle diameter of 25 μm was supplied as a feed for coat forming substance from the feeder 314 at a rate of 0.5 g/min and the pseudo-fine cubic boron nitride core particles were supplied from the feeder 313 at a rate of 2.0 g/min; the other conditions in Run 11-3 were the same as in Example 3. In Runs 10-2, 11-2 and 11-3, the coating weights of metallic titanium and zirconium were each 10% by volume.

The apparatus used in Runs 10-3, 10-4, 11-4 and 11-5 was of the same type as used in Example 1 and operated under generally the same conditions as in Example 1 to prepare the following in the respective runs: pseudo-fine diamond particles first coated with 5 vol % TiC, then with 50 vol % alumina; pseudo-fine diamond particles coated with 10 vol % TiC; pseudo-fine cubic boron nitride particles coated with 50 vol % alumina; and pseudo-fine cubic boron nitride particles coated with 10 vol % TiN.

Figure 29:
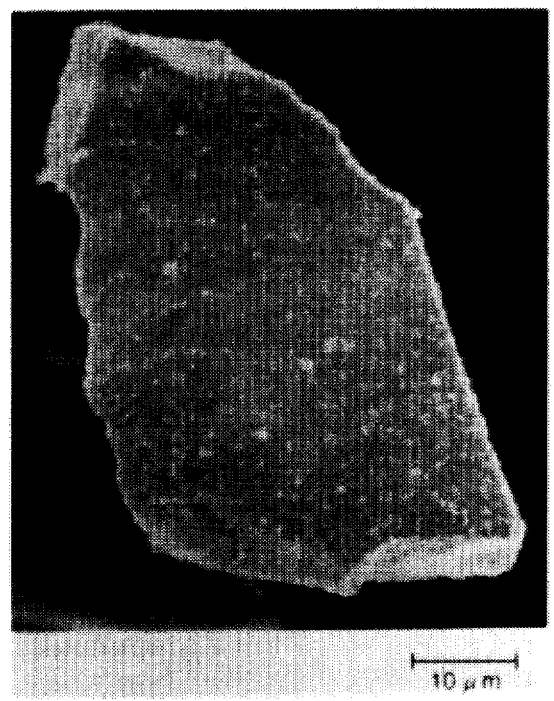
FIG. 29 is a scanning electron micrograph showing one of the coated diamond particles produced in Example 10-1.
Figure 30:
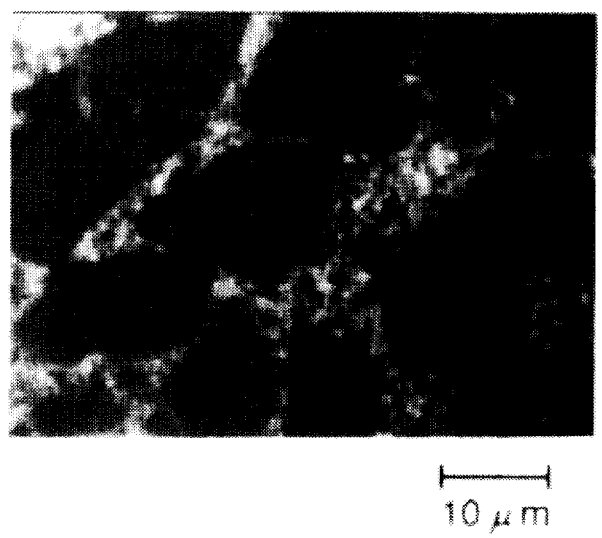
FIG. 30 is an electron micrograph showing a polished surface of the sinter produced in Example 10-1.

The coated pseudo-fine diamond and cubic boron nitride particles were examined with a scanning electron microscope. All of the particles prepared in Examples 10 and 11 were uniformly covered with superfine particles (ca. 0.005 μm) of coat forming substances (TiC, TiN, Ti and Zr) as in Example 3 and as FIG. 29 (for the particular case of Run 10-1) and FIG. 30 (for the particular case of Run 11-1) show.

The thus prepared powders of pseudo-fine coated diamond or cubic boron nitride particles, or mixtures thereof with the bonding materials listed in Table 7 or 8 were shaped, set in the various types of sinter apparatus shown in Tables 7 and 8, and sintered under the various sintering conditions also set forth in Tables 7 and 8. Thereafter, the temperature was lowered and the pressure reduced for recovering the sinters. The specific procedures were as follows.

In Runs 10-1 and 10-2, 60% by volume of the powders of pseudo-fine diamond particles coated with TiC and Ti, respectively, were wet mixed in acetone with 40% by volume of bonding materials that were the powders of fine coated diamond particles as prepared by coating fine diamond particles of 0.5–2 μm in diameter (average diameter=1 μm) with 15 vol % of TiC under generally the same conditions. In Runs 11-1, 11-2 and 11-3, 60% by volume of the powders of pseudo-fine cubic boron nitride particles coated with TiN, Ti and Zr, respectively, were wet mixed in acetone with 40% by volume of bonding materials that were the powders of fine coated cubic boron nitride particles as prepared by coating fine cubic boron nitride particles of 0.5–2 μm in diameter (average diameter=1 μm) with 15 vol % of TiC under generally the same conditions. Thereafter, the resulting wet mixtures were shaped, vacuum dried and sintered with a cubic ultrahigh pressure apparatus as in Example 3.

In Runs 10-3 and 11-4, the powder of TiC and alumina coated pseudo-fine diamond particles and the powder of alumina coated fine cubic boron nitride particles, respectively, were stamped into disks having a diameter of 8 mm and a thickness of 5 mm; the disks were placed in Pyrex glass capsules packed with a h-BN powder. After degassing at $10^{-6}$ torr by heating at 400° C. for 12 h, the capsules were sealed, set in a HIP apparatus using an argon gas as a pressure-transmitting medium and sintered under the conditions set forth in Tables 7 and 8.

In Runs 10-4 and 11-5, the powder of TiC coated pseudo-fine diamond particles and the powder of TiN coated fine cubic boron nitride particles were respectively wet mixed in 40% by volume as in Run 8-2 with the associated bonding materials that were 53.4%, 0.6% and 1.0% by volume of the high-purity and easily sintrable alumina, magnesia (MgO) and titania (TiOx; x=1–2) which were used in Run 8-1. The mixtures were vacuum dried, shaped into disks, placed into capsules, degassed, sealed, set in a HIP apparatus and sintered under the conditions set forth in Tables 7 and 8.

The sinters thus produced were measured for their density and Vickers microhardness Hv (0.5/10). The results are shown in Tables 7 and 8 together with the sintering conditions and the types of sinter apparatus used.

As for the Vickers microhardness Hv (0.5/10) measurement of the sinters of the coated psudo-fine particles, the hardness values obtained by the measurement were the values of the psudo-fine particles and not the values of the sinters, since particles sizes of the psudo-fine particles were larger than those of the fine particles and the hardness values of the sinters could not be measured. Therefore, in Tables 7 and 8 the Vickers microhardness values of the sinters were not shown.

The sinters were also checked for their crystalline phases by powder X-ray diffraction. In Examples 10 and 11, no diffraction peaks were observed except for the core particles (diamond or cubic boron nitride), coating materials (TIC, TiN and α-alumina), the products of reaction between the core particles and the metallic coating materials (TIC, ZrC, TiN, TiB$_2$, ZrN and ZrB$_2$) and the bonding materials (the diamond or cubic boron nitride in the core particles, TiC or TiN and α-alumina as the coating materials). Take, for example, Runs 10-1 and 10-2; in these cases, the only diffraction peaks observed were those for diamond and TiC. In the other runs, the only diffraction peaks observed were those for the following: diamond, TiC and α-alumina (Runs 10-3 and 10-4); cubic boron nitride and TiN (Run 11-1); cubic boron nitride, TiN and TiB$_2$ (Run 11-2); cubic boron nitride, TiN, ZrN and ZrB$_2$ (Run 11-3); cubic boron nitride and α-alumina (Run 11-4); and cubic boron nitride, TiN and α-alumina (Run 11-5). Quantification by X-ray analysis showed that the sinter of Run 10-2 consisted of 87% diamond and 13% TiC; the sinter of Run 11-2 consisted of cubic boron nitride, TiN and TiB$_2$ in proportions of about 87%, 10% and 3%, respectively, by volume; and the sinter of Run 11-3 consisted of cubic boron nitride, ZrN, ZrB$_2$ and TiN in proportions of about 86%, 2%, 1% and 11%, respectively, by volume.

Figure 31:
FIG. 31 is a scanning electron micrograph showing one of the coated cubic boron nitride particles produced in Example 11-1.
Figure 32:
FIG. 32 is an electron micrograph showing a polished surface of the sinter produced in Example 11-1.

The polished surface of the sinter of Run 10-1 was coated with a gold film by a customary evaporation technique and examined with an electron microscope. The result is shown in the FIG. 31 electron micrograph (X5000), in which the dark area represents the diamond and the light area TiC. As one can see from FIG. 31, the sinter was entirely free from pores and could be sintered to a relative density of 99%. In addition, it had no portion left unsintered. In areas where pseudo-fine diamond particles and/or fine diamond particles contacted each other via a thin layer of the coat forming substance, the latter was bursted by the contiguous pseudo-fine diamond particles and/or fine diamond particles, which hence were coupled directly as a result of sintering. In all other areas, TiC was distributed uniformly around the pseudo-fine diamond particles, rendering the sinter to be characteristic in that the coated pseudo-fine diamond particles had a dense, uniform and extremely highly controlled distribution. The diamond particles in the sinter were also characterized in that they did not grow at all compared to the particles in the feed powder. It has herefore been impossible to produce sinters having such an extremely highly controlled microstructure. FIG. 32 is an electron micrograph (X5000) showing a polished surface of the sinter of Run 11-1 and this was taken by the same method as used to prepare FIG. 31. Again, this sinter had established therein a microstructure in which pseudo-fine cubic boron nitride particles and/or fine cubic boron nitride particles and TiN as the coat forming substance were distributed uniformly, densely and in an extremely highly controlled manner.

Thus, in spite of the fact that diamonds and cubic boron nitrides are inherently very difficult to sinter, the coated pseudo-fine diamond and high-pressure phase boron nitride particles prepared in accordance with the invention behaved as if they were comparatively easy-to-sinter particles under industrially feasible ultrahigh pressures and elevated temperatures, thereby forming dense, rigid and superhard structures.

The sinters thus produced in Examples 10 and 11 were similar to that produced in Example 3 in that they were sinters or composite sinters that were superhard and which had dense, uniform and highly controlled microstructures with substantially uniform distributions of the bonding materials.

phase boron nitride particles or mixtures containing such particles or mixtures of coated diamond or high-pressure phase boron nitride particles with bonding material, sintering said coated diamond or high-pressure phase boron nitride particles or said mixtures containing such particles at pressures no less than 2000 MPa and at temperatures in which diamond or high-pressure phase boron nitride is thermodynamically stable or metastable; or sintering said coated diamond or high-pressure phase boron nitride particles or said mixtures containing such particles at pressures of less than 2000 MPa and at temperatures not exceeding 1850° C. under such sintering pressure and temperature conditions that diamond or high-pressure phase boron nitride is thermodynamically metastable if not stable; or sintering said mixtures of coated diamond or high-pressure phase boron nitride particles with a bonding material in a volume ratio of (1–90):(99–10), said bonding material being sinterable to a density of at least 85% at pressures less than 2000 MPa and at temperatures not exceeding 1850° C. under such conditions that diamond and/or high-pressure phase boron nitride particles are thermodynamically metastable, at pressures less than 2000 MPa and at temperatures not exceeding 1850° C. under such sintering pressure and temperature conditions that diamond and/or high-pressure phase

TABLE 7

| Ex. or Run No. | Core Particle Diamond | Coating Material | | | | Bounding Material Powder | | | | Sintering Conditions | | | | Sinter Density % |
|---|---|---|---|---|---|---|---|---|---|---|---|---|---|---|
| | | TiC | Ti | Zr | Al$_2$O$_3$ | Core Particle Diamond | Coating material TiC | Al$_2$O$_3$ | MgO/ TiOx | Pressure GPa | Temperature °C. | Time min | Sinter Apparatus | |
| 3 | 27 | — | — | 3 | — | 59.5 | 10.5 | — | — | 5.5 | 1450 | 30 | CB | ≧99 |
| 10-1 | 57 | 3 | — | — | — | 34 | 6 | — | — | 5.5 | 1450 | 30 | CB | ≧99 |
| 10-2 | 54 | — | 6 | — | — | 34 | 6 | — | — | 5.5 | 1450 | 30 | CB | ≧99 |
| 10-3 | 45 | 5 | — | — | 50 | — | — | — | — | 0.15 | 1200 | 180 | HIP1 | ≧99 |
| 10-4 | 36 | 4 | — | — | — | — | — | 53.4 | 0.6/1.0 | 0.15 | 1300 | 180 | HIP1 | ≧99 |

TABLE 8

| Run No. | Core Particle CBN | Coating Material | | | | Bounding Material Powder | | | | Sintering Conditions | | | | Sinter Density % |
|---|---|---|---|---|---|---|---|---|---|---|---|---|---|---|
| | | TiN | Ti | Zr | Al$_2$O$_3$ | Core Particle CBN | Coating material TiN | Al$_2$O$_3$ | MgO/ TiOx | Pressure GPa | Temperature °C. | Time min | Sinter Apparatus | |
| 11-1 | 57 | 3 | — | — | — | 34 | 6 | — | — | 5.5 | 1450 | 30 | CB | ≧99 |
| 11-2 | 54 | — | 6 | — | — | 34 | 6 | — | — | 5.5 | 1450 | 30 | CB | ≧99 |
| 11-3 | 27 | — | — | 3 | — | 59.5 | 10.5 | — | — | 5.5 | 1450 | 30 | CB | ≧99 |
| 11-4 | 50 | — | — | — | 50 | — | — | — | — | 0.15 | 1200 | 180 | HIP1 | ≧99 |
| 11-5 | 36 | 4 | — | — | — | — | — | 53.4 | 0.6/1.0 | 0.15 | 1300 | 180 | HIP1 | ≧99 |

What is claimed is:

1. A process for producing a diamond or high-pressure phase boron nitride sinter comprising the steps of preparing coated diamond or high-pressure phase boron nitride particles and sintering said coated diamond or high-pressure boron nitride is thermodynamically metastable if not stable, wherein said coated diamond or high-pressure phase boron nitride particles are prepared by a method comprising the steps of charging a powder of diamond or high-pressure phase boron nitride core particles into a coating space and then permitting a precursor of a coat forming substance which is generated via the vapor phase and/or a precursor of a coat forming substance in a vapor-phase state to contact and/or impinge against the particles in said powder of core particles so that their surfaces are coated with the coat forming substance and said coated diamond or high-pressure phase boron nitride particles are prepared by coating means comprising:

(A) a dispersing step in which the particles in the powder of core particles are dispersed by a group of means for high dispersion treatment of particles in a gaseous atmosphere to form a mixture of a gas and the particles in a powder, forming highly dispersed particles including agglomerating particles, the final treating means in said group of means for high dispersion treatment of particles being selected from between:

(a) dispersing means for dispersing the particles in the powder of core particles in a gaseous atmosphere; and (b) means for selecting a mixture of a gas and the particles in a powder of highly dispersed particles which comprises:

(b-1) means for selecting a mixture of a gas and the particles in a powder of highly dispersed particles that separates a portion of the powder that is composed of less highly dispersed particles including non-agglomerating single particles from the mixture of a gas and the particles in the powder of core particles in which the particles in the powder of core particles are dispersed in a gaseous atmosphere, thereby selecting a mixture of a gas and the particles in a powder of highly dispersed core particles in which the particles in the powder of core particles are present in the gaseous atmosphere mainly in a single-particle state; and (b-2) feedback means by which the portion of the powder that is composed of less highly dispersed particles and which has been separated by said means for selecting a mixture of a gas and the particles in a powder of highly dispersed particles is transported to the final dispersing means among the dispersing means in the group of means for high dispersion treatment of particles and/or treating means upstream of the final dispersing means; and (B) a coating step in which the particles in the powder of core particles that have been dispersed in the dispersing step (A) start to be coated by being allowed to contact and/or impinge against the precursor of the coat forming substance in the coating start region of the coating space as they are dispersed to satisfy the following conditions:

the dispersity β should be at least 70% if those particles have an average diameter of no more than 10 μm in the frequency distribution by volume;

the dispersity β should be at least 80% if those particles have an average diameter in excess of 10 μm but no more than 20 μm in the frequency distribution by volume;

the dispersity β should be at least 90% if those particles have an average diameter in excess of 20 μm but no more than 50 μm in the frequency distribution by volume;

the dispersity β should be at least 95% if those particles have an average diameter in excess of 50 μm but no more than 300 μm in the frequency distribution by volume;

the dispersity β should be at least 97% if those particles have an average diameter in excess of 300 μm but no more than 800 μm in the frequency distribution by volume;

the dispersity β should be at least 99% if those particles have an average diameter in excess of 800 μm in the frequency distribution by volume.

2. A process for producing a diamond or high-pressure phase boron nitride sinter according to claim 1 wherein said coated diamond or high-pressure phase boron nitride particles are prepared through the following additional step(s):

a step of disagglomeration or otherwise size reduction in which lumps of the coated diamond and/or high-pressure phase boron nitride particles that form as a result of association of several particles that contact one another via the coat forming substance on the coated particles are disagglomerated and/or otherwise reduced in size; and/or a step of selective separation in which the associating lumps of the coated diamond or high-pressure phase boron nitride particles are selectively separated from the coated diamond or high-pressure phase boron nitride particles such that the association lumps of the coated diamond or high-pressure phase boron nitride particles, and the coated diamond or high-pressure phase boron nitride particles are no longer in an aggregated state.

3. A process for producing a diamond or high-pressure phase boron nitride sinter according to claim 1 wherein the particles in the powder of diamond and/or high-pressure phase boron nitride core particles to be coated with the coat forming substance are coated by a dip method using a molten salt bath with one or more layers of the coat forming substance that derives from the dip method.

4. A process for producing a diamond or high-pressure phase boron nitride sinter according to claim 1, wherein the dispersing step is performed by:

a group of means for high dispersion treatment of particles that has such dispersing performance that a powder of core particles having an average diameter of no more than 10 μm in the frequency distribution by volume is dispersed in a gaseous atmosphere by the final treatment by said group of means for high dispersion treatment of particles, thereby forming a mixture of a gas and the particles in the powder of highly dispersed core particles and that the dispersity β of the particles in said powder of core particles is adjusted to at least 70%;

a group of means for high dispersion treatment of particles that has such dispersing performance that a powder of core particles having an average diameter in excess of 10 μm but no more than 20 μm in the frequency distribution by volume is dispersed in a gaseous atmosphere by the final treatment by said group of means for high dispersion treatment of particles, thereby forming a mixture of a gas and the particles in the powder of highly dispersed core particles and that the dispersity β of the particles in said powder of core particles is adjusted to at least 80%;

a group of means for high dispersion treatment of particles that has such dispersing performance that a powder of core particles having an average diameter in excess of 20 μm but no more than 50 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 90%;

a group of means for high dispersion treatment of particles that has such dispersing performance that a powder of core particles having an average diameter in excess of 50 μm but no more than 300 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 95%;

a group of means for high dispersion treatment of particles that has such dispersing performance that a powder of core particles having an average diameter in excess of 300 μm but no more than 800 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 97%; and a group of means for high dispersion treatment of particles that has such dispersing performance that a powder of core particles having an average diameter in excess of 800 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 99%; and said coated diamond or high-pressure phase boron nitride particles being prepared by:

a method in which the mixture of a gas and the particles in the powder of highly dispersed core particles as formed by one of the means in said group of means for high dispersion treatment of particles is either discharged directly to the coating step or transported thereto via at least one member indispensable to transport that is selected from the group consisting of a hollow member, an intermediate member composed of a member that forms a hollow portion, and a pipe and which is provided between the dispersing and coating steps, as the mixture emerges from a discharge section that discharges said mixture of a gas and the particles; and/or a method in which the mixture of a gas and the particles in the powder of highly dispersed core particles as formed by one of the means in said group of means for high dispersion treatment of particles is transported to the coating step via at least one means selected from the group consisting of means for maintaining the dispersion in a gaseous atmosphere of the highly dispersed core particles in the mixture of a gas with the core particles which have been dispersed in the gaseous atmosphere to attain one of the dispersities set forth above, means for enhancing the dispersion in a gaseous atmosphere of the highly dispersed core particles in the mixture of a gas with the core particles which have been dispersed in the gaseous atmosphere to attain one of the dispersities set forth above, and means for separating a mixture of a gas and the particles in a powder of less highly dispersed core particles from said gas-particle mixture so as to select a mixture of a gas and the particles in a powder of highly dispersed core particles in which the core particles are present in the gaseous atmosphere mainly in a single-particle state.

5. A process for producing a diamond or high-pressure phase boron nitride sinter according to claim 1 wherein the dispersing step is performed by:

a group of means for high dispersion treatment of particles that has such dispersing performance that a powder of core particles having an average diameter of no more than 10 μm in the frequency distribution by volume is dispersed in a gaseous atmosphere by the final treatment by said group of means for high dispersion treatment of particles, thereby forming a mixture of a gas and the particles in the powder of highly dispersed core particles and that the dispersity β of the particles in said powder of core particles is adjusted to at least 70%;

a group of means for high dispersion treatment of particles that has such dispersing performance that a powder of core particles having an average diameter in excess of 10 μm but no more than 20 μm in the frequency distribution by volume is dispersed in a gaseous atmosphere by the final treatment by said group of means for high dispersion treatment of particles, thereby forming a mixture of a gas and the particles in the powder of highly dispersed core particles and that the dispersity β of the particles in said powder of core particles is adjusted to at least 80%;

a group of means for high dispersion treatment of particles that has such dispersing performance that a powder of core particles having an average diameter in excess of 20 μm but no more than 50 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 90%;

a group of means for high dispersion treatment of particles that has such dispersing performance that a powder of core particles having an average diameter in excess of 50 μm but no more than 300 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 95%;

a group of means for high dispersion treatment of particles that has such dispersing performance that a powder of core particles having an average diameter in excess of 300 μm but no more than 800 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 97%;

a group of means for high dispersion treatment of particles that has such dispersing performance that a powder of core particles having an average diameter in excess of 800 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 99%; and said coated diamond or high-pressure phase boron nitride particles being prepared so that the dispersing steps performed in a first space and so that the coating step is performed in a second space, wherein the first space shares at least a portion of the second space.

6. A process for producing a diamond or high-pressure phase boron nitride sinter according to claim 1 wherein said coated diamond or high-pressure phase boron nitride particles are prepared with the coating start region of the coating space being located in either one of the following space regions that includes planes through which all particles in the powder of highly dispersed core particles as mixed with a gas will pass:

a space region in which a powder of core particles that have an average diameter of no more than 10 μm in the frequency distribution by volume is dispersed in a gaseous atmosphere by the final treatment by said group of means for high dispersion treatment of particles, thereby forming a mixture of a gas and the particles in the powder of highly dispersed core particles and that the dispersity β of the particles in said powder of core particles is adjusted to at least 70%;

a space region in which a powder of core particles that have an average diameter in excess of 10 μm but no more than 20 μm in the frequency distribution by volume is dispersed in a gaseous atmosphere by the final treatment by said group of means for high dispersion treatment of particles, thereby forming a mixture of a gas and the particles in the powder of highly dispersed core particles and that the dispersity β of the particles in said powder of core particles is adjusted to at least 80%;

a space region in which a powder of core particles that have an average diameter in excess of 20 μm but no more than 50 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 90%;

a space region in which a powder of core particles that have an average diameter in excess of 50 μm but no more than 300 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 95%;

a space region in which a powder of core particles that have an average diameter in excess of 300 μm but no more than 800 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 97%; and a space region in which a powder of core particles that have an average diameter in excess of 800 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 99%, or wherein said coated diamond or high-pressure phase boron nitride particles are prepared with the coating start region of the coating space being located in either one of the following space regions that includes planes through which all particles to be recovered into the recovery section of the recovery means will pass:

a space region in which a powder of core particles that have an average diameter of no more than 10 μm in the frequency distribution by volume is dispersed in a gaseous atmosphere by the final treatment by said group of means for high dispersion treatment of particles, thereby forming a mixture of a gas and the particles in the powder of highly dispersed core particles and that the dispersity β of the particles in said powder of core particles is adjusted to at least 70%;

a space region in which a powder of core particles that have an average diameter in excess of 10 μm but no more than 20 μm in the frequency distribution by volume is dispersed in a gaseous atmosphere by the final treatment by said group of means for high dispersion treatment of particles, thereby forming a mixture of a gas and the particles in the powder of highly dispersed core particles and that the dispersity β of the particles in said powder of core particles is adjusted to at least 80%;

a space region in which a powder of core particles that have an average diameter in excess of 20 μm but no more than 50 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 90%;

a space region in which a powder of core particles that have an average diameter in excess of 50 μm but no more than 300 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 95%;

a space region in which a powder of core particles that have an average diameter in excess of 300 μm but no more than 800 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 97%; and a space region in which a powder of core particles that have an average diameter in excess of 800 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 99%.

7. A process for producing a diamond or high-pressure phase boron nitride sinter according to claim 1 wherein the particles in the powder of core particles to be used have a size distribution of $\{D_M/5, 5D_M\}$, $\geqq 90\%$ in terms of frequency distribution by volume, where $D_M$ represents the average particle diameter.

8. A diamond or high-pressure phase boron nitride sinter that is produced by a process as recited in claim 1.

* * * * *